(12) United States Patent
Yonemura et al.

(10) Patent No.: US 8,187,789 B2
(45) Date of Patent: May 29, 2012

(54) POSITIVE RESIST COMPOSITION AND METHOD OF FORMING RESIST PATTERN

(75) Inventors: Koji Yonemura, Kawasaki (JP); Makiko Irie, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 209 days.

(21) Appl. No.: 12/428,133

(22) Filed: Apr. 22, 2009

(65) Prior Publication Data

US 2009/0269700 A1      Oct. 29, 2009

(30) Foreign Application Priority Data

Apr. 25, 2008   (JP) ................. 2008-116344
Feb. 6, 2009    (JP) ................. 2009-026545

(51) Int. Cl.
*G03F 7/00*    (2006.01)
*G03F 7/004*   (2006.01)
*G03F 7/028*   (2006.01)

(52) U.S. Cl. ............ 430/270.1; 322/913; 322/914

(58) Field of Classification Search ........... 430/270.1, 430/322

See application file for complete search history.

(56) References Cited

U.S. PATENT DOCUMENTS

| | | | |
|---|---|---|---|
| 5,350,660 | A | 9/1994 | Urano et al. |
| 5,945,517 | A | 8/1999 | Nitta et al. |
| 6,153,733 | A | 11/2000 | Yukawa et al. |
| 7,323,287 | B2 | 1/2008 | Iwai et al. |
| 7,579,497 | B2* | 8/2009 | Harada et al. ............ 560/1 |
| 7,604,920 | B2* | 10/2009 | Shiono et al. ........... 430/270.1 |
| 7,625,690 | B2* | 12/2009 | Mizutani et al. ........ 430/270.1 |
| 2008/0050675 | A1* | 2/2008 | Nishiyama et al. ...... 430/286.1 |
| 2008/0076062 | A1* | 3/2008 | Makino ................. 430/270.1 |
| 2008/0096134 | A1* | 4/2008 | Sugimoto et al. ....... 430/287.1 |
| 2009/0042131 | A1* | 2/2009 | Shiono et al. .......... 430/285.1 |
| 2009/0162787 | A1* | 6/2009 | Seshimo et al. ........ 430/285.1 |
| 2009/0197197 | A1* | 8/2009 | Shimizu et al. ........ 430/270.1 |
| 2009/0226842 | A1* | 9/2009 | Shimizu et al. ........ 430/281.1 |

FOREIGN PATENT DOCUMENTS

| | | |
|---|---|---|
| EP | 1835342 A2 * | 9/2007 |
| EP | 2093213 A1 * | 8/2009 |
| JP | H04-211258 | 8/1992 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2005-037888 | 2/2005 |
| WO | WO 2004-074242 | 9/2004 |

* cited by examiner

*Primary Examiner* — Amanda C. Walke
(74) *Attorney, Agent, or Firm* — Knobbe Martens Olson & Bear LLP

(57) ABSTRACT

A positive resist composition, including a resin component (A) which exhibits increased solubility in an alkali developing solution under action of an acid, and an acid generator component (B) which generates an acid upon exposure, wherein the component (A) includes a structural unit (a1) derived from a hydroxystyrene, and a structural unit (a2) containing an acid dissociable, dissolution inhibiting group; and the component (B) includes an acid generator (B1) composed of a compound represented by the general formula (b1) shown below:

[Chemical Formula 1]

$$X-Q^1-Y^1-SO_3^-A^+ \qquad (b1)$$

(in the formula, $Q^1$ represents a bivalent linking group containing an oxygen atom; $Y^1$ represents an alkylene group of 1 to 4 carbon atoms which may contain a substituent or a fluorinated alkylene group of 1 to 4 carbon atoms which may contain a substituent; X represents a hydrocarbon group of 3 to 30 carbon atoms which may contain a substituent; and $A^+$ represents an organic cation).

7 Claims, No Drawings

US 8,187,789 B2

POSITIVE RESIST COMPOSITION AND METHOD OF FORMING RESIST PATTERN

TECHNICAL FIELD

The present invention relates to a positive resist composition and a method of forming a resist pattern.

The application claims priority from Japanese Patent Application No. 2008-116344 filed on Apr. 25, 2008, and Japanese Patent Application No. 2009-026545 filed on Feb. 6, 2009, the disclosures of which are incorporated by reference herein.

BACKGROUND ART

Lithography techniques include processes in which, for example, a resist film formed from a resist material is formed on top of a substrate, the resist film is selectively exposed with irradiation such as light, an electron beam or the like through a mask in which a predetermined pattern has been formed, and then a developing treatment is conducted, thereby forming a resist pattern of the prescribed shape in the resist film. Resist materials in which the exposed portions change to become soluble in a developing solution are termed positive materials, whereas resist materials in which the exposed portions change to become insoluble in the developing solution are termed negative materials.

In recent years, in the production of semiconductor elements and liquid crystal display elements, advances in lithography techniques have led to rapid progress in the field of miniaturization.

Typically, these miniaturization techniques involve shortening the wavelength of the exposure light source. Conventionally, ultraviolet radiation typified by g-line and i-line radiation has been used; however, nowadays, KrF excimer lasers and ArF excimer lasers are starting to be introduced in mass production of semiconductor elements. Furthermore, research is also being conducted into lithography techniques that use $F_2$ excimer lasers, electron beams (EB), extreme ultraviolet radiation (EUV) and X-rays.

Resist materials are required to have lithography properties such as high sensitivity to the aforementioned light source and sufficient resolution to reproduce patterns with a very fine size. As resist materials which fulfill the aforementioned requirements, a chemically-amplified resist containing a base resin that displays changed solubility in an alkali developing solution under action of an acid, and an acid generator that generates an acid upon exposure are known.

For example, a chemically-amplified positive resist includes a resin in which the alkali solubility increases under action of an acid as a base resin and an acid generator, and when an acid is generated from the acid generator upon exposure in the formation of a resist pattern, the exposed portions are converted to a soluble state in an alkali developing solution.

Until recently, polyhydroxystyrene (PHS) or derivative resins (PHS-based resins) in which the hydroxyl groups within polyhydroxystyrene have been protected with acid dissociable, dissolution inhibiting groups, which exhibit a high degree of transparency relative to KrF excimer laser (248 nm), have been used as the base resin of chemically-amplified resists (For example, see Patent Document 1).

Examples of the acid dissociable, dissolution inhibiting groups include so-called acetal groups, such as chain-like ether groups typified by 1-ethoxyethyl groups, and cyclic ether groups typified by tetrahydropyranyl groups; tertiary alkyl groups typified by tert-butyl groups; and tertiary alkoxycarbonyl groups typified by tert-butoxycarbonyl groups.

On the other hand, as acid generators usable in a chemically-amplified resist, various types have been proposed including, for example, onium salt-based acid generators such as iodonium salts and sulfonium salts; oxime sulfonate-based acid generators; diazomethane-based acid generators; nitrobenzylsulfonate-based acid generators; iminosulfonate-based acid generators; and disulfone-based acid generators. Currently, as acid generators, those which include a triphenylsulfonium skeleton, dinaphthyl monophenylsulfonium skeleton or the like are used (for example, see Patent Document 2).

DOCUMENTS OF RELATED ART

Patent Documents

[Patent Document 1] Japanese Unexamined Patent Application, First Publication No. Hei4-211258.
[Patent Document 2] Japanese Unexamined Patent Application, First Publication No. 2005-37888.

SUMMARY OF THE INVENTION

Problems to be Solved by the Invention

In recent years, as the miniaturization of resist patterns has progressed more and more, it has been demanded that the resist composition can attain higher resolution, and improve various lithography properties more than ever.

For example, as one of the above demands, improvement of exposure margin (EL margin) has been demanded in order to improve process margin and the like in a pattern formation.

The term "EL margin" means the range of the exposure dose at which a resist pattern can be formed with a size where the variation for the target size is kept within a prescribed range, when the exposure is performed changing the exposure dose. That is, EL margin means the range of the exposure dose at which a resist pattern faithful to the mask pattern can be obtained. The larger the value of the EL margin, the smaller the variation in the pattern size accompanied by the variation in the exposure dose becomes, and the more the process margin can be improved. Consequently, a larger value of the EL margin is preferable.

The present invention takes the above circumstances in to consideration, with an object of providing a positive resist composition with a small variation in the resist pattern size (that is, large EL margin) accompanied by the variation in exposure dose, and a method of forming a resist pattern using the positive resist composition.

Means for Solving the Problems

To achieve the above object, the present invention employs the following constitutions.

A first aspect of the present invention is a positive resist composition including a resin component (A) which exhibits increased solubility in an alkali developing solution under action of an acid, and an acid generator component (B) which generates an acid upon exposure, wherein the resin component (A) includes a structural unit (a1) derived from a hydroxystyrene and a structural unit (a2) containing an acid dissociable, dissolution inhibiting group, and the acid generator component (B) includes an acid generator (B1) comprised of a compound represented by the general formula (b1) shown below.

[Chemical Formula 1]

$$X\text{-}Q^1\text{-}Y^1\text{—}SO_3^-A^+ \quad (b1)$$

(In the formula (b1), $Q^1$ represents a bivalent linking group containing an oxygen atom; $Y^1$ represents an alkylene group of 1 to 4 carbon atoms which may contain a substituent or a fluorinated alkylene group of 1 to 4 carbon atoms which may contain a substituent; X represents a hydrocarbon group of 3 to 30 carbon atoms which may contain a substituent; and $A^+$ represents an organic cation.)

A second aspect of the present invention is a method of forming a resist pattern, which includes: forming a resist film on a substrate using the positive resist composition of the first aspect of the present invention; exposing the resist film; and developing the resist film to form a resist pattern.

In the present specification and claims, the term "alkyl group" is a concept containing a linear, branched, and cyclic monovalent saturated hydrocarbon group, unless another specific definition is provided.

Also, the term "alkylene group" is a concept containing a linear, branched, and cyclic bivalent saturated hydrocarbon group, unless another specific definition is provided.

The term "lower alkyl group" means an alkyl group of 1 to 5 carbon atoms.

The term "(meth)acrylate ester" is a generic term that includes either or both of an acrylate ester having a hydrogen atom bonded to the α-position and a methacrylate ester having a methyl group bonded to the α-position.

The term "(meth)acrylate" is a generic term that includes either or both of an acrylate having a hydrogen atom bonded to the α-position and a methacrylate having a methyl group bonded to the α-position.

The term "(meth)acrylic acid" is a generic term that includes either or both of acrylic acid having a hydrogen atom bonded to the α-position and methacrylic acid having a methyl group bonded to the α-position.

The term "aliphatic" is a relative concept used in relation to the term "aromatic", and is defined as a group or compound that contains no aromaticity.

The term "structural unit" means a monomer unit that contributes to the formation of a polymeric compound (polymer, copolymer).

The term "exposure" is used as a general concept involving irradiation with any form of radiation.

Effects of the Invention

According to the present invention, there can be provided a positive resist composition with small variation in the resist pattern size (large EL margin) accompanied by the variation in exposure dose, and a method of forming a resist pattern using the positive resist composition.

BEST MODE FOR CARRYING OUT THE INVENTION

<<Positive Resist Composition>>

The positive resist composition of the present invention includes a resin component (A) (hereinafter, referred to component (A)) which exhibits increased solubility in an alkali developing solution under action of an acid, and an acid generator component (B) (hereinafter, referred to as component (B)) which generates an acid upon exposure.

In the positive resist composition of the present invention, the component (A) is insoluble in an alkali developing solution before exposure. When an acid generated from the component (B) upon exposure acts on the component (A), the acid dissociable, dissolution inhibiting groups are dissociated, and solubility of the entire component (A) in an alkali developing solution is enhanced. As a result, the positive resist composition changes from an alkali-insoluble state to an alkali-soluble state. Therefore, in the formation of a resist pattern, when a resist film obtained by using the positive resist composition is subjected to selective exposure, the exposed area becomes soluble in an alkali developing solution, while the unexposed area remains alkali-insoluble, and hence a resist pattern can be formed by developing with an alkali.

<Component (A)>

In the present invention, the component (A) includes a structural unit (a1) derived from a hydroxystyrene and a structural unit (a2) containing an acid dissociable, dissolution inhibiting group.

[Structural Unit (a1)]

In the present invention, the structural unit (a1) is a structural unit derived from a hydroxystyrene.

In the present specification and claims, the term "hydroxystyrene" is a concept including hydroxystyrene, a hydroxystyrene in which the hydrogen atom at the α-position of hydroxystyrene is substituted with a substituent such as an alkyl group, and derivatives thereof Specifically, it is a concept containing those in which, while at least a benzene ring and a hydroxyl group bonded to the benzene ring are maintained, for example, a hydrogen atom bonded to the α-position of hydroxystyrene is substituted with a substituent such as a lower alkyl group of 1 to 5 carbon atoms, a lower alkyl group of 1 to 5 carbon atoms is bonded to the benzene ring to which the hydroxyl group of hydroxystyrene has been bonded, or one or two hydroxyl groups are bonded to the benzene ring to which the hydroxyl group has been bonded (herein, the total number of hydroxyl groups is 2 or 3).

Here, the term "α-position (the carbon atom at the α-position)" means the carbon atom to which a benzene ring is bonded, unless another definition is provided.

The term "structural unit derived from a hydroxystyrene" means a structural unit that is formed by the cleavage of the ethylenic double bond of a hydroxystyrene.

Preferred examples of the structural unit (a1) include a structural unit represented by the general formula (a1-1) shown below.

[Chemical Formula 2]

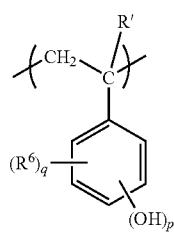

(a1-1)

(In the formula (a1-1), R' represents a hydrogen atom or a lower alkyl group; $R^6$ represents a lower alkyl group; p represents an integer of 1 to 3; and q represents an integer of 0 to 2.)

In the above general formula (a1-1), the lower alkyl group for R' is an alkyl group of 1 to 5 carbon atoms, and specific examples thereof include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

R' is particularly preferably a hydrogen atom or a methyl group.

p represents an integer of 1 to 3, and is preferably 1.

The binding position of the hydroxyl group may be either o-position, m-position, or p-position of the phenyl group. If p is 1, the binding position is preferably p-position, because it can be easily available and is inexpensive. If p is 2 or 3, the binding positions can be arbitrarily combined.

q represents an integer of 0 to 2. Of these, q is preferably 0 or 1, and industrially it is more preferable that q be 0.

Examples of the lower alkyl group for $R^6$ include the same lower alkyl groups as those described for R'.

When q is 1, the substitution (binding) position of $R^6$ may be either o-position, m-position, or p-position. If q is 2, the substitution positions can be arbitrarily combined. Here, the plurality of $R^6$ may be the same, or may be different from one another.

As the structural unit (a1), one type may be used alone, or two or more types may be used in combination.

The proportion of the structural unit (a1) within the component (A) is preferably 50 to 90 mol %, more preferably 55 to 85 mol %, and still more preferably 60 to 80 mol %, based on the combined total of all the structural units that constitute the component (A). Ensuring that the proportion of the structural unit (a1) is within the range, appropriate alkali solubility can be obtained when using a resist composition including the structural unit (a1), and a good quantitative balance with the other structural units can be attained.

[Structural Unit (a2)]

In the present invention, the structural unit (a2) is a structural unit containing an acid dissociable, dissolution inhibiting group.

The structural unit (a2) is not particularly restricted as long as it is a structural unit which contains an acid dissociable, dissolution inhibiting group. Examples thereof include: a structural unit (hereinafter, referred to as "structural unit (a21)") derived from an acrylate ester containing an acid dissociable, dissolution inhibiting group; and a structural unit (hereinafter, referred to as "structural unit (a22)") in which a hydrogen atom of a hydroxyl group within the above structural unit (a1) is substituted with an acid dissociable, dissolution inhibiting group or an acid dissociable, dissolution inhibiting group-containing organic group.

Preferred examples of the structural unit (a21) include a structural unit represented by the general formula (a2-1) shown below.

Also, preferred examples of the structural unit (a22) include a structural unit represented by the general formula (a2-2) shown below.

[Chemical Formula 3]

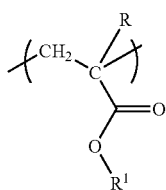

(a2-1)

(In the formula (a2-1), R represents a hydrogen atom, a lower alkyl group, or a halogenated lower alkyl group; $R^1$ represents an acid dissociable, dissolution inhibiting group, or an acid dissociable, dissolution inhibiting group-containing organic group.)

In the above general formula (a2-1), R represents a hydrogen atom, a lower alkyl group or a halogenated lower alkyl group.

Specific examples of the lower alkyl group for R include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

The halogenated lower alkyl group for R is a group in which a part or all of the hydrogen atoms within a lower alkyl group are substituted with halogen atoms. Examples of the lower alkyl group in the halogenated lower alkyl group include the same lower alkyl groups as those described above for R, and examples of the halogen atom include a fluorine atom, a chlorine atom, a bromine atom, and an iodine atom.

R is preferably a hydrogen atom, a lower alkyl group or a fluorinated lower alkyl group, and particularly preferably a hydrogen atom or a methyl group in terms of industrial availability.

[Chemical Formula 4]

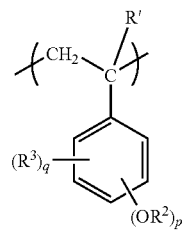

(a2-2)

(In the formula (a2-2), R' represents a hydrogen atom or a lower alkyl group of 1 to 5 carbon atoms; $R^3$ represents a lower alkyl group of 1 to 5 carbon atoms; p represents an integer of 1 to 3; q represents an integer of 0 to 2; and $R^2$ represents an acid dissociable, dissolution inhibiting group, or an acid dissociable, dissolution inhibiting group-containing organic group.)

In the above general formula (a2-2), R', p, and q are respectively the same as R', p, and q in the above general formula (a1-1).

In the above general formula (a2-2), examples of $R^3$ include the same as $R^6$ in the above general formula (a1-1).

The binding position of —$OR^2$ may be either o-position, m-position, or p-position of the phenyl group. If p is 1, the binding position is preferably p-position because it can be easily available and is inexpensive. If p is 2 or 3, the binding positions can be arbitrarily combined. Here, the plurality of —$OR^2$ may be the same, or may be different from one another.

In the above general formula (a2-1) and (a2-2), $R^1$ and $R^2$ each independently represents an acid dissociable, dissolution inhibiting group, or an acid dissociable, dissolution inhibiting group-containing organic group.

Here, the term "acid dissociable, dissolution inhibiting group" means a group which dissociates under action of an acid generated from the component (B) upon exposure, and is eliminated from the component (A) after exposure.

The acid dissociable, dissolution inhibiting group is a group that exhibits an alkali-dissolution-inhibiting property that renders the entire component (A) hardly-soluble in an alkali developing solution prior to the dissociation, but then dissociates under action of an acid, causing the entire component (A) to exhibit increased solubility in an alkali developing solution.

Also, the term "an acid dissociable, dissolution inhibiting group-containing organic group" means a group constituted from an acid dissociable, dissolution inhibiting group, and a group or atom which does not dissociate under action of an acid (that is, a group or atom which does not dissociate under action of an acid, and stays to be bonded to the component (A) even after the acid dissociable, dissolution inhibiting group dissociates).

Hereinafter, the acid dissociable, dissolution inhibiting group and the acid dissociable, dissolution inhibiting group-containing organic group are collectively sometimes referred to as "acid dissociable, dissolution inhibiting group-containing group".

There are no particular restrictions on the acid dissociable, dissolution inhibiting group, and for example, any of the multitude of groups that have been proposed for the resins used within resist compositions designed for use with KrF excimer lasers and ArF excimer lasers can be used. Specific examples thereof include the acid dissociable, dissolution inhibiting group (I) described below, and tertiary alkyl group-containing groups in the acid dissociable, dissolution inhibiting group-containing group (III) described below.

There are no particular restrictions on the acid dissociable, dissolution inhibiting group-containing organic group, and for example, any of the multitude of groups that have been proposed for the resins used within resist compositions designed for use with KrF excimer lasers and ArF excimer lasers can be used. Specific examples thereof include organic groups containing the above-mentioned acid dissociable, dissolution inhibiting group. Examples of organic groups containing the acid dissociable, dissolution inhibiting group (I) include the acid dissociable, dissolution inhibiting group-containing organic group (II) described below and tertiary alkyl group-containing groups (for example, tertiary alkyloxycarbonyl group and tertiary alkyloxycarbonylalkyl group) in the acid dissociable, dissolution inhibiting group-containing group (III) described below.

Acid Dissociable, Dissolution Inhibiting Group (I)

As the acid dissociable, dissolution inhibiting group (I), groups represented by the general formulae (I-a) or (I-b) shown below can be used.

[Chemical Formula 5]

$-R^{27}-O-X^0$ (I-a)

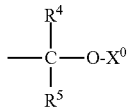
(I-b)

(In the formula (I-a), $R^{27}$ represents a linear or branched alkylene group, $X^0$ represents an aliphatic cyclic group, an aromatic cyclic hydrocarbon group, or a lower alkyl group of 1 to 5 carbon atoms. In the formula (I-b), $X^0$ is the same as $X^0$ in the formula (I-a); $R^4$ represents a hydrogen atom or a lower alkyl group of 1 to 5 carbon atoms, or $X^0$ and $R^4$ each may independently represent an alkylene group of 1 to 5 carbon atoms, wherein the terminal of $X^0$ is bonded to the terminal of $R^4$; and $R^5$ represents a hydrogen atom or a lower alkyl group of 1 to 5 carbon atoms.)

In the above general formula (I-a), $R^{27}$ represents a linear or branched alkylene group.

The alkylene group for $R^{27}$ preferably contains 1 to 5 carbon atoms, more preferably 1 to 3 carbon atoms, and still more preferably 1 to 2 carbon atoms.

In the formulae (I-a) and (I-b), $X^0$ each represents independently an aliphatic cyclic group, an aromatic cyclic hydrocarbon group or a lower alkyl group of 1 to 5 carbon atoms.

Here, in the present specification and claims, the term "aliphatic cyclic group" means a monocyclic group or polycyclic group containing no aromaticity, may be either saturated or unsaturated, and is typically preferably saturated.

The aliphatic cyclic group for $X^0$ is a monovalent aliphatic cyclic group. As the aliphatic cyclic group, for example, any of aliphatic cyclic groups which have been proposed for conventional ArF resists can be used by appropriately selecting from those. Specific examples of the aliphatic cyclic group include aliphatic monocyclic groups of 5 to 7 carbon atoms and aliphatic polycyclic groups of 10 to 16 carbon atoms.

Examples of the aliphatic monocyclic group of 5 to 7 carbon atoms include groups in which a hydrogen atom has been removed from a monocycloalkane, and specific examples thereof include groups in which a hydrogen atom has been removed from cyclopentane or cyclohexane.

Examples of the aliphatic polycyclic group of 10 to 16 carbon atoms include groups in which a hydrogen atom has been removed from a bicycloalkane, a tricycloalkane, or a tetracycloalkane. Specific examples include groups in which a hydrogen atom has been removed from polycycloalkanes such as adamantane, norbornane, isobornane, tricyclodecane, and tetracyclododecane. Of these, an adamantyl group, a norbornyl group, or a tetracyclododecanyl group is industrially preferable, and an adamantyl group is particularly preferable.

Examples of the aromatic cyclic hydrocarbon group for $X^0$ include aromatic polycyclic groups of 10 to 16 carbon atoms. Specific examples thereof include groups in which a hydrogen atom has been removed from naphthalene, anthracene, phenanthrene, or pyrene. More specifically, a 1-naphthyl group, a 2-naphthyl group, a 1-anthryl group, a 2-anthryl group, a 1-phenanthryl group, a 2-phenanthryl group, a 3-phenanthryl group, or a 1-pyrenyl group can be used, and a 2-naphthyl group is particularly preferable in terms of industrial reasons.

Examples of the lower alkyl group for $X^0$ include the same lower alkyl groups as those described above for R' in the general formula (a1-1), and of these, a methyl group or an ethyl group is preferable, and an ethyl group is most preferable.

In the formula (I-b), examples of the lower alkyl group for $R^4$ include the same lower alkyl groups as those described for R' in the above general formula (a1-1). The lower alkyl group for $R^4$ is preferably a methyl group or an ethyl group in terms of industrial reasons, and particularly preferably a methyl group.

$R^5$ represents a lower alkyl group or a hydrogen atom. Examples of the lower alkyl group for $R^5$ include the same lower alkyl groups as those described for $R^4$. $R^5$ is preferably a hydrogen atom in terms of industrial reasons.

It is particularly preferable that one of $R^4$ and $R^5$ be a hydrogen atom, and the other be a methyl group.

Also, in the general formula (I-b), $X^0$ and $R^4$ each may independently represent an alkylene group of 1 to 5 carbon atoms, wherein the terminal of $X^0$ is bonded to the terminal of $R^4$.

In such a case, a cyclic group constituted from $R^4$, $X^0$, the oxygen atom that $X^0$ is bonded to, and the carbon atom that the oxygen atom and $R^4$ are bonded to is formed in the above general formula (I-b). Such a cyclic group is preferably a 4- to 7-membered ring, and more preferably a 4- to 6-membered ring. Specific examples of the cyclic group include a tetrahydropyranyl group and a tetrahydrofuranyl group.

As the acid dissociable, dissolution inhibiting group (I), it is preferable that $R^5$ be a hydrogen atom, and $R^4$ be a hydrogen atom or a lower alkyl group, because it excels in the resist pattern shape and the like.

Specific examples of the acid dissociable, dissolution inhibiting group (I) include the following. Examples of groups in which $X^0$ is a lower alkyl group, that is, 1-alkoxyalkyl groups, include a 1-methoxyethyl group, a 1-ethoxyethyl group, a 1-iso-propoxyethyl group, a 1-n-butoxyethyl group, a 1-tert-butoxyethyl group, a methoxymethyl group, a ethoxymethyl group, an iso-propoxymethyl group, an n-butoxymethyl group, and a tert-butoxymethyl group.

Also, examples of groups in which $X^0$ is an aliphatic cyclic group include a 1-cyclohexyloxyethyl group, a 1-(2-adamantyl)oxymethyl group, a 1-(1-adamantyl)oxyethyl group represented by the formula (I-a-1) shown below.

Examples of groups in which $X^0$ is an aromatic cyclic hydrocarbon group include a 1-(2-naphthyl)oxyethyl group represented by the formula (I-b-1) shown below.

Of these, a 1-ethoxyethyl group is particularly preferable.

[Chemical Formula 6]

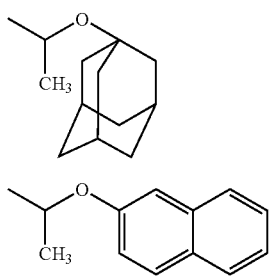

(I-a-1)

(I-b-1)

Acid Dissociable, Dissolution Inhibiting Group-Containing Organic Group (II)

Examples of the acid dissociable, dissolution inhibiting group-containing organic group (II) include a group represented by the general formula (II) shown below. In the organic group (II) containing such a structure, when an acid is generated from the component (B) upon exposure, the generated acid acts to break the bond between the oxygen atom bonded to Y and the carbon atom bonded to $R^4$ and $R^5$, thereby dissociating a —$C(R^4)(R^5)$—$OX^0$.

[Chemical Formula 7]

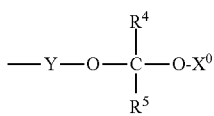

(II)

(In the formula (II), $X^0$ represents an aliphatic cyclic group, an aromatic cyclic hydrocarbon group, or a lower alkyl group of 1 to 5 carbon atoms; $R^4$ represents a hydrogen atom or a lower alkyl group, or $X^0$ and $R^4$ each may independently represent an alkylene group of 1 to 5 carbon atoms, wherein the terminal of $X^0$ is bonded to the terminal of $R^4$; $R^5$ represents a lower alkyl group or a hydrogen atom; and Y represents a bivalent aliphatic cyclic group.)

In the above general formula (II), $X^0$, $R^4$, and $R^5$ are respectively the same as $X^0$, $R^4$, and $R^5$ in the above general formula (I-b).

Examples of the bivalent aliphatic cyclic group for Y include the same aliphatic cyclic groups for $X^0$ in which one hydrogen atom is further eliminated.

Acid Dissociable, Dissolution Inhibiting Group-Containing Group (III)

The acid dissociable, dissolution inhibiting group-containing group (III) is an acid dissociable, dissolution inhibiting group-containing group which is not classified as the above acid dissociable, dissolution inhibiting group (I) and the above acid dissociable, dissolution inhibiting group-containing organic group (II) (hereinafter, the groups (I) and (II) are sometimes collectively referred to as "acid dissociable, dissolution inhibiting group and the like (I) and (II)").

As the acid dissociable, dissolution inhibiting group-containing group (III), any of conventional acid dissociable, dissolution inhibiting group-containing groups which are not classified as the above acid dissociable, dissolution inhibiting group and the like (I) and (II) can be used.

Specific examples of the acid dissociable, dissolution inhibiting group-containing group (III) include tertiary alkyl group-containing groups.

Here, in the present specification, the term "tertiary alkyl group" means an alkyl group containing a tertiary carbon atom. The term "alkyl group" means a monovalent saturated hydrocarbon group as described above, and contains a chain-like (linear and/or branched) alkyl group, and an alkyl group having a cyclic structure.

The term "tertiary alkyl group-containing group" means a group containing a tertiary alkyl group within the structure.

The tertiary alkyl group-containing group may consist of a tertiary alkyl group, or may be constituted from a tertiary alkyl group and an atom or group other than the tertiary alkyl group.

As the "atom or group other than the tertiary alkyl group" which constitutes the tertiary alkyl group-containing group together with the tertiary alkyl group, a carbonyloxy group, a carbonyl group, an alkylene group, an oxygen atom, or the like can be used.

Examples of the tertiary alkyl group-containing group include a tertiary alkyl group-containing group which contains no cyclic structure, and a tertiary alkyl group-containing group which contains a cyclic structure.

The tertiary alkyl group-containing group which contains no cyclic structure is a group which contains a branched tertiary alkyl group as the tertiary alkyl group and contains no cyclic structure within the structure.

Examples of the branched tertiary alkyl group include a group represented by the general formula (III-a) shown below.

[Chemical Formula 8]

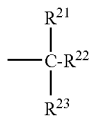

(III-a)

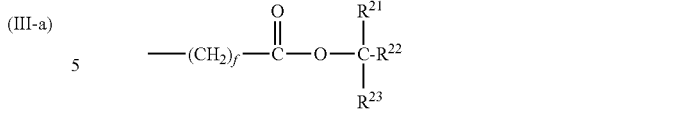

(III-c)

In the formula (III-a), $R^{21}$ to $R^{23}$ each independently represents a linear or branched alkyl group. The alkyl group preferably has 1 to 5 carbon atoms, more preferably has 1 to 3 carbon atoms.

Specific examples of the alkyl group of 1 to 5 carbon atoms include a methyl group, an ethyl group, a propyl group, an isopropyl group, an n-butyl group, an isobutyl group, a tert-butyl group, a pentyl group, an isopentyl group, and a neopentyl group.

Also, the above alkyl groups for $R^{21}$ to $R^{23}$ is preferably combined so that the total number of carbon atoms within the group represented by the general formula (III-a) is 4 to 7, more preferably 4 to 6, and most preferably 4 to 5. Specific examples of the group represented by the general formula (III-a) include a tert-butyl group and a tert-pentyl group, and of these, a tert-butyl group is more preferable.

Examples of the tertiary alkyl group-containing group which contains no cyclic structure include a branched tertiary alkyl group described above; a tertiary alkyl group-containing, chain-like alkyl group in which the aforementioned branched tertiary alkyl group is bonded to a linear or branched alkylene group; a tertiary alkyloxycarbonyl group which has the aforementioned branched tertiary alkyl group as the tertiary alkyl group; and a tertiary alkyloxycarbonylalkyl group which has the aforementioned branched tertiary alkyl group as the tertiary alkyl group.

As the alkylene group within the tertiary alkyl group-containing, chain-like alkyl group, an alkylene group of 1 to 5 carbon atoms is preferable, more preferably 1 to 4 carbon atoms, and still more preferably 1 to 2 carbon atoms.

As the chain-like tertiary alkyloxycarbonyl group, for example, a group represented by the general formula (III-b) shown below can be used. In general formula (III-b), $R^{21}$ to $R^{23}$ are as defined for $R^{21}$ to $R^{23}$ in above general formula (III-a). As the chain-like tertiary alkyloxycarbonyl group, a tert-butyloxycarbonyl group (t-boc) or a tert-pentyloxycarbonyl group is preferable.

As a chain-like tertiary alkyloxycarbonylalkyl group, for example, a group represented by the general formula (III-c) shown below can be used. In the general formula (III-c), $R^{21}$ to $R^{23}$ are as defined for $R^{21}$ to $R^{23}$ in the above general formula (III-a). f represents an integer of 1 to 3, and is preferably 1 or 2. As the chain-like tertiary alkyloxycarbonylalkyl group, a tert-butyloxycarbonylmethyl group, a tert-pentyloxycarbonylmethyl group, or a tert-butyloxycarbonylethyl group is preferable.

[Chemical Formula 9]

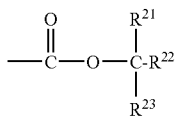

(III-b)

Among these, as the tertiary alkyl group-containing groups which contains no cyclic structure, a tertiary alkyloxycarbonyl group or a tertiary alkyloxycarbonylalkyl group is preferable, more preferably a tertiary alkyloxycarbonyl group, and particularly preferably a tert-butyloxycarbonyl group (t-boc).

A tertiary alkyl group-containing group which has a cyclic structure is a group which contains a tertiary carbon atom and a cyclic structure in the structure thereof.

In the tertiary alkyl group-containing group which has a cyclic structure, the cyclic structure preferably has 4 to 12 carbon atoms which constitute the ring, more preferably 5 to 10 carbon atoms, and most preferably 6 to 10 carbon atoms. As the cyclic structure, for example, groups in which one or more hydrogen atoms have been removed from a monocycloalkane or a polycycloalkane such as a bicycloalkane, tricycloalkane or tetracycloalkane may be used. Preferable examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As the tertiary alkyl group-containing group which has a cyclic structure, for example, a group having the following group (1) or (2) as the tertiary alkyl group can be used.

(1) A group in which a linear or branched alkyl group is bonded to a carbon atom which constitutes a ring of a cyclic alkyl group (cycloalkyl group) wherein the carbon atom is a tertiary carbon atom.

(2) A group in which an alkylene group (branched alkylene group) having a tertiary carbon atom is bonded to a carbon atom constituting the ring of a cycloalkyl group.

In the aforementioned group (1), the linear or branched alkyl group preferably has 1 to 5 carbon atoms, more preferably 1 to 4, and most preferably 1 to 3.

Specific examples of the group (1) include 2-alkyl-2-adamantyl groups such as a 2-methyl-2-adamantyl group and a 2-ethyl-2-adamantyl group; a 1-methyl-1-cycloalkyl group; and 1-ethyl-1-cycloalkyl group. More specific examples thereof include a 1-methylcyclopentyl group, a 1-ethylcyclopentyl group, a 1-methylcyclohexyl group, a 1-ethylcyclohexyl group, a 2-methyl-2-adamantyl group, a 2-ethyl-2-adamantyl group, and a 2-isopropyl-2-adamantyl group.

In the aforementioned group (2), the cycloalkyl group having a branched alkylene group bonded thereto may have a substituent. Examples of the substituent include a fluorine atom, a fluorinated lower alkyl group of 1 to 5 carbon atoms, and an oxygen atom (═O).

Specific examples of the group (2) include a group represented by the general formula (IV) shown below.

[Chemical Formula 10]

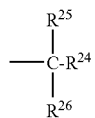
(IV)

In general formula (IV), $R^{24}$ represents a cycloalkyl group which may or may not have a substituent. Examples of the substituent which the cycloalkyl group may have include a fluorine atom, a fluorinated linear alkyl group of 1 to 5 carbon atoms, and an oxygen atom (=O).

Each of $R^{25}$ and $R^{26}$ independently represents a linear or branched alkyl group. As the alkyl group, the same alkyl groups as those described above for $R^{21}$ to $R^{23}$ in general formula (III-a) may be used.

As the tertiary alkyl group-containing group which has a cyclic structure, for example, a group represented by the general formula (V) may also be used.

[Chemical Formula 11]

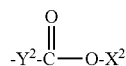
(V)

(In the formula (V), $Y^2$ represents a bivalent linking group; and $X^2$ represents an acid dissociable, dissolution inhibiting group containing an aliphatic cyclic group.)

In the formula (V), $Y^2$ represents a bivalent linking group.

As the bivalent linking group for $Y^2$, an alkylene group, a bivalent aliphatic cyclic group, or a bivalent linking group containing a hetero atom can be used.

As the aliphatic cyclic group, the same cyclic structures as those described above in the explanation of the tertiary alkyl group-containing group which contains a cyclic structure, except that a group in which two or more hydrogen atoms are removed is used.

If $Y^2$ represents an alkylene group, the alkylene group preferably has 1 to 10 carbon atoms, more preferably 1 to 6 carbon atoms, still more preferably 1 to 4 carbon atoms, and most preferably 1 to 3 carbon atoms.

If $Y^2$ represents a bivalent aliphatic cyclic group, it is particularly preferable that the bivalent aliphatic cyclic group be a group in which two or more hydrogen atoms have been removed from cyclopentane, cyclohexane, norbornane, isobornane, adamantane, tricyclodecane or tetracyclododecane.

If $Y^2$ represents a bivalent linking group containing a hetero atom, as the bivalent linking group containing a hetero atom, —O—, —C(=O)—O—, —C(=O)—, —O—C(=O)—O—, —C(=O)—NH—, —NH— (wherein, H may be substituted with an alkyl group, an acyl group, or the like), —S—, —S(=O)$_2$—, —S(=O)$_2$—O—, "-A-O—B—" (wherein, O represents an oxygen atom, and A and B each independently represents a bivalent hydrocarbon group which may contain a substituent) or the like can be used.

If $Y^2$ is —NH—, the substituent (an alkyl group, an acyl group, or the like) preferably has 1 to 10 carbon atoms, more preferably 1 to 8 carbon atoms, and still more preferably 1 to 5 carbon atoms.

If $Y^2$ is "-A-O—B—", A and B each independently represents a bivalent hydrocarbon group which may contain a substituent.

The expression that a hydrocarbon group "contains a substituent" means that a part or all of the hydrogen atoms in the hydrocarbon group are substituted with groups or atoms other than hydrogen atoms.

The hydrocarbon group in A may be an aliphatic hydrocarbon group or may be an aromatic hydrocarbon group. The aliphatic hydrocarbon group means a hydrocarbon group which contains no aromaticity.

The aliphatic hydrocarbon group in A may be saturated or unsaturated, and is typically preferably saturated.

Specific examples of the aliphatic hydrocarbon group in A include a linear or branched aliphatic hydrocarbon group, and an aliphatic hydrocarbon group containing a ring within the structure.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As the linear aliphatic hydrocarbon group, a linear alkylene group is preferable, and specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

The branched aliphatic hydrocarbon group is preferably a branched alkylene group, and specific examples thereof include alkylalkylene groups such as alkylmethylene groups (for example, —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—); alkylethylene groups (for example, —CH(CH$_3$)CH$_2$—, —CH(CH$_3$)CH (CH$_3$)—, —C(CH$_3$)$_2$CH$_2$—, and —CH(CH$_2$CH$_3$)CH$_2$—); alkyltrimethylene groups (for example, —CH(CH$_3$) CH$_2$CH$_2$— and —CH$_2$CH(CH$_3$)CH$_2$—); and alkyltetramethylene groups (for example, —CH(CH$_3$)CH$_2$CH$_2$CH$_2$— and —CH$_2$CH(CH$_3$)CH$_2$CH$_2$—). The alkyl group in the alkylalkylene group is preferably a linear alkyl group of 1 to 5 carbon atoms.

The chain-like aliphatic hydrocarbon group may or may not contain a substituent. Examples of the substituent include a fluorine atom, a fluorinated lower alkyl group of 1 to 5 carbon atoms, and an oxygen atom (=O).

Examples of the aliphatic hydrocarbon group containing a ring within the structure include a cyclic aliphatic hydrocarbon group (a group in which two hydrogen atoms have been removed from an aliphatic hydrocarbon ring); and a group in which the above cyclic aliphatic hydrocarbon group is bonded to the terminal of the aforementioned chain-like aliphatic hydrocarbon group or allocated in the middle of the aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be a polycyclic group or a monocyclic group. The monocyclic group is preferably a group in which two hydrogen atoms have been removed from a monocycloalkane of 3 to 6 carbon atoms, and examples of the monocycloalkane include cyclopentane and cyclohexane.

The polycyclic group is preferably a group in which two hydrogen atoms have been removed from a polycycloalkane of 7 to 12 carbon atoms, and examples of the polycycloalkane include adamantane, norbornane, isobornane, tricyclodecane, and tetracyclododecane.

The cyclic aliphatic hydrocarbon group may or may not contain a substituent. Examples of substituent include a lower alkyl group of 1 to 5 carbon atoms, a fluorine atom, a fluorinated lower alkyl group of 1 to 5 carbon atoms, and an oxygen atom (=O).

A is preferably a linear aliphatic hydrocarbon group, more preferably a linear alkylene group, still more preferably a linear alkylene group of 2 to 5 carbon atoms, and most preferably an ethylene group.

Examples of the hydrocarbon group for B include the same bivalent hydrocarbon groups as those described above for A.

B is preferably a linear or branched aliphatic hydrocarbon group, and particularly preferably a methylene group or an alkylmethylene group.

The alkyl group within the alkylmethylene group is preferably a linear alkyl group of 1 to 5 carbon atoms, more preferably a linear alkyl group of 1 to 3 carbon atoms, and most preferably a methyl group.

In the formula (V), $X^2$ represents an acid dissociable, dissolution inhibiting group containing an aliphatic cyclic group.

There are no particular restrictions on the acid dissociable, dissolution inhibiting group containing an aliphatic cyclic group for $X^2$, and any of acid dissociable, dissolution inhibiting groups which have been proposed for resins in resist compositions for conventional KrF excimer lasers, ArF excimer lasers, and the like can be used by appropriately selecting from those. Specific examples thereof include the group (1) or (2) described above as the tertiary alkyl group.

Specific examples of the above general formula (V) include the following.

[Chemical Formula 12]

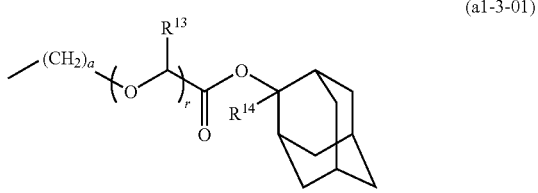

(a1-3-01)

(In the formula, $R^{14}$ represents a lower alkyl group; $R^{13}$ represents a hydrogen atom or a methyl group; a represents an integer of 1 to 10; and r represents an integer of 0 or 1.)

[Chemical Formula 13]

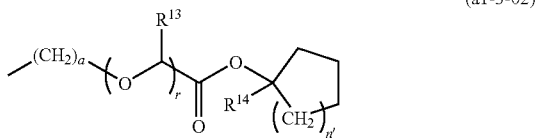

(a1-3-02)

(In the formula, $R^{14}$ represents a lower alkyl group; $R^{13}$ represents a hydrogen atom or a methyl group; a represents an integer of 1 to 10; n' represents an integer of 1 to 6; and r represents an integer of 0 or 1.)

In the above general formula (a1-3-01) or (a1-3-02), $R^{13}$ is preferably a hydrogen atom.

The lower alkyl group for $R^{14}$ is the same as the lower alkyl group described above for R, and is preferably a methyl group or an ethyl group.

a is preferably an integer of 1 to 8, more preferably an integer of 1 to 5, and particularly preferably 1 or 2.

r is preferably 1.

In the acid dissociable, dissolution inhibiting group-containing group (III), the tertiary alkyl group-containing group is more preferably a chain-like tertiary alkyloxycarbonyl group represented by the above general formula (III-b), and a tert-butyloxycarbonyl group (t-boc) is most preferable, because it excels in resist pattern shape or lithography properties (depth of focus (DOF) and the like).

Also, the tertiary alkyl group-containing group is preferably a group containing the above group (1), that is, a group containing a group in which a linear or branched alkyl group is bonded to a carbon atom which constitutes a ring of a cyclic alkyl group (cycloalkyl group) wherein the carbon atom is a tertiary carbon atom (hereinafter, referred to as "tertiary alkyl group-containing group (1)").

Of those described above, $R^1$ in the above general formula (a2-1) or $R^2$ in the above general formula (a2-2) is more preferably the acid dissociable, dissolution inhibiting group (I) or the acid dissociable, dissolution inhibiting group-containing group (III), and particularly preferably the acid dissociable, dissolution inhibiting group (I).

Of the acid dissociable, dissolution inhibiting group (I), a group represented by the general formula (I-b) is most preferable.

Of the acid dissociable, dissolution inhibiting group-containing group (III), a chain-like tertiary alkyloxycarbonyl group represented by the above general formula (III-b), or a tertiary alkyl group-containing group (1) described above is more preferable, and a chain-like tertiary alkyloxycarbonyl group represented by the above general formula (III-b) is most preferable.

The acid dissociable, dissolution inhibiting group (I) is preferable, because it requires small elimination energy when it dissociates from the component (A) upon exposure, and thus can readily dissociate. A group represented by the above general formula (III-b) is preferable, because it requires small elimination energy when it dissociates from the component (A) upon exposure, and also tends to readily improve lithography properties (particularly, depth of focus (DOF)).

As the structural unit (a2), one type may be used alone, or two or more types may be used in combination.

Of those described above, the structural unit (a2) more preferably contains the structural unit (a22), and particularly preferably contains a structural unit represented by the above general formula (a2-2), because it excels in the effects of the present invention. Also, the structural unit (a2) is preferably a structural unit containing an acid dissociable, dissolution inhibiting group represented by the general formula (I-b), because it excels in the effects of the present invention.

The proportion of the structural unit (a2) in the component (A) is preferably 5 to 70 mol %, more preferably 5 to 65 mol %, still more preferably 5 to 60 mol %, and most preferably 5 to 55 mol %, based on the combined total of all structural units constituting the component (A). When this proportion is not less than the lower limit within the above range, then excellent pattern can be formed using a resist composition which includes the structural unit (a2), whereas when the proportion is not more than the upper limit within the above range, a good quantitative balance with the other structural units can be attained.

[Other Structural Units]

The component (A) may also have a structural unit other than the above structural units (a1) and (a2), as long as the effects of the present invention are not impaired.

As the above other structural unit, any other structural unit which cannot be classified as the above structural units (a1) and (a2) can be used without any particular limitations.

As other structural unit, any of the multitude of conventional units used within the resin component of resist compositions for ArF excimer lasers, KrF excimer lasers, or the like (and preferably for KrF excimer lasers) can be used, and examples thereof include a structural unit derived from a styrene, a structural unit derived from an acrylate ester containing non-acid dissociable aliphatic polycyclic group, a structural unit derived from an acrylate ester containing a lactone-containing cyclic group, and a structural unit derived from an acrylate ester containing a polar group-containing aliphatic hydrocarbon group (for example, a hydroxyl group-containing cyclic alkyl group or a hydroxyl group-containing chain-like alkyl group).

Here, in the present specification, the term "lactone-containing cyclic group" means a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings. The lactone-containing cyclic group is a concept including both of the monocyclic groups and polycyclic groups.

The term "structural unit derived from an acrylate ester" means a structural unit that is formed by the cleavage of the ethylenic double bond of an acrylate ester.

The term "acrylate ester" is a concept containing an acrylate ester in which a hydrogen atom is bonded to the carbon atom at the α-position, and an α-substituted acrylate ester in which a hydrogen atom bonded to the carbon atom at the α-position is substituted with a substituent (an atom or group other than a hydrogen atom). Examples of the substituent include a lower alkyl group and a halogenated lower alkyl group.

The term "α-position (carbon atom at the α-position)" in the structural unit derived from an acrylate ester means the carbon atom to which the carbonyl group is bonded, if not otherwise specified.

In an acrylate ester, specific examples of the lower alkyl group as the substituent at the α-position include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

In the present invention, the group which is bonded to the α-position of an acrylate ester is preferably a hydrogen atom, a lower alkyl group or a halogenated lower alkyl group; more preferably a hydrogen atom, a lower alkyl group or a fluorinated lower alkyl group; and still more preferably a hydrogen atom or a methyl group, in terms of industrial availability.

(Structural Unit Derived from a Styrene)

The component (A) may contain a structural unit (hereinafter, referred to as "structural unit (a3)") derived from a styrene, as described above. By containing the structural unit (a3), solubility in an alkali developing solution can be controlled. Also, heat resistance and dry-etching resistance can be improved when using a resist composition which includes the structural unit (a3).

In the present application, the term "styrene" is a concept containing styrene, an α-substituted styrene in which the hydrogen atom at the α-position of styrene is substituted with a substituent such as an alkyl group, and derivatives thereof (excluding the above-mentioned hydroxystyrene). Also, it contains a styrene in which a hydrogen atom of the phenyl group is substituted with a substituent such as a lower alkyl group of 1 to 5 carbon atoms.

The term "structural unit derived from a styrene" means a structural unit formed by cleavage of the ethylenic double bond of a styrene.

Preferable examples of the structural unit (a3) include a structural unit represented by the general formula (a3-1) shown below.

[Chemical Formula 14]

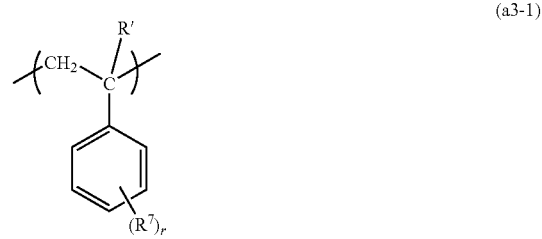

(a3-1)

(In the formula (a3-1), R' is as defined above; $R^7$ represents a lower alkyl group of 1 to 5 carbon atoms; and r represents an integer of 0 to 3.)

In the above general formula (a3-1), R' and $R^7$ are respectively the same as R' and $R^6$ in the above general formula (a1-1).

r represents an integer of 0 to 3, is preferably 0 or 1, and particularly preferably 0 in terms of industrial reasons.

If r is 1, the binding position of $R^7$ may be either o-position, m-position, or p-position of the phenyl group. If r is 2 or 3, the binding positions of the plurality of $R^7$ can be arbitrarily combined. Here, the plurality of $R^7$ may be the same, or may be different from one another.

The proportion of the structural unit (a3) in the component (A) is preferably 1 to 40 mol %, more preferably 3 to 30 mol %, and still more preferably 5 to 25 mol %, based on the combined total of all structural units constituting the component (A). When this proportion is not less than the lower limit within the above range, then effects attained by including the structural unit (a3) can be excellent, whereas when the proportion is not more than the upper limit within the above range, a good quantitative balance with the other structural units can be attained.

In the positive resist composition of the present invention, the component (A) is a resin component containing the structural units (a1) and (a2).

Suitable examples of the component (A) include a copolymer (A1) (hereinafter, referred to as "component (A1)") containing the structural units (a1) and (a2). Examples of the copolymer include a copolymer consisting of the above structural units (a1) and (a2), and a copolymer consisting of the above structural units (a1), (a2), and (a3).

Specific examples of the component (A1) include copolymers (A1-1), (A1-2), (A1-3) and (A1-4) which contain combinations of structural units shown below.

[Chemical Formula 15]

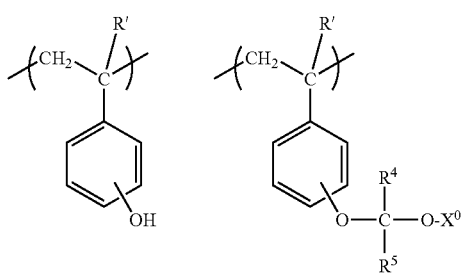

(A1-1)

(In the formula, R', $R^4$, $R^5$ and $X^0$ are as defined above; and the plurality of R' each may be the same, or may be different from each other.)

In the above formula (A1-1), R' is particularly preferably a hydrogen atom or a methyl group.

It is preferable that $R^4$ and $R^5$ each be independently a hydrogen atom or a methyl group, and it is most preferable that one of $R^4$ and $R^5$ be a hydrogen atom and the other be a methyl group.

$X^0$ is preferably a lower alkyl group of 1 to 5 carbon atoms, and most preferably an ethyl group.

[Chemical Formula 16]

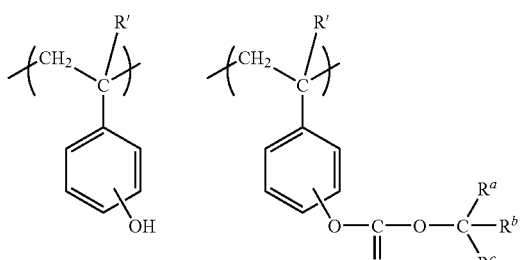

(A1-2)

(In the formula, R' is as defined above; and $R^a$ to $R^c$ each independently represents a lower alkyl group of 1 to 5 carbon atoms.)

In the above formula (A1-2), R' is particularly preferably a hydrogen atom or a methyl group.

Examples of the lower alkyl group for $R^a$ to $R^c$ include the same lower alkyl groups as those for R'. All of $R^a$ to $R^b$ are preferably linear alkyl groups. Also, it is preferable that all of $R^a$ to $R^b$ be alkyl groups of the same carbon atoms. Of these, it is particularly preferable that all of $R^a$ to $R^c$ be linear alkyl groups with the same carbon atoms, and it is most preferable that all of $R^a$ to $R^c$ be methyl groups (that is, —$C(R^a)(R^b)(R^c)$ is most preferably a tert-butyl group).

[Chemical Formula 17]

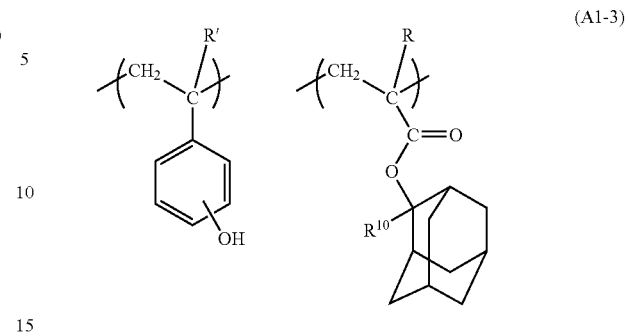

(A1-3)

(In the formula, R' is as defined above; R represents a hydrogen atom, a lower alkyl group or a halogenated lower alkyl group; and $R^{10}$ represents a lower alkyl group of 1 to 5 carbon atoms.)

In the above formula (A1-3), R' is particularly preferably a hydrogen atom or a methyl group.

R is the same as R above, and is particularly preferably a hydrogen atom or a methyl group.

The lower alkyl group for $R^{10}$ is the same as the lower alkyl group described above for R, and is preferably a methyl group, an ethyl group, or an isopropyl group.

[Chemical Formula 18]

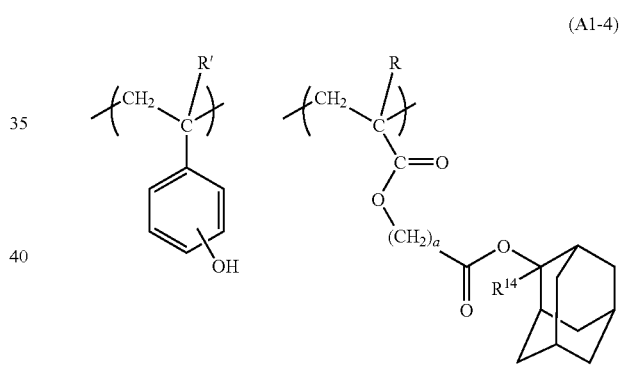

(A1-4)

(In the formula, R' is as defined above; R represents a hydrogen atom, a lower alkyl group or a halogenated lower alkyl group; and $R^{14}$ and a are as defined above.)

In the above formula (A1-4), R' is particularly preferably a hydrogen atom or a methyl group.

R is the same as R above, and is particularly preferably a hydrogen atom or a methyl group.

The lower alkyl group for $R^{14}$ is the same as the lower alkyl group described above for R, and is preferably a methyl group or an ethyl group.

a is preferably an integer of 1 to 5, and particularly preferably 1 or 2.

As the component (A), one kind can be used alone, or two or more kinds can be used in combination.

In the present invention, the component (A) is preferably the component (A1), and more preferably the copolymer (A1-1) and/or (A1-2). Of these, the component (A) is particularly preferably the copolymer (A1-1) or a mixed resin composition of the copolymers (A1-1) and (A1-2), because it excels in the effects of the present invention and lithography properties.

The mixed proportion of the copolymers (A1-1) and (A1-2) in the above mixed resin composition is preferably "(A1-1)/(A1-2)=1/99 to 99/1", more preferably "10/90 to 90 to 10", and still more preferably "20/80 to 85/15" in mass ratio.

When the mixed proportion of the copolymers (A1-1) and (A1-2) is within the above range, a balance of resolution with other lithography properties such as depth of focus (DOF) can be more excellent.

Also, in the present invention, the component (A) is preferably a copolymer (A1-3), because it excels in lithography properties (EL margin, line width roughness (LWR), and the like).

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group may be introduced at the terminals of the component (A). When a hydroxyalkyl group in which a part of the hydrogen atoms of the alkyl group has been substituted with fluorine atoms is introduced into a copolymer in this manner, the copolymer thus obtained can have an advantageous effect of reducing the levels of developing defects and LER (line edge roughness: non-uniform irregularities within the line side walls).

The weight average molecular weight (Mw) (the polystyrene equivalent value determined by gel permeation chromatography) of the component (A) is not particularly limited, and is preferably 2,000 to 50,000, more preferably 3,000 to 30,000, and most preferably 5,000 to 20,000.

Ensuring that the weight average molecular weight of the polymer compound (A) is not more than the upper limit, solubility sufficient for a resist relative to a resist solvent can be obtained. Ensuring that it is not less than the lower limit, excellent dry-etching resistance and excellent cross-sectional shape of the resist pattern can be obtained.

Further, the dispersity (Mw/Mn) is preferably within a range from 1.0 to 5.0, more preferably from 1.0 to 3.0, and most preferably from 1.2 to 2.5. Herein, Mn means the number average molecular weight.

In the positive resist composition of the present invention, the content of the component (A) may be adjusted according to the thickness of the resist film to be formed.

<Component (B)>

The component (B) includes an acid generator (B1) (hereinafter, referred to as component (B1)) composed of a compound represented by the general formula (b1) shown below.

[Chemical Formula 19]

(In the formula (b1), $Q^1$ represents a bivalent linking group containing an oxygen atom; $Y^1$ represents an alkylene group of 1 to 4 carbon atoms which may contain a substituent or a fluorinated alkylene group of 1 to 4 carbon atoms which may contain a substituent; X represents a hydrocarbon group of 3 to 30 carbon atoms which may contain a substituent; and $A^+$ represents an organic cation.)

In the above formula (b1), $Q^1$ represents a bivalent linking group containing an oxygen atom.

$Q^1$ may contain an atom other than an oxygen atom. Examples of the atom other than an oxygen atom include a carbon atom, a hydrogen atom, a sulfur atom, and a nitrogen atom.

Examples of the bivalent linking group containing an oxygen atom include non-hydrocarbon-based, oxygen atom-containing linking groups such as an oxygen atom (ether linkage; —O—), an ester linkage (—C(=O)—O—), an amide linkage (—C(=O)—NH—), a carbonyl group (—C(=O)—), and a carbonate linkage (—O—C(=O)—O—); and combined groups of the non-hydrocarbon-based, oxygen atom-containing linking group with an alkylene group.

Examples of the above combined groups include a group of —$R^{91}$—O—, a group of —$R^{92}$—O—C(=O)—, and a group of —C(=O)—O—$R^{93}$—O—C(=O)— (wherein, $R^{91}$ to $R^{93}$ each independently represents an alkylene group).

The alkylene group for $R^{91}$ to $R^{93}$ is preferably a linear or branched alkylene group. The alkylene group for $R^{91}$ to $R^{93}$ preferably has 1 to 12 carbon atoms, more preferably 1 to 5 carbon atoms, and still more preferably 1 to 3 carbon atoms.

Specific examples of the alkylene group include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —CH($CH_2CH_2CH_3$)$CH_2$—; a trimethylene group (n-propylene group) [—$CH_2CH_2CH_2$—]; an alkyltrimethylene group such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

$Q^1$ is preferably an ester linkage, a bivalent linking group containing an ester linkage, an ether linkage, or a bivalent linking group containing an ether group. Of these, $Q^1$ is more preferably an ester linkage, an ether linkage, —$R^{91}$—O—, —$R^{92}$—O—C(=O)—, or —C(=O)—O—$R^{93}$—O—C(=O)—, and particularly preferably an ester linkage, —$R^{91}$—O—, or —C(=O)—O—$R^{93}$—O—C(=O)—.

In the above formula (b1-1), $Y^1$ represents an alkylene group of 1 to 4 carbon atoms which may contain a substituent, or a fluorinated alkylene group of 1 to 4 carbon atoms which may contain a substituent.

Examples of the alkylene group for $Y^1$ include the same alkylene groups of 1 to 4 carbon atoms from among the alkylene groups ($R^{91}$ to $R^{93}$) described above in $Q^1$.

As the fluorinated alkylene group for $Y^1$, groups in which a part or all of hydrogen atoms in the alkylene group are substituted with fluorine atoms can be used.

Specific examples of $Y^1$ include —$CF_2$—, —$CF_2CF_2$—, —$CF_2CF_2CF_2$—, —CF($CF_3$)$CF_2$—, —CF($CF_2CF_3$)—, —C($CF_3$)$_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2$$CF_2$—, —CF($CF_2CF_3$)$CF_2$—, —CF($CF_2CF_2CF_3$)—, and —C($CF_3$)($CF_2CF_3$)—; —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2$CH($CF_3$)$CH_2$—, —CH($CF_3$)CH($CF_3$)—, and —C($CF_3$)$_2CH_2$—; and —$CH_2$—, —$CH_2CH_2$—, —$CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$)$CH_2CH_2$—, —$CH_2$CH($CH_3$)$CH_2$—, —CH($CH_3$)CH($CH_3$)—, —C($CH_3$)$_2CH_2$—, —CH($CH_2CH_3$)$CH_2$—, —CH($CH_2CH_2CH_3$)—, and —C($CH_3$)($CH_2CH_3$)—.

$Y^1$ is preferably a fluorinated alkylene group, and particularly preferably a fluorinated alkylene group in which the carbon atom bonded to the adjacent sulfur atom is fluorinated.

In such a case, an acid exhibiting strong acidity is generated from the component (B1) upon exposure. Accordingly, the resulting resist pattern shape can be more excellent, and lithography properties can be more improved.

Examples of such flurorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, and —$CF(CF_2CF_3)CF_2$—; —$CH_2CF_2$—, —$CH_2CH_2CF_2$—, and —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$—, or —$CH_2CF_2CF_2$— is preferable, —$CF_2$—, —$CF_2CF_2$—, or —$CF_2CF_2CF_2$— is more preferable, and —$CF_2$— is most preferable because it can obtain the effects of the present invention particularly excellently.

The alkylene group or fluorinated alkylene group may contain a substituent. The expression that the alkylene group or fluorinated alkylene group "contain a substituent" means that a part or all of the hydrogen atoms or fluorine atoms of the alkylene group or fluorinated alkylene group are substituted with atoms or groups other than hydrogen atoms and fluorine atoms.

Examples of the substituent which may be included in the alkylene group or fluorinated alkylene group include an alkyl group of 1 to 4 carbon atoms, an alkoxy group of 1 to 4 carbon atoms, and a hydroxyl group.

In the above formula (b1), X represents a hydrocarbon group of 3 to 30 carbon atoms which may contain a substituent.

The hydrocarbon group for X may be an aromatic hydrocarbon group, or may be an aliphatic hydrocarbon group.

The aromatic hydrocarbon group is a hydrocarbon group containing an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of the carbon atoms described above does not include the number of carbon atoms included in the substituent.

Specific examples of the aromatic hydrocarbon group include: aryl groups in which one hydrogen atom has been removed from an aromatic hydrocarbon ring, such as a phenyl group, a biphenyl group, a fluorenyl group, a naphthyl group, an anthryl group, and a phenanthryl group; and arylalkyl groups such as a benzyl group, a phenethyl group, a 1-naphthylmethyl group, a 2-naphthylmethyl group, a 1-naphthylethyl group, and a 2-naththylethyl group. The number of carbon atoms of the alkyl chain in the arylalkyl group is preferably 1 to 4, more preferably 1 or 2, and still more preferably 1.

The aromatic hydrocarbon group may contain a substituent. For example, a part of the carbon atoms which constitutes an aromatic ring included in the aromatic hydrocarbon group may be substituted with a hetero atom, or a part of the hydrogen atoms bonded to an aromatic ring included in the aromatic hydrocarbon group may be substituted with a substituent.

Examples of the former case include a heteroaryl group in which a part of the carbon atoms which constitutes a ring of the aryl group described above are substituted with hetero atoms such as an oxygen atom, a sulfur atom, and a nitrogen atom; and a heteroarylalkyl group in which a part of the carbon atoms which constitutes an aromatic hydrocarbon ring of the arylalkyl group described above is substituted with the hetero atoms.

On the other hand, examples of the substituent in the aromatic hydrocarbon group in the latter case include an alkyl group, an alkoxy group, a halogen atom, a halogenated alkyl group, a hydroxyl group, and an oxygen atom (=O).

The alkyl group for the substituent in the aromatic hydrocarbon group is preferably an alkyl group of 1 to 5 carbon atoms, and most preferably a methyl group, an ethyl group, a propyl group, an n-butyl group, or a tert-butyl group.

The alkoxy group for the substituent in the aromatic hydrocarbon group is preferably an alkoxy group of 1 to 5 carbon atoms, and more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent in the aromatic hydrocarbon group include a fluorine atom, a chlorine atom, a bromine atom, and an iodine atom. Of these, a fluorine atom is preferable.

Examples of the halogenated alkyl group for the substituent in the aromatic hydrocarbon group include groups in which a part of or all of the hydrogen atoms of the above alkyl group are substituted with the halogen atoms.

The aliphatic hydrocarbon group for X may be a saturated aliphatic hydrocarbon group, or an unsaturated aliphatic hydrocarbon group. Also, the aliphatic hydrocarbon group may be linear, branched, or cyclic.

In the aliphatic hydrocarbon group for X, a part of the carbon atoms which constitute the aliphatic hydrocarbon group may be substituted with a substituent containing a hetero atom, or a part or all of the hydrogen atoms which constitute the aliphatic hydrocarbon group may be substituted with a substituent containing a hetero atom.

There are no particular restrictions on the "hetero atom" in X, as long as it is an atom other than a carbon atom and a hydrogen atom. Examples thereof include a halogen atom, an oxygen atom, a sulfur atom, and a nitrogen atom. Examples of the halogen atom include a fluorine atom, a chlorine atom, an iodine atom, and a bromine atom.

The substituent containing a hetero atom may consist of the above hetero atom, or may be a group containing a group or an atom other than the hetero atom.

As the substituents which are substituted for a part of the carbon atoms constituting the aforementioned aliphatic hydrocarbon group for X, for example, a group of —O—, —C(=O)—O—, —C(=O)—, —O—C(=O)—O—, —C(=O)—NH—, —NH— (wherein H may be substituted with a substitutent such as an alkyl group or an acyl group), —S—, —S(=O)$_2$—, or —S(=O)$_2$—O— can be used. If the aliphatic hydrocarbon group for X is cyclic, these substituents may be included in a ring (cyclic) structure.

Specific examples of the substituents which are substituted for a part or all of the hydrogen atoms constituting the aforementioned aliphatic hydrocarbon group for X include an alkoxy group, a halogen atom, a halogenated alkyl group, a hydroxyl group, an oxygen atom (=O), and a cyano group.

The alkoxy group is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom include a fluorine atom, a chlorine atom, a bromine atom, and an iodine atom. Of these, a fluorine atom is preferable.

Examples of the halogenated alkyl group include a group in which a part or all of the hydrogen atoms of an alkyl group of 1 to 5 carbon atoms, such as a methyl group, an ethyl group, a propyl group, an n-butyl group, or a tert-butyl group, are substituted with the halogen atoms.

The aliphatic hydrocarbon group is preferably a linear or branched saturated hydrocarbon group, a linear or branched monovalent unsaturated hydrocarbon group, or a cyclic aliphatic hydrocarbon group (aliphatic cyclic group).

The linear saturated hydrocarbon group (alkyl group) preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, isotridecyl group, tetradecyl group, a pentadecyl group, a hexadecyl group, an isohexadecyl group, a heptadecyl group, an octadecyl group, a nonadecyl group, an icosyl group, a henicosyl group, and a docosyl group.

The branched saturated hydrocarbon group (alkyl group) has preferably 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The unsaturated hydrocarbon group has preferably 2 to 10 carbon atoms, more preferably 2 to 5 carbon atoms, still more preferably 2 to 4 carbon atoms, and most preferably 3 carbon atoms. Examples of the linear monovalent unsaturated hydrocarbon group include a vinyl group, a propenyl group (allyl group) and a butynyl group. Examples of the branched monovalent unsaturated hydrocarbon group include a 1-methylpropenyl group and a 2-methylpropenyl group.

Of these, the unsaturated hydrocarbon group is particularly preferably a propenyl group.

The aliphatic cyclic group may be a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples thereof include groups in which one or more of hydrogen atoms have been removed from a monocycloalkane; and groups in which one or more of hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

If the aliphatic cyclic group does not contain a substituent containing a hetero atom within the ring structure, the aliphatic cyclic group is preferably a polycyclic group, more preferably groups in which one or more hydrogen atoms have been removed from a polycycloalkane, and most preferably groups in which one or more hydrogen atoms have been removed from an adamantane.

If the aliphatic cyclic group contains a substituent containing a hetero atom within the ring structure, the substituent containing a hetero atom is preferably —O—, —C(=O)—O—, —S—, —S(=O)$_2$—, or —S(=O)$_2$—O—. Specific examples of such aliphatic cyclic groups include groups represented by the formulae (L1) to (L5), and (S1) to (S4) shown below.

[Chemical Formula 20]

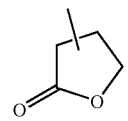
(L1)

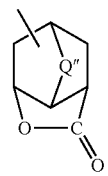
(L2)

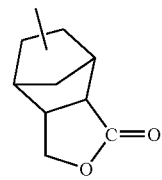
(L3)

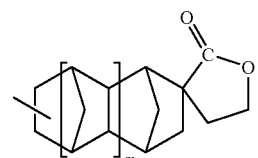
(L4)

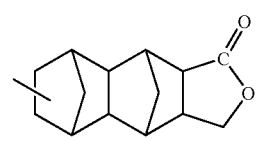
(L5)

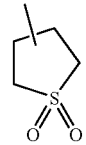
(S1)

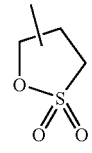
(S2)

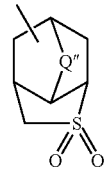
(S3)

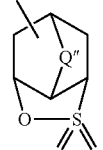
(S4)

(In the formulae, Q″ represents an alkylene group of 1 to 5 carbon atoms, —O—, —S—, —O—R$^{94}$—, or —S—R$^{95}$—; R$^{94}$ and R$^{95}$ each independently represents an alkylene group of 1 to 5 carbon atoms; and m represents an integer of 0 or 1.)

Examples of the alkylene group for Q", $R^{94}$, and $R^{95}$ each include the same alkylene groups of 1 to 5 carbon atoms as those described above in the explanation of alkylene group for $R^{91}$ to $R^{93}$.

These aliphatic cyclic group may be a group in which a part of the hydrogen atoms bonded to the carbon atoms constituting the ring structure are substituted with substitutents. Examples of the substituent include an alkyl group, an alkoxy group, a halogen atom, a halogenated alkyl group, a hydroxyl group, and an oxygen atom (=O).

The aforementioned alkyl group is preferably an alkyl group of 1 to 5 carbon atoms, and particularly preferably a methyl group, an ethyl group, a propyl group, an n-butyl group, or a tert-butyl group.

Examples of the alkoxy group and halogen atoms each include the same as those described above as the substitutents which are substituted for a part or all of the hydrogen atoms.

In the present invention, X is preferably a cyclic group which may contain a substitutent. The cyclic group may be an aromatic hydrocarbon group which may contain a substituent or an aliphatic cyclic group which may contain a substituent, and is preferably an aliphatic cyclic group which may contain a substituent.

The aforementioned aromatic hydrocarbon group is preferably a naphthyl group which may contain a substituent or a phenyl group which may contain a substituent.

The aliphatic cyclic group which may contain a substituent is preferably a polycyclic aliphatic cyclic group which may contain a substituent. The polycyclic aliphatic cyclic group is preferably a group in which one or more hydrogen atoms have been removed from a polycycloalkane, or a group represented by the above formulae (L2) to (L5), and (S3) to (S4).

Also, the fluorination ratio of the anion moiety of the component (B1) (proportion (%) of the number of fluorine atoms, based on the total number of fluorine atoms and hydrogen atoms included in the anion moiety) is preferably within the range of 1 to 95%, more preferably 5 to 90%, and still more preferably 8 to 50%, because it excels in the effects of the present invention.

In the formula (b1), the organic cation for $A^+$ is not particularly restricted, and any of cation moieties which have been known as cation moieties of onium salt-based acid generators, arbitrarily selected, can be used. The cation moiety is preferably a sulfonium ion or an iodonium ion, and particularly preferably a sulfonium ion.

Specific examples thereof include a cation moiety represented by the general formula (I-1) or (I-2) shown below.

[Chemical Formula 21]

(I-1)

(I-2)

(In the formula (I-1), $R^{1\prime\prime}$ to $R^{3\prime\prime}$ each independently represents an aryl group which may contain a substituent, or an alkyl group which may contain a substituent; at least one of $R^{1\prime\prime}$ to $R^{3\prime\prime}$ represents the above aryl group; and two of $R^{1\prime\prime}$ to $R^{3\prime\prime}$ may be bonded to each other to form a ring together with the sulfur atom within the formula. In the formula (I-2), $R^{5\prime\prime}$ and $R^{6\prime\prime}$ each independently represents an aryl group which may contain a substituent, or an alkyl group which may contain a substituent; and at least one of $R^{5\prime\prime}$ and $R^{6\prime\prime}$ represents the above aryl group.)

In the formula (I-1), $R^{1\prime\prime}$ to $R^{3\prime\prime}$ each independently represents an aryl group which may contain a substituent or an alkyl group which may contain a substituent. Two of $R^{1\prime\prime}$ to $R^{3\prime\prime}$ may be mutually bonded to form a ring together with the sulfur atom in the formula.

Also, at least one of $R^{1\prime\prime}$ to $R^{3\prime\prime}$ represents an aryl group. Two or more of $R^{1\prime\prime}$ to $R^{3\prime\prime}$ are preferably aryl groups, and all of $R^{1\prime\prime}$ to $R^{3\prime\prime}$ are most preferably aryl groups.

There are no particular restrictions on the aryl group for $R^{1\prime\prime}$ to $R^{3\prime\prime}$, and examples thereof include a non-substituted aryl group of 6 to 20 carbon atoms; a substituted aryl group in which a part or all of hydrogen atoms in the above non-substituted aryl group are substituted with an alkyl group, an alkoxy group, an alkoxyalkyloxy group, an alkoxycarbonylalkyloxy group, a halogen atom, a hydroxyl group, or the like; and a group of —$(R^{4\prime})$—$C(=O)$—$R^{5\prime}$. Here, $R^{4\prime}$ represents an alkylene group of 1 to 5 carbon atoms. $R^{5\prime}$ represents an aryl group. As the aryl group for $R^{5\prime}$, the same aryl groups as those described above for $R^{1\prime\prime}$ to $R^{3\prime\prime}$ can be used.

The non-substituted aryl group is preferably an aryl group of 6 to 10 carbon atoms, because it can be synthesized inexpensively. Specific examples thereof include a phenyl group and a naphthyl group.

The alkyl group for the substituent in the substituted aryl group is preferably an alkyl group of 1 to 5 carbon atoms, and most preferably a methyl group, an ethyl group, a propyl group, an n-butyl group, or a tert-butyl group.

The alkoxy group for the substituent in the substituted aryl group is preferably an alkoxy group of 1 to 5 carbon atoms, and most preferably a methoxy group, an ethoxy group, an n-propoxy group, an iso-propoxy group, an n-butoxy group, or a tert-butoxy group.

The halogen atom for the substituent in the substituted aryl group is preferably a fluorine atom.

Examples of the alkoxyalkyloxy group for the substituent in the substituted aryl group include groups represented by the general formula —O—$C(R^{47})(R^{48})$—O—$R^{49}$ (wherein, $R^{47}$ and $R^{48}$ each independently represents a hydrogen atom, or a linear or branched alkyl group; and $R^{49}$ represents an alkyl group).

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

At least one of $R^{47}$ and $R^{48}$ is preferably a hydrogen atom. Particularly, it is preferable that one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched, or cyclic.

The linear or branched alkyl group for $R^{49}$ preferably has 1 to 5 carbon atoms, and examples thereof include a methyl group, an ethyl group, a propyl group, an n-butyl group, and a tert-butyl group.

The cyclic alkyl group for $R^{49}$ preferably has 4 to 15 carbon atoms, more preferably has 4 to 12 carbon atoms, and most preferably 5 to 10 carbon atoms. Specific examples of the cyclic alkyl group for $R^{49}$ include groups in which one or more hydrogen atoms have been removed from a monocycloalkane or a polycycloalkane such as a bicycloalkane, tricycloalkane or tetracycloalkane, in which an alkyl group of 1 to 5 carbon atoms, a fluorine atom, or a fluorinated alkyl group of 1 to 5 carbon atoms may or may not be included as a substituent. Specific examples of monocycloalkanes include cyclopentane and cyclohexane. Specific examples of polycycloalkanes include adamantane, norbornane, isobornane, tricyclodecane, and tetracyclododecane. Of these, a group in which one or more hydrogen atoms have been removed from adamantane is preferable.

Examples of the alkoxycarbonylalkyloxy group for the substituent in the substituted aryl group include groups represented by the general formula —O—$R^{50}$—C(=O)—O—$R^{51}$ (wherein, $R^{50}$ represents a linear or branched alkylene group, and $R^{51}$ represents a tertiary alkyl group).

The linear or branched alkylene group for $R^{50}$ preferably has 1 to 5 carbon atoms, and examples thereof include a methylene group, an ethylene group, a trimethylene group, a tetramethylene group, and a 1,1-dimethylethylene group.

Examples of the tertiary alkyl group for $R^{51}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group, and a tert-hexyl group.

It is preferable that the aryl group for $R^{1'''}$ to $R^{3'''}$ each be independently a phenyl group or a naphthyl group.

There are no particular restrictions on the alkyl groups for $R^{1'''}$ to $R^{3'''}$. Examples thereof include a linear, branched, or cyclic alkyl group of 1 to 10 carbon atoms. The number of carbon atoms is preferably 1 to 5, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

In the case that two of $R^{1'''}$ to $R^{3'''}$ are mutually bonded to form a ring together with the sulfur atom in the formula, it is preferable to form a 3- to 10-membered ring including the sulfur ion, and it is more preferable to form a 5- to 7-membered ring including the sulfur ion.

In the case that two of $R^{1'''}$ to $R^{3'''}$ are mutually bonded to form a ring together with the sulfur atom in the formula, the other one of $R^{1'''}$ to $R^{3'''}$ is preferably an aryl group. As the aryl group, the same aryl groups as those for $R^{1'''}$ to $R^{3'''}$ can be used.

Specific examples of the cation moiety represented by the formula (I-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium, and 1-(4-methylphenyl)tetrahydrothiopyranium.

In the formula (I-2), $R^{5'''}$ and $R^{6'''}$ each independently represents an aryl group or an alkyl group. At least one of $R^{5'''}$ and $R^{6'''}$ represents an aryl group. Both of $R^{5'''}$ and $R^{6'''}$ preferably represent aryl groups.

As the aryl groups for $R^{5'''}$ and $R^{6'''}$, the same aryl groups as those for $R^{1'''}$ to $R^{3'''}$ above can be used.

As the alkyl groups for $R^{5'''}$ and $R^{6'''}$, the same alkyl group as those for $R^{1'''}$ to $R^{3'''}$ can be used.

Of these, it is most preferable that both of $R^{5'''}$ and $R^{6'''}$ be phenyl groups.

Specific examples of the cation moiety represented by the formula (I-2) include diphenyliodonium and bis(4-tert-butylphenyl)iodonium.

Also, preferred examples of the cation moiety include cation moieties represented by the general formula (I-5) and (I-6) shown below.

[Chemical Formula 22]

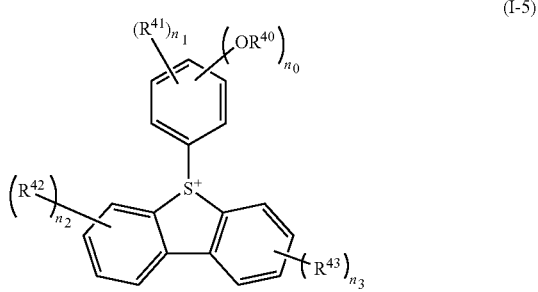

(I-5)

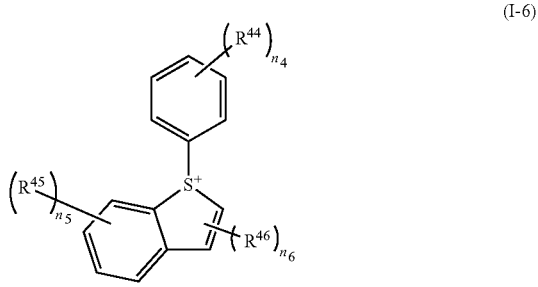

(I-6)

(In the formulae, $R^{40}$ represents a hydrogen atom or an alkyl group; $R^{41}$ represents an alkyl group, an acetyl group, a carboxy group, or a hydroxyalkyl group; $R^{42}$ to $R^{46}$ each independently represents an alkyl group, an acetyl group, an alkoxy group, a carboxy group, or a hydroxyalkyl group; $n_0$ to $n_5$ each independently represents an integer of 0 to 3, with the proviso that $n_0+n_1$ is 5 or less; and $n_6$ represents an integer of 0 to 2.)

The alkyl group for $R^{40}$ to $R^{46}$ in the formulae (I-5) and (I-6) is preferably an alkyl group of 1 to 5 carbon atoms, more preferably a linear or branched alkyl group, and still more preferably a methyl group, an ethyl group, a propyl group, an isopropyl group, an n-butyl group, or a tert-butyl group.

The alkoxy group for $R^{42}$ to $R^{46}$ is preferably an alkoxy group of 1 to 5 carbon atoms, more preferably a linear or branched alkoxy group, and particularly preferably a methoxy group or an ethoxy group.

The hydroxyalkyl group for $R^{41}$ to $R^{46}$ in the formula (I-5) and (I-6) is preferably a group in which one or more hydrogen atoms of the above alkyl group are substituted with hydroxyl groups, and examples thereof include a hydroxymethyl group, a hydroxyethyl group, and a hydroxypropyl group.

If the symbol $n_0$ attached at the bottom right of $OR^{40}$ is an integer of two or more, the plurality of $OR^{40}$ may be the same, or may be different from one another.

When the symbols $n_0$ to $n_6$ attached at the bottom right of $R^{41}$ to $R^{46}$ represent an integer of 2 or more, the plurality of $R^{41}$ to $R^{46}$ may be the same, or may be different from one another.

$n_0$ is preferably 0 or 1.

$n_1$ is preferably 0 to 2.

It is preferable that $n_2$ and $n_3$ each be independently 0 or 1, and it is more preferable that they be 0.

$n_4$ is preferably 0 to 2, and more preferably 0 or 1.

$n_5$ is preferably 0 or 1, and more preferably 0.

$n_6$ is preferably 0 or 1.

$A^+$ is preferably a cation moiety represented by the formula (I-1) or (I-5), and particularly preferably a cation moiety represented by the formulae (I-1-1) to (I-1-10), or (I-5-1) to (I-5-4) shown below. Of these, a cation moiety having a triphenyl skeleton such as a cation moiety represented by the formulae (I-1-1) to (I-1-8) is more preferable.

In the formulae (I-1-9) and (I-1-10), $R^8$ and $R^9$ each independently represents a phenyl group which may contain a substituent, a naphthyl group which may contain a substituent, an alkyl group of 1 to 5 carbon atoms, an alkoxy group of 1 to 5 carbon atoms, or a hydroxyl group.

u represents an integer of 1 to 3, and is most preferably 1 or 2.

[Chemical Formula 23]

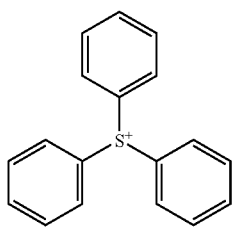

(I-1-1)

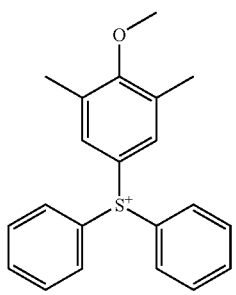

(I-1-2)

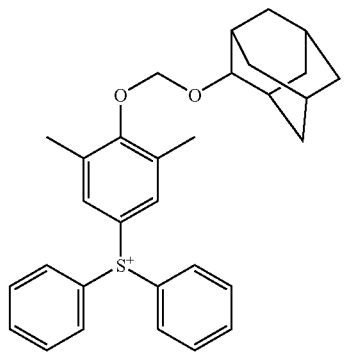

(I-1-3)

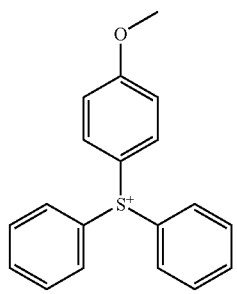

(I-1-4)

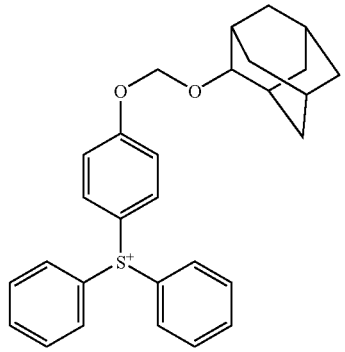

(I-1-5)

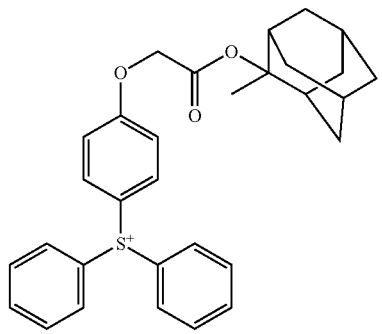

(I-1-6)

(I-1-7)

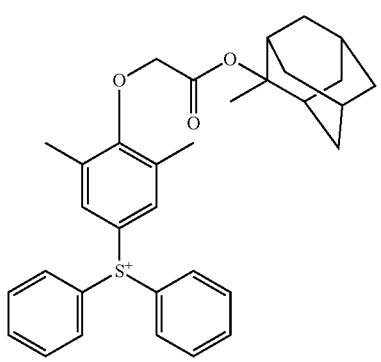

(I-1-8)

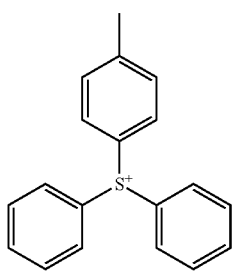

(I-1-9)

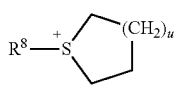

(I-1-10)

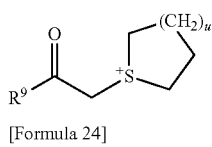

[Formula 24]

(I-5-1)

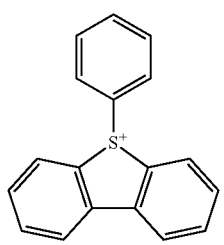

(I-5-2)

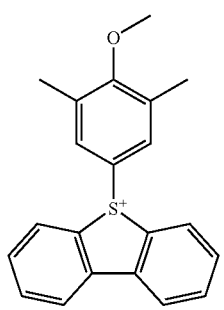

(I-5-3)

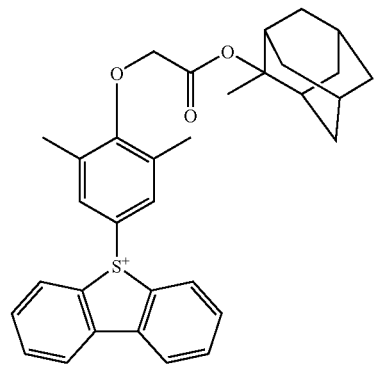

(I-5-4)

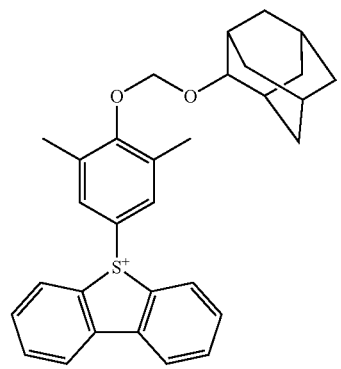

In the present invention, the component (B1) is preferably a compound represented by the general formula (b1-1) or (b1-2) shown below.

[Formula 25]

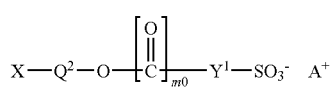

(b1-1)

(In the formula (b1-1), X, Y$^1$, and A$^+$ are as defined above; Q$^2$ represents a single bond or an alkylene group; and m0 represents an integer of 0 or 1.)

In the formula (b1-1), X is preferably an aliphatic cyclic group which may contain a substituent or an aromatic hydrocarbon group which may contain a substituent. Of these, X is particularly preferably an aliphatic cyclic group which contains a substituent having a hetero atom within the ring (cyclic) structure.

Examples of the alkylene group for Q$^2$ include the same alkylene groups as those described above for Q$^1$.

Q$^2$ is particularly preferably a single bond or a methylene group. Of these, if X is an aliphatic cyclic group which may contain a substituent, Q$^2$ is preferably a single bond, whereas if X is an aromatic hydrocarbon group, Q$^2$ is preferably a methylene group.

m0 may be either 0 or 1. If X is an aliphatic cyclic group which may contain a substituent, m0 is preferably 1, whereas if X is an aromatic hydrocarbon group, m0 is preferably 0.

[Formula 26]

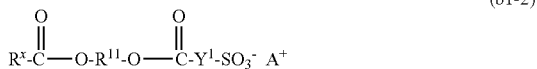

(b1-2)

(In the formula (b1-2), $R^X$ represents an aliphatic group which may contain a substituent (wherein, a nitrogen atom is excluded from the substituent); $R^{11}$ represents an alkylene group; and $Y^1$ and $A^+$ are as defined above.)

In the formula, $R^X$ represents an aliphatic group which may contain a substituent (wherein, a nitrogen atom is excluded from the substituent), and specific examples thereof include the same aliphatic cyclic groups which may contain a substituent as those described above in the explanation of X in the formula (b1-1) (wherein, aliphatic cyclic groups which contains a nitrogen atom or a substituent containing a nitrogen atom are excluded).

As $R^{11}$, the same alkylene groups as those described above in the explanation of $Q^2$ in the formula (b-1) can be used.

Examples of $Y^1$ and $A^+$ include the same as $Y^1$ and $A^+$, respectively, in the above formula (b1-1).

The component (B1) is particularly preferably a compound represented by the general formulae (b1-1-1) to (b1-1-5) shown below, or the general formulae (b1-2-1) to (b1-2-3) shown below.

[Chemical Formula 27]

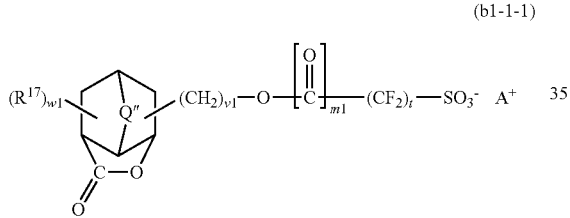 (b1-1-1)

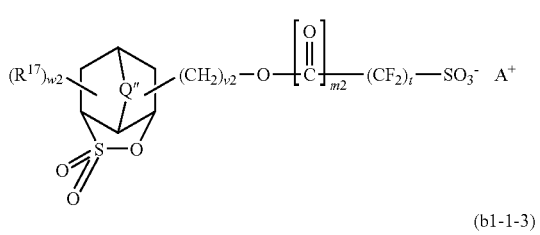 (b1-1-2)

(b1-1-3)

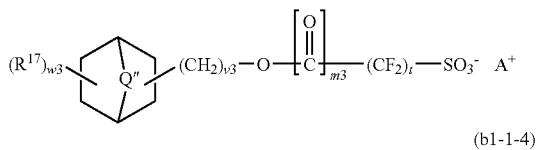

(b1-1-4)

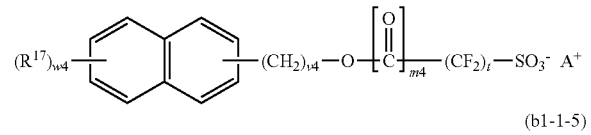

(b1-1-5)

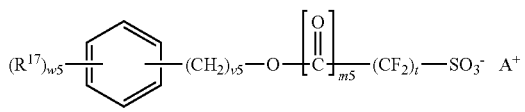

(In the formulae, Q", $A^+$ are as defined above; t represents an integer of 1 to 3; m1 to m5 each independently represents an integer of 0 or 1; v1 to v5 each independently represents an integer of 0 to 3; w1 to w5 each independently represents an integer of 0 to 3; and $R^{17}$ represents a substituent.)

Examples of the substituent for $R^{17}$ include the same substituents as those described above for the substituent which an aliphatic hydrocarbon group may contain and the substituent which an aromatic hydrocarbon group may contain in the explanation of X.

Each of the symbols (w1 to w5) attached at the bottom right of $R^{17}$ is an integer of two or more, the plurality of $R^{17}$ within the compound may be the same, or may be different from one another.

$A^+$ is preferably a sulfonium ion or an iodonium ion as described above, more preferably a cation moiety represented by the above general formula (I-1) or (I-5), and most preferably a cation moiety represented by the above general formula (I-1).

[Chemical Formula 28]

(b1-2-1)

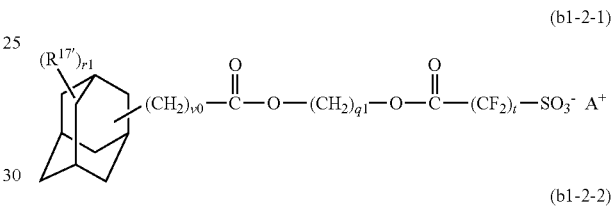

(b1-2-2)

(b1-2-3)

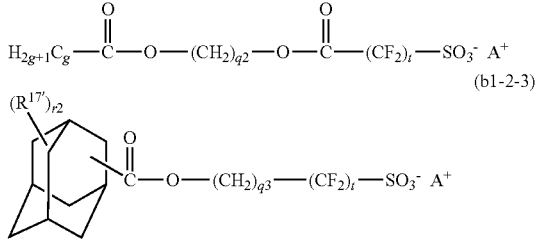

(In the formulae, $A^+$ is as defined above; t represents an integer of 1 to 3; v0 represents an integer of 0 to 3; q1, q2, and q3 each independently represents an integer of 1 to 12; r1 and r2 each independently represents an integer of 0 to 3; g represents an integer of 1 to 20; and $R^{17\prime}$ is a substituent.)

Examples of the substituent for $R^{17\prime}$ include the same substituents as those described above for the substituent which an aliphatic hydrocarbon group may contain in the explanation of $R^X$.

If each of the symbols (r1 and r2) attached at the bottom right of $R^{17\prime}$ is an integer of two or more, the plurality of $R^{17\prime}$ within the compound may be the same, or may be different from one another.

t is preferably 1 or 2.

v0 is preferably an integer of 0 to 2, more preferably 0 or 1, and still more preferably 0.

It is preferable that q1, q2 and q3 each be independently 1 to 5, and more preferably 1 to 3.

It is preferable that r1 and r2 each be independently an integer of 0 to 2, and more preferably 0 or 1.

g is preferably 1 to 15, and more preferably 1 to 10.

As the component (B1), one kind may be used alone, or two or more kinds may be used in combination.

In the component (B), the proportion of the component (B1) is preferably at least 50% by weight, more preferably at least 60% by weight, still more preferably at least 75% by weight, may be 100% by weight, and most preferably 100% by weight, based on the total weight of the component (B). When the proportion of the component (B1) is not less than the lower limit within the above range, the effects of the present invention can be improved.

The component (B1) can be manufactured by using a conventional method.

As the component (B1), for example, a compound represented by the above general formula (b1-1) and a compound represented by the above general formula (b1-2) can be manufactured by the following manner.

[Method of Manufacturing Compound Represented by General Formula (b1-1)]

The compound represented by the general formula (b1-1) can be manufactured by reacting a compound (b0-1) represented by the general formula (b0-1) shown below and a compound (b0-2) represented by the general formula (b0-2) shown below.

[Chemical Formula 29]

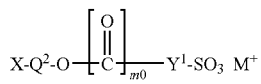
(b0-1)

$A^+ Z^-$
(b0-2)

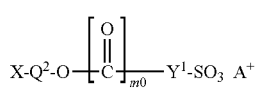
(b1-1)

In the formulae (b0-1) and (b0-2), X, $Q^2$, m0, $Y^1$, and $A^+$ are respectively the same as X, $Q^2$, m0, $Y^1$, and $A^+$ in the above formula (b1-1).

$M^+$ represents an alkali metal ion. Examples of the alkali metal ion for $M^+$ include a sodium ion, a lithium ion, and a potassium ion. Of these, a sodium ion or a lithium ion is preferable.

$Z^-$ represents a non-nucleophilic ion.

Examples of the non-nucleophilic ion include $BF_4^-$, $AsF_6^-$, $SbF_6^-$, $PF_6^-$, $ClO_4^-$, halogen ions such as a bromine ion and a chlorine ion, and ions which are capable of forming an acid exhibiting a lower acidity than the compound (b0-01).

As the ion which is capable of forming an acid exhibiting a lower acidity than the compound (b0-01) for $Z^-$, sulfonate ions such as a p-toluenesulfonate ion, a methanesulfonate ion, a benzenesulfonate ion, and a trifluoromethanesulfonate ion can be used.

The compound (b0-1) or (b0-2) may be a commercially available compound, or may be synthesized by using a conventional method.

There are no particular restrictions on the method of manufacturing the compound (b0-1). For example, a compound represented by the general formula (b0-1-11) shown below is reacted within an aqueous solution of an alkali metal hydroxide such as a sodium hydroxide or a lithium hydroxide in a solvent such as a tetrahydrofuran or water, thereby obtaining a compound represented by the general formula (b0-1-12) shown below, and then the compound represented by the general formula (b0-1-12) is dehydratively-condensed with an alcohol represented by the general formula (b0-1-13) shown below in the presence of an acid catalyst in an organic solvent such as benzene or dichloroethane, thereby obtaining a compound represented by the general formula (b0-1) in which m0 is 1 (that is, a compound represented by the general formula (b0-1-1) shown below).

[Chemical Formula 30]

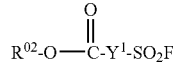
(b0-1-11)

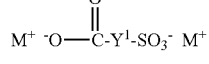
(b0-1-12)

(b0-1-13)

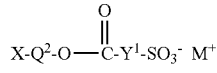
(b0-1-1)

(In the formulae, $R^{02}$ represents an alkyl group of 1 to 5 carbon atoms; and X, $Q^2$, $Y^1$, and $M^+$ are respectively the same as X, $Q^2$, $Y^1$, and $M^+$ in the formula (b0-1).)

Also, for example, silver fluoride, a compound represented by the general formula (b0-1-01) shown below, and a compound represented by a general formula (b0-1-02) shown below are reacted in an organic solvent such as anhydrous diglyme, thereby obtaining a compound represented by a general formula (b0-1-03) shown below, and then the compound represented by the general formula (b0-1-03) is reacted with an alkali metal hydroxide such as sodium hydroxide or lithium hydroxide in an organic solvent such as tetrahydrofuran, acetone, and methyl ethyl ketone, thereby obtaining a compound represented by the general formula (b0-1) in which m0 is 0 (that is, a compound represented by a general formula (b0-1-0) shown below).

The halogen atom for $X_h$ in the formula (b0-1-02) is preferably a bromine atom or a chlorine atom.

[Chemical Formula 31]

(b0-1-01)

(b0-1-02)

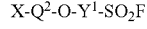
(b0-1-03)

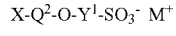
(b0-1-0)

(In the formulae, X, $Q^2$, $Y^1$, and $M^+$ are respectively the same as X, $Q^2$, $Y^1$, and $M^+$ in the formula (b0-1); and $X_h$ represents a halogen atom.)

The reaction of the compound (b0-1) with the compound (b0-2) can be performed, for example, by dissolving these compounds in a solvent such as water, dichloromethane, acetonitrile, methanol, chloroform, or methylene chloride, and stirring the solution thus obtained.

The reaction temperature is preferably 0 to 150° C., and more preferably 0 to 100° C. Usually, the reaction time is preferably 0.5 to 10 hours, and more preferably 1 to 5 hours, although it is different according to the reactivity of the compound (b0-1) and the compound (b0-2), the reaction temperature, and the like.

The amount of the compound (b0-2) used in the above reaction is usually 0.5 to 2 mol, relative to 1 mol of the compound (b0-1).

[Method of Manufacturing Compound Represented by General Formula (b1-2)]

The compound represented by the general formula (b1-2) can be manufactured by reacting a compound (b0-01) represented by the general formula (b0-01) shown below and a compound (b0-02) represented by the general formula (b0-02) shown below.

[Chemical Formula 32]

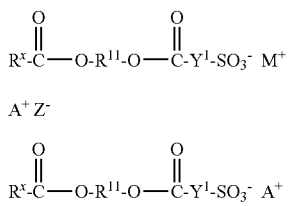

(In the formulae, $R^X$ represents an aliphatic group which may contain a substituent (wherein, the substituent excludes a nitrogen atom); $R^{11}$ represents an alkylene group; $Y^1$ represents a fluorinated alkylene group of 1 to 4 carbon atoms; $M^+$ represents an alkali metal ion; $A^+$ represents an organic cation; and $Z^-$ represents a non-nucleophilic anion.)

In the formulae, $R^X$, $R^{11}$, $Y^1$, $M^+$, $A^+$, and $Z^-$ are as defined above.

The compound represented by the general formula (b0-01) can be manufactured, for example, by reacting a compound (1-3) represented by the general formula (1-3) shown below and a compound (2-1) represented by the general formula (2-1) shown below.

[Chemical Formula 33]

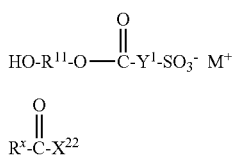

(In the formulae, $R^X$, $R^{11}$, $Y^1$ and $M^+$ are as defined above; and $X^{22}$ represents a halogen atom.)

Examples of the halogen atom for $X^{22}$ include a bromine atom, a chlorine atom, an iodine atom, and a fluorine atom. Of these, a bromine atom or a chlorine atom is preferable because it excels in reactivity, and a chlorine atom is particularly preferable.

As each of the compounds (1-3) and (2-1), a commercially available compound may be used, or each of the compounds may be synthesized to be used.

Examples of the preferable synthesis method for the compound (1-3) include a method containing the step of reacting a compound (1-1) represented by the general formula (1-1) shown below with a compound (1-2) represented by the general formula (1-2) shown below, thereby obtaining the compound (1-3).

[Chemical Formula 34]

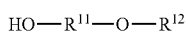

HO—$R^{11}$—O—$R^{12}$ (1-1)

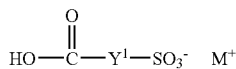

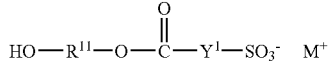

(In the formula, $R^{11}$, $Y^1$, and $M^+$ are as defined above; $R^{12}$ represents an aliphatic group which may contain an aromatic group as a substituent; and $M^+$ represents an alkali metal ion.)

Examples of $M^+$ include the same alkali metal ions as those described above for $M^+$.

In the above formula (1-1), $R^{12}$ represents an aliphatic group which may contain an aromatic group as a substituent.

The aliphatic group may be either a saturated aliphatic group or an unsaturated aliphatic group. Also, the aliphatic group may be linear, branched, or cyclic, or may be a combination thereof.

The aliphatic group may be either an aliphatic hydrocarbon group consisting of carbon atoms and hydrogen atoms, a group in which a part of the carbon atoms which constitute the above aliphatic hydrocarbon group are substituted with substituents containing a hetero atom, or a group in which a part or all of the hydrogen atoms which constitute the above aliphatic hydrocarbon group are substituted with substituents containing a hetero atom.

The hetero atom is not particularly restricted, as long as it is an atom other than a carbon atom and a hydrogen atom, and examples thereof include a halogen atom, an oxygen atom, a sulfur atom, and a nitrogen atom. Examples of the halogen atom include a fluorine atom, a chlorine atom, an iodine atom, and a bromine atom.

The substituent containing a hetero atom may consist of a hetero atom, or may be a group containing a group or an atom other than the hetero atom.

As the substituents which are substituted for a part of carbon atoms which constitute the above aliphatic hydrocarbon group, for example, a group of —O—, —(=O)—O—, —C(=O)—, —O—C(=O)—O—, —C(=O)—NH—, —NH— (wherein H may be substituted with a substitutent such as an alkyl group or an acyl group), —S—, —S(=O)$_2$—, or —S(=O)$_2$—O— can be used. If the aliphatic group contains a cyclic group, the above substituents may be included in a ring structure of the cyclic group.

Specific examples of the substituents which are substituted for a part or all of the hydrogen atoms which constitute the above aliphatic hydrocarbon group include an alkoxy group, a halogen atom, a halogenated alkyl group, a hydroxyl group, an oxygen atom (=O), —COOR$^{96}$, —OC(=O)R$^{97}$, and a cyano group.

The alkoxy group is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom include a fluorine atom, a chlorine atom, a bromine atom, and an iodine atom. Of these, a fluorine atom is preferable.

Examples of the halogenated alkyl group include a group in which a part or all of the hydrogen atom of an alkyl group of 1 to 5 carbon atoms, such as a methyl group, an ethyl group, a propyl group, an n-butyl group, and a tert-butyl group, are substituted with the halogen atoms.

$R^{96}$ and $R^{97}$ each independently represents a hydrogen atom, or a linear, branched or cyclic alkyl group of 1 to 15 carbon atoms.

When the alkyl group for $R^{96}$ and $R^{97}$ is linear or branched, the alkyl group preferably has 1 to 10 carbon atoms, more preferably 1 to 5 carbon atoms, and still more preferably 1 or 2. Specific examples thereof include the same linear or branched monovalent saturated hydrocarbon groups as those described below.

When the alkyl group for $R^{96}$ and $R^{97}$ is cyclic, the cyclic alkyl group may be monocyclic or polycyclic. The cyclic alkyl group preferably has 3 to 15 carbon atoms, more preferably 4 to 12 carbon atoms, and still more preferably 5 to 10 carbon atoms. Specific examples thereof include the same cyclic monovalent saturated hydrocarbon groups as those described below.

The aliphatic hydrocarbon group is preferably a linear or branched saturated hydrocarbon group of 1 to 30 carbon atoms, a monovalent unsaturated hydrocarbon group of 2 to 10 carbon atoms, or a cyclic aliphatic hydrocarbon group (aliphatic cyclic group) of 3 to 30 carbon atoms.

The linear saturated hydrocarbon group preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched saturated hydrocarbon group has preferably 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The unsaturated hydrocarbon group preferably has 2 to 5 carbon atoms, more preferably 2 to 4 carbon atoms, and still more preferably 3 carbon atoms. Examples of the linear monovalent unsaturated hydrocarbon group include a vinyl group, a propenyl group (allyl group) and a butynyl group. Examples of the branched monovalent unsaturated hydrocarbon group include a 1-methylpropenyl group and a 2-methylpropenyl group.

Of these, the unsaturated hydrocarbon group is particularly preferably a propenyl group.

The aliphatic cyclic group may be a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples thereof include groups in which one or more hydrogen atoms have been removed from a monocycloalkane; and groups in which one or more hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

In the above formula (1-1), the above aliphatic group for $R^{12}$ may contain an aromatic group as a substituent.

Examples of the aromatic group include: aryl groups in which one hydrogen atom has been eliminated from an aromatic hydrocarbon ring, such as a phenyl group, a biphenyl group, a fluorenyl group, a nathphyl group, an anthryl group, or a phenanthryl group; and heteroaryl groups in which a part of the carbon atoms which constitutes the ring(s) of the above-mentioned aryl groups are substituted with heteroatoms such as an oxygen atom, a sulfur atom, and a nitrogen atom.

These aromatic groups may contain substituents such as an alkyl group of 1 to 10 carbon atoms, a halogenated alkyl group, alkoxy group, a hydroxyl group, and a halogen atom. The alkyl group or halogenated alkyl group as the substituent group preferably has 1 to 8 carbon atoms, and more preferably 1 to 4 carbon atoms. Also, the halogenated alkyl group for the substituent group is preferably a fluorinated alkyl group. Examples of the halogen atom include a fluorine atom, a chlorine atom, an iodine atom, and a bromine atom. Of these, a fluorine atom is preferable.

Here, if $R^{12}$ within the compound (1-1) is an aromatic group, that is, if the oxygen atom adjacent to $R^{12}$ is directly bonded to the aromatic ring without involving an aliphatic group, the reaction of the compound (1-1) with the compound (1-2) does not make progress, and thus the compound (1-3) cannot be obtained.

As the compounds (1-1) and (1-2), a commercially available compound may be used, or the compounds (1-1) and (1-2) may be synthesized by using a conventional method.

For example, the compound (1-2) can be obtained by a method including steps of: heating a compound (0-1) represented by the general formula (0-1) shown below in the presence of an alkali, followed by neutralization, thereby obtaining a compound (0-2) represented by the general formula (0-2) shown below (hereinafter, referred to as "salt formation step"); and heating the above compound (0-2) in the presence of an acid which exhibits acidity stronger than the compound (1-2), thereby obtaining the compound (1-2) (hereinafter, referred to as "carboxylic acid-formation step").

[Chemical Formula 35]

(0-1)

(0-2)

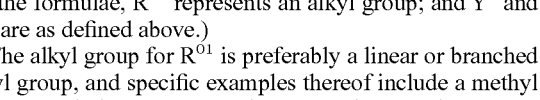

(1-2)

(In the formulae, $R^{01}$ represents an alkyl group; and $Y^1$ and $M^+$ are as defined above.)

The alkyl group for $R^{01}$ is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group, and a neopentyl group.

Of these, an alkyl group of 1 to 4 carbon atoms is preferable, and a methyl group is most preferable.

As the compound (0-1), a commercially available compound can be used.

The salt formation step can be performed, for example, by dissolving the compound (0-1) in a solvent, adding an alkali to the resulting solution, and heating it.

The solvent is not particularly restricted as long as it can dissolve the compound (0-1), and examples thereof include water and tetrahydrofuran.

As the alkali, an alkali corresponding to M in the formula (0-2) is used, and examples thereof include alkali metal hydroxides such as sodium hydroxide, potassium hydroxide, and lithium hydroxide.

The amount of the alkali used is preferably 1 to 5 mol, and more preferably 2 to 4 mol, relative to 1 mol of the compound (0-1).

The heating temperature is preferably approximately 20 to 120° C., and more preferably approximately 50 to 100° C. Typically, the heating time is preferably 0.5 to 12 hours, and more preferably 1 to 5 hours, although it differs depending on conditions such as the heating temperature.

The neutralization after the above heating treatment can be performed by adding an acid such as hydrochloric acid, sulfuric acid, or p-toluenesulfonic acid to the reaction solution after the above heating treatment.

Here, it is preferable that the neutralization be performed so that the reaction solution after addition of the acid has a pH of 6 to 8 (25° C.). Also, the temperature of the reaction solution in the neutralization treatment is preferably 20 to 30° C., and more preferably 23 to 27° C.

After the reaction, the compound (0-2) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

In the carboxylic acid-formation step, the compound (1-2) can be obtained by heating the compound (0-2) obtained by the above salt formation step in the presence of an acid which exhibits acidity stronger than the compound (1-2).

The expression "an acid which exhibits acidity stronger than the compound (1-2)" means an acid which has a value of pKa (25° C.) smaller than —COOH within the compound (1-2). Hereinafter, "an acid which exhibits acidity stronger than the compound (1-2)" is sometimes referred to "strong acid" to simplify the description. By using such a strong acid, —COO$^-$M$^+$ within the compound (0-2) is changed to —COOH, thereby obtaining the compound (1-2).

As the strong acid, any of acids which has a value of pKa smaller than pKa of —COOH within the compound (1-2), arbitrarily selected from conventional acids. may be used. pKa of —COOH within the compound (1-2) can be determined by using a conventional titration method.

Specific examples of the strong acid include sulfonic acids such as aryl sulfonic acid and alkyl sulfonic acid, sulfuric acid, and hydrochloric acid. Examples of the aryl sulfonic acid include p-toluenesulfonic acid. Examples of the alkyl sulfonic acid include methane sulfonic acid and trifluoromethane sulfonic acid. The strong acid is particularly preferably p-toluenesulfonic acid, because it can be easily dissolved in an organic solvent and can be easily purified.

The carboxylic acid-formation step can be performed, for example, by dissolving the compound (0-2) in a solvent, adding an acid thereto, and heating the resulting solution.

The solvent is not particularly restricted as long as it can dissolve the compound (0-2), and examples thereof include acetonitrile and methyl etheyl ketone.

The amount of the strong acid used is preferably 0.5 to 3 mol, and more preferably 1 to 2 mol, relative to 1 mol of the compound (0-2).

The heating temperature is preferably approximately 20 to 150° C., and more preferably approximately 50 to 120° C. Typically, the heating time is preferably 0.5 to 12 hours, and more preferably 1 to 5 hours, although it differs depending on conditions such as the heating temperature.

After the reaction, the compound (1-2) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

There are no particular restrictions on the method of reacting the compounds (1-3) and (2-1), and examples thereof include a method of contacting the compound (1-3) with the compound (2-1) in a reaction solvent. This method can be performed, for example, by adding the compound (2-1) to the solution in which the compound (1-3) is dissolved in a reaction solvent in the presence of a base.

There are no particular restrictions on the reaction solvent as long as it can dissolve the compounds (1-3) and (2-1) as the materials, and examples of the reaction solvent include tetrahydrofuran (THF), acetone, dimethylformamide (DMF), dimethylacetoamide, dimethylsulfoxide (DMSO), and acetonitrile.

Examples of the base include organic bases such as triethylamine, 4-dimethylaminopyridine (DMAP), and pyridine; and inorganic bases such as sodium hydroxide, K$_2$CO$_3$, and Cs$_2$CO$_3$.

The additive amount of the compound (2-1) is preferably 1 to 3 equivalent, and more preferably 1 to 2 equivalent, based on the compound (1-3).

The reaction temperature is preferably −20 to 40° C., and more preferably 0 to 30° C. The reaction time is typically preferably 1 to 120 hours, and more preferably 1 to 48 hours, although it is different according to the reactivity of the compound (1-3) and the compound (2-1), the reaction temperature, and the like.

The reaction of the compounds (b0-01) and (b0-02) can be performed using conventional salt substitution methods. For example, the compounds (b0-01) and (b0-02) can be reacted by dissolving the compounds in a solvent such as water, dichloromethane, acetonitrile, methanol, or chloroform and then stirring them.

The reaction temperature is preferably 0 to 150° C., and more preferably 0 to 100° C. Usually, the reaction time is preferably 0.5 to 10 hours, and more preferably 1 to 5 hours, although it is different according to the reactivity of the compound (b0-01) and the compound (b0-02), the reaction temperature, and the like.

After the reaction, the compound (b-1) in the reaction solution may be isolated and purified. Conventional methods can be used for the isolation and purification, and for example, concentration, solvent extraction, distillation, crystallization, recrystallization, chromatography, or the like can be used alone, or two or more types can be used in combination.

The structure of the compound (b1-1) obtained by the above method can be confirmed by general organic analysis methods such as a $^1$H-nuclear magnetic resonance (NMR) spectrum method, a $^{13}$C-NMR spectrum method, a $^{19}$F-NMR spectrum method, an infrared resonance (IR) spectrum method, a mass spectrometry (MS) method, an element analysis method, and an X-ray crystallographic analysis method.

[Component (B2)]

The resist composition of the present invention may include an acid generator (hereinafter, referred to as "component (B2)") other than the above component (B1) as the component (B), if required.

As the component (B2), there are no particular limitations as long as it is an acid generator other than the component (B1), and any of the known acid generators used in conventional chemically-amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, for example, an acid generator represented by a general formula (b-1) or (b-2) shown below can be used.

[Chemical Formula 36]

$$R^{2''}-\overset{R^{1''}}{\underset{R^{3''}}{S^+}} \quad R^{4''}SO_3^-  \quad (b\text{-}1)$$

$$\overset{R^{5''}}{\underset{R^{6''}}{>}}I^+ \quad R^{4''}SO_3^- \quad (b\text{-}2)$$

(In the formula (b-1), $R^{1''}$ to $R^{3''}$ each independently represents an aryl group which may contain a substituent, or an alkyl group which may contain a substituent; at least one of $R^{1''}$ to $R^{3''}$ represents an aryl group; and two of $R^{1''}$ to $R^{3''}$ may be bonded to each other to form a ring together with the sulfur atom within the formula. In the formula (b-2), $R^{5''}$ and $R^{6''}$ each independently represents an aryl group which may contain a substituent, or an alkyl group which may contain a substituent; and at least one of $R^{5''}$ and $R^{6''}$ represents an aryl group. In the formulae (b-1) and (b-2), $R^{4''}$ represents a linear, branched, or cyclic alkyl group or a linear, branched, or cyclic fluorinated alkyl group.)

In the formula (b-1), $R^{1''}$ to $R^{3''}$ are respectively the same as $R^{1+}$ to $R^{3''}$ in the above formula (I-1).

In the formula (b-2), $R^{5''}$ and $R^{6''}$ are respectively the same as $R^{5''}$ and $R^{6''}$ in the above formula (I-2).

In the formula (b-1), $R^{4''}$ represents a linear, branched or cyclic alkyl group, or a linear, branched or cyclic fluorinated alkyl group.

The number of carbon atoms within the linear or branched alkyl group for $R^{4''}$ is preferably 1 to 10, more preferably 1 to 8, and most preferably 1 to 4.

Examples of the cyclic alkyl group for $R^{4''}$ include the same cyclic groups as those described above in $R^{1''}$. The number of carbon atoms within the cyclic alkyl group for $R^{4''}$ is preferably 4 to 15, more preferably 4 to 10, and most preferably 6 to 10.

The number of carbon atoms within the fluorinated alkyl group is preferably 1 to 10, more preferably 1 to 8, and most preferably 1 to 4.

Furthermore, the fluorination rate of the fluorinated alkyl group (proportion of fluorine atoms in the alkyl group) is preferably within a range from 10 to 100%, more preferably from 50 to 100%, and those wherein all hydrogen atoms are substituted with fluorine atoms (perfluoroalkyl groups) are particularly preferable, because the strength of the acid increases.

$R^{4''}$ is most preferably a linear or cyclic alkyl group, or a linear or cyclic fluorinated alkyl group.

$R^{4''}$ in the general formula (b-2) is the same as those described for $R^{4''}$ in the general formula (b-1) shown above.

Specific examples of onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Further, an onium salt-based acid generator in which the anion moiety in the general formula (b-1) or (b-2) is substituted with an anion moiety represented by the general formula (b-3) or (b-4) shown below can also be used. Here, the cation moiety is the same as those described in the general formula (b-1) or (b-2).

[Chemical Formula 37]

(b-3)

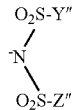
(b-4)

(In the formula, X" represents an alkylene group of 2 to 6 carbon atoms in which at least one hydrogen atom is substituted with a fluorine atom; and Y" and Z" each independently represents an alkyl group of 1 to 10 carbon atoms in which at least one hydrogen atom is substituted with a fluorine atom.)

X" represents a linear or branched alkylene group in which at least one hydrogen atom is substituted with a fluorine atom. The number of carbon atoms of the alkylene group for X" is 2 to 6, preferably 3 to 5, and most preferably 3.

Y" and Z" each independently represents a linear or branched alkyl group in which at least one hydrogen atom is substituted with a fluorine atom. The number of carbon atoms of the alkyl group for Y" and Z" is 1 to 10, preferably 1 to 7, and more preferably 1 to 3.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The proportion of fluorine atoms in the alkylene group or alkyl group, that is, the fluorination rate, is preferably within the range of 70 to 100%, and more preferably 90 to 100%. A perfluoroalkylene group or a perfluoroalkyl group wherein all hydrogen atoms are substituted with fluorine atoms is most preferable.

Also, onium salt-based acid generators can be used in which the cation moiety is a cation represented by the above general formula (I-5) or (I-6), and the anion moiety is a fluorinated alkylsulfonate ion such as the anion moiety ($R^{4''}SO_3^-$) within the onium salt-based acid generator represented by the general formula (b-1) or (b-2), or an anion moiety represented by the above general formula (b-3) or (b-4). Of these, such an anion moiety is preferably a fluorinated alkylsulfonate ion, more preferably a fluorinated alkylsulfonate ion of 1 to 4 carbon atoms, and still more preferably a linear perfluoroalkylsulfonate ion of 1 to 4 carbon atoms. Specific examples thereof include a trifluoromethylsulfonate ion, a heptafluoro-n-propylsulfonate ion, and a nonafluoro-n-butylsulfonate ion.

In the present specification, the term "oxime sulfonate-based acid generator" means a compound which has at least one of the groups represented by the general formula (B-1) shown below, and has a property that generates an acid upon exposure to radiation. These kinds of oxime sulfonate-based acid generators are widely used for a chemically-amplified resist composition, so any oxime sulfonate-based acid generator, arbitrarily selecting from these, can be used.

[Chemical Formula 38]

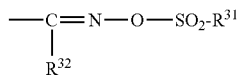
(B-1)

(In the general formula (B-1), $R^{31}$ and $R^{32}$ each independently represents an organic group.)

The organic group for $R^{31}$ or $R^{32}$ is a group containing carbon atoms, and may further contain atoms other than carbon atoms (for example, a hydrogen atom, an oxygen atom, a nitrogen atom, a sulfur atom and a halogen atom (a fluorine atom, a chlorine atom and the like)).

The organic group for $R^{31}$ is preferably a linear, branched or cyclic alkyl group or an aryl group. The alkyl group or aryl group may contain a substituent. There are no particular restrictions on the substituent, and examples thereof include a fluorine atom, and a linear, branched or cyclic alkyl group of 1 to 6 carbon atoms. Here, the term "containing a substituent" means that a part or all of the hydrogen atoms in the alkyl group or aryl group are substituted with substituent groups.

The alkyl group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. The alkyl group for $R^{31}$ is particularly preferably an alkyl group which is partially or completely halogenated (hereinafter, sometimes referred to as a halogenated alkyl group). Here, a partially halogenated alkyl group means an alkyl group in which a part of the hydrogen atoms are substituted with halogen atoms, and a completely halogenated alkyl group means an alkyl group in which all of the hydrogen atoms are substituted with halogen atoms. Examples of the halogen atoms include a fluorine atom, a chlorine atom, a bromine atom and an iodine atom. Of these, a fluorine atom is preferable. That is, the halogenated alkyl group is preferably a fluorinated alkyl group.

The aryl group for $R^{31}$ preferably has 4 to 20 carbon atoms, more preferably 4 to 10 carbon atoms, and most preferably 6 to 10 carbon atoms. The aryl group is particularly preferably an aryl group which is partially or completely halogenated. Here, a partially halogenated aryl group means an aryl group in which a part of the hydrogen atoms are substituted with halogen atoms, and a completely halogenated aryl group means an aryl group in which all of the hydrogen atoms are substituted with halogen atoms.

$R^{31}$ is particularly preferably an alkyl group of 1 to 4 carbon atoms containing no substituent, or a fluorinated alkyl group of 1 to 4 carbon atoms.

The organic group for $R^{32}$ is preferably a linear, branched or cyclic alkyl group, an aryl group, or a cyano group. As the alkyl group or the aryl group for $R^{32}$, the same alkyl groups or aryl groups as those described above for $R^{31}$ can be used.

$R^{32}$ is particularly preferably a cyano group, an alkyl group of 1 to 8 carbon atoms containing no substituent, or a fluorinated alkyl group of 1 to 8 carbon atoms.

Preferred examples of the oxime sulfonate-based acid generator include compounds represented by the general formula (B-2) or (B-3) shown below.

[Chemical Formula 39]

(B-2)

(In the general formula (B-2), $R^{33}$ represents a cyano group, an alkyl group containing no substituent, or a halogenated alkyl group; $R^{34}$ represents an aryl group; and $R^{35}$ represents an alkyl group containing no substituent, or a halogenated alkyl group.)

[Chemical Formula 40]

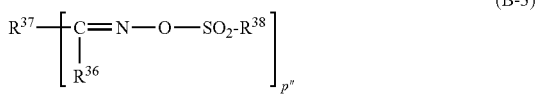

(B-3)

(In the general formula (B-3), $R^{36}$ represents a cyano group, an alkyl group containing no substituent, or a halogenated alkyl group; $R^{37}$ represents a bivalent or trivalent aromatic hydrocarbon group; $R^{38}$ represents an alkyl group containing no substituent, or a halogenated alkyl group; and p″ represents an integer of 2 or 3.)

In the general formula (B-2), the number of carbon atoms of the alkyl group containing no substituent or the halogenated alkyl group for $R^{33}$ is preferably 1 to 10, more preferably 1 to 8, and most preferably 1 to 6.

$R^{33}$ is preferably a halogenated alkyl group, and more preferably a fluorinated alkyl group.

The fluorinated alkyl group for $R^{33}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group; and heteroaryl groups in which a part of the carbon atoms which constitute the rings of these groups are substituted with heteroatoms such as an oxygen atom, a sulfur atom, and a nitrogen atom. Of these, a fluorenyl group is preferable.

The aryl group for $R^{34}$ may contain a substituent such as an alkyl group of 1 to 10 carbon atoms, a halogenated alkyl group of 1 to 10 carbon atoms, and an alkoxy group of 1 to 10 carbon atoms. The alkyl group or halogenated alkyl group for the aforementioned substituent preferably has 1 to 8 carbon atoms, and more preferably 1 to 4 carbon atoms. Also, the halogenated alkyl group for the substituent is preferably a fluorinated alkyl group.

The alkyl group containing no substituent or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

The fluorinated alkyl group for $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group for $R^{35}$ is most preferably a completely fluorinated alkyl group in which 100% of the hydrogen atoms are substituted with fluorine atoms.

In the general formula (B-3), as the alkyl group containing no substituent or the halogenated alkyl group for $R^{36}$, the same alkyl groups containing no substituent or halogenated alkyl groups as those described above for $R^{33}$ can be used.

Examples of the bivalent or trivalent aromatic hydrocarbon group for $R^{37}$ include aryl groups for $R^{34}$ in which one or two hydrogen atoms are further removed.

As the alkyl group containing no substituent or the halogenated alkyl group for $R^{38}$, the same alkyl groups containing no substituent or halogenated alkyl groups as those described above in $R^{35}$ can be used.

p″ is preferably 2.

Specific examples of the oxime sulfonate-based acid generator include

α-(p-toluenesulfonyloxyimino)-benzylcyanide,
α-(p-chlorobenzenesulfonyloxyimino)-benzylcyanide,
α-(4-nitrobenzenesulfonyloxyimino)-benzylcyanide,
α-(4-nitro-2-trifluoromethylbenzenesulfonyloxyimino)-benzylcyanide,
α-(benzenesulfonyloxyimino)-4-chlorobenzylcyanide,
α-(benzenesulfonyloxyimino)-2,4-dichlorobenzylcyanide,
α-(benzenesulfonyloxyimino)-2,6-dichlorobenzylcyanide,
α-(benzenesulfonyloxyimino)-4-methoxybenzylcyanide,
α-(2-chlorobenzenesulfonyloxyimino)-4-methoxybenzylcyanide,
α-(benzenesulfonyloxyimino)-thien-2-ylacetonitrile,
α-(4-dodecylbenzenesulfonyloxyimino)-benzylcyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxyimino)-1-cyclohexenylacetonitrile,
α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile,
α-(trifluoromethylsulfonyloxyimino)-cyclohexylacetonitrile,
α-(ethylsulfonyloxyimino)-ethylacetonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimino)-phenylacetonitrile,
α-(trifluoromethylsulfonyloxyimino)-p-methoxyphenylacetonitrile,
α-(ethylsulfonyloxyimino)-p-methoxyphenylacetonitrile,
α-(propylsulfonyloxyimino)-p-methylphenylacetonitrile,
and
α-(methylsulfonyloxyimino)-p-bromophenylacetonitrile.

Also, oxime sulfonate-based acid generators disclosed in Japanese Unexamined Patent Application, First Publication No. Hei9-208554 ([Formula 18] and [Formula 19] in paragraphs [0012] to [0014]), and International Publication WO 2004/074242 (Examples 1 to 40 on pages 65 to 85) can be preferably used.

Further, suitable examples thereof include the following.

[Chemical Formula 41]

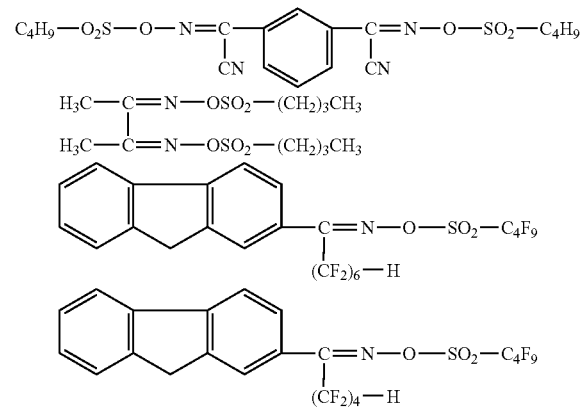

Among the diazomethane-based acid generators, specific examples of bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei11-035551, Japanese Unexamined Patent Application, First Publication No. Hei11-035552, and Japanese Unexamined Patent Application, First Publication No. Hei11-035573 can be preferably used.

Examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei11-322707.

As the component (B2), one kind selected from the above acid generators may be used alone, or two or more kinds may be used in combination.

The total amount of the entire component (B) in the positive resist composition of the present invention is preferably within the range of 0.5 to 30 parts by weight, and more preferably 1 to 10 parts by weight, relative to 100 parts by weight of the component (A). When the amount is within the range, a pattern can be sufficiently formed. Also, a uniform solution and excellent storage stability can be obtained. Therefore, an amount within the above range is preferable.
<Optional Components>
[Component (D)]

In order to improve the resist pattern shape and the post exposure stability of the latent image formed by the pattern-wise exposure of the resist layer, the resist composition of the present invention preferably further includes a nitrogen-containing organic compound component (D) (hereinafter, referred to as component (D)) as an optional component.

Since a multitude of these components (D) have already been proposed, any of these known compounds can be used. Of these, a cyclic amine or an aliphatic amine, particularly a secondary aliphatic amine or tertiary aliphatic amine is preferred. Here, the aliphatic amine means an amine containing at least one aliphatic group, and the aliphatic group preferably has 1 to 12 carbon atoms.

Examples of the aliphatic amine include an amine (alkylamine or alkylalcoholamine) wherein at least one of the hydrogen atoms of $NH_3$ is substituted with an alkyl or hydroxyalkyl group having 12 or less carbon atoms. Specific examples thereof include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamines such as diethanolamine, triethanolamine, diisopropanolamine, triisopropanolamine, di-n-octanolamine, and tri-n-octanolamine.

Among these amines, alkyl alcoholamines or trialkylamines are preferable, and alkyl alcoholamines are most preferable. Of the alkyl alcoholamines, triethanolamine or triisopropanolamine is most preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amines include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These may be used either alone, or in combination of two or more different compounds.

The component (D) is typically used in a quantity within the range of 0.01 to 5.0 parts by weight, relative to 100 parts by weight of the component (A).
[Component (E)]

In the positive resist composition of the present invention, in order to prevent any deterioration in sensitivity, and improve the resist pattern shape and the post exposure stability of the latent image formed by the pattern-wise exposure of the resist layer, at least one compound (E) selected from the group consisting of organic carboxylic acids and phosphorus oxo acids or derivatives thereof (hereinafter, referred to as component (E)) can also be added as an optional component.

Suitable examples of organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly preferable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic esters such as phenylphosphinic acid.

As the component (E), one type may be used alone, or two or more types may be used in combination.

As the component (E), an organic carboxylic acid is preferable, and salicylic acid is particularly preferable.

The component (E) is used in a quantity within the range of 0.01 to 5.0 parts by weight, relative to 100 parts by weight of the component (A).

In the positive resist composition of the present invention, in order to improve the coatability, a polyvinyl ether compound with cross-linking performance can be included.

The polyvinyl ether compound with cross-linking performance is a compound which contains a vinyl ether group in which the oxygen atom of a vinyloxy group ($CH_2$=CH—O—) is bonded to a carbon atom. Specific examples thereof include monovinyl ethers or divinyl ethers of ethylene glycol, diethylene glycol, triethylene glycol, 1,4-butanediol, tetramethylene glycol, tetraethylene glycol, neopentyl glycol, hexanediol, 1,4-cyclohexanediol, pentaerythritol, and cyclohexanedimethanol. Of these, a compound containing a ring skeleton such as the compound represented by the formula shown below (cyclohexanedimethanol monovinyl ether: CHMVE) can be mentioned as an preferable example.

[Chemical Formula 42]

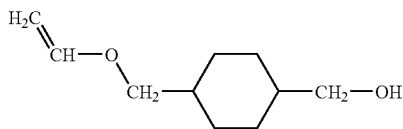

As the polyvinyl ether compound with cross-linking performance, one type may be used alone, or two or more may be used in combination.

The proportion of the polyvinyl ether compound with cross-linking performance is typically within the range of 0.1 to 10 parts by weight, relative to 100 parts by weight of the component (A).

In the positive resist composition of the present invention, if desired, additives having miscibility, for example, additive resins for improving performance of a resist film, surfactants for improving coatability, dissolution inhibitors, plasticizers, stabilizers, colorants, antihalation agents, and dyes can be appropriately added.

[Component (S)]

The positive resist composition of the present invention can be prepared by dissolving materials in an organic solvent (hereinafter, referred to as component (S)).

The component (S) may be an organic solvent which can dissolve the respective components used in the present invention to give a uniform solution, and one or more kinds of organic solvents can be used, appropriately selected from those which have been conventionally known as a solvent for a chemically-amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, dipropylene glycol; derivatives of the polyhydric alcohols, including compounds having ester bonds such as ethylene glycol monoacetate, diethylene glycol monoacetate, propylene glycol monoacetate and dipropylene glycol monoacetate, and compounds having ether bonds such as monoalkyl ethers (for example, monomethyl ether, monoethyl ether, monopropyl ether and monobutyl ether) and monophenyl ether of the above polyhydric alcohols or the above compounds having ester bonds (of these, propylene glycol monomethyl ether acetate (PGMEA) or propylene glycol monomethyl ether (PGME) is preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene, and mesitylene.

These organic solvents may be used either alone, or may be used as a mixed solvent of two or more different solvents.

Of these, propylene glycol monomethyl ether acetate (PGMEA), propylene glycol monomethyl ether (PGME) or EL is preferable.

Also, a mixed solvent obtained by mixing PGMEA and a polar solvent is preferable. The mixing ratio (mass ratio) of PGMEA to the polar solvent may be appropriately decided taking account of compatibility, and is preferably adjusted within the range of 1:9 to 9:1, and more preferably 2:8 to 8:2.

More specifically, in the case of using EL as the polar solvent, the mass ratio PGMEA:EL is preferably within the range of 1:9 to 9:1, and more preferably 2:8 to 8:2. Furthermore, in those cases of using PGME as the polar solvent, the mass ratio PGMEA:PGME is preferably within the range of 1:9 to 9:1, more preferably 2:8 to 8:2, and still more preferably 3:7 to 7:3.

Furthermore, as the component (S), mixed solvents of at least one of PGMEA and EL with γ-butyrolactone are also preferred. In such cases, the mass ratio of the former and latter components in the mixed solvents is preferably within a range from 70:30 to 95:5.

There are no particular restrictions on the quantity of the component (S), and the quantity should be set in accordance with the required coating film thickness within a concentration that enables favorable application of the solution to a substrate or the like. Typically, the quantity is set so that the solid fraction concentration within the resist composition falls within the range of 2 to 20% by weight, and still more preferably 5 to 15% by weight.

The positive resist composition of the present invention has an effect that the variation in the resist pattern size accompanied by the variation (fluctuation) in the exposure dose is small (that is, EL margin is large). Although the reason is not clear, it can be speculated about as follows.

The positive resist composition of the present invention includes the resin component (A) which contains the structural unit (a1) derived from a hydroxystyrene and the structural unit (a2) containing an acid dissociable, dissolution inhibiting group. By containing the structural unit (a1), solubility of the component (A) in an alkali developing solution can be improved. Also, an acid dissociable, dissolution inhibiting group in the structural unit (a2) dissociates under action of an acid, therefore the entire component (A) increases solubility in an alkali developing solution.

Furthermore, the positive resist composition of the present invention includes the acid generator (B1) consisting of a compound represented by the above general formula (b1). The component (B1) contains a substituent having an oxygen atom within the anion moiety, and thus has a higher polarity and a sterically-bulky structure, when compared with anion moieties of conventional acid generators such as nonafluorobutane sulfonate. Accordingly, in the component (B1), the diffusion of the acid (anion moiety) generated upon exposure in the resist film is suppressed chemically and physically, and the component (B1) has a small diffusion length, as compared with conventional acid generators.

By using the components (A) and (B1) in combination, even if exposure dose slightly varies (fluctuates), the composition is less affected by the acid generated from the component (B1), and solubility of the entire component (A) in an alkali developing solution is not greatly changed. Therefore, it is speculated that the variation in the resist pattern size accompanied by the variation in the exposure dose is small (that is, EL margin is large).

Also, the positive resist composition of the present invention can form a resist pattern with an excellent shape, and obtain excellent lithography properties. The reason can be speculated about as follows.

The component (B1) generates an acid which exhibits strong acidity upon exposure. Accordingly, an acid dissociable, dissolution inhibiting group within the above structural unit (a2) can be readily dissociated, and also the structural unit (a1) has good solubility in an alkali developing solution, therefore resolution can be improved.

Further, it is thought that the component (B1) can be readily distributed uniformly in a resist film, when the resist film is formed. Furthermore, as described above, the diffusion of the acid generated in the exposed region toward the non-exposed region within the resist film can be markedly suppressed.

For these reasons, it is speculated that, since the difference of solubility (solubility contrast) between non-exposed region and exposed region in an alkali developing solution is satisfactorily large in the resist composition, a resist pattern with an excellent shape can be formed, and excellent lithography properties (for example, mask error factor (MEF), depth of focus (DOF), proximity (proximity effect), and line width roughness (LWR)) can be obtained.

The MEF is a parameter that indicates how faithfully mask patterns of differing line widths or hole diameters can be reproduced by using the same exposure dose with fixed pitch (i.e., mask reproducibility). The closer the MEF value is to 1, the better the mask reproducibility.

The "DOF" is the range of depth of focus in which a resist pattern can be formed with a size where deviations relative to the target size are kept within the prescribed range when exposure is conducted moving the exposure focus upwardly or downwardly with the same exposure dose, i.e., the range in which a resist pattern faithful to the mask pattern can be obtained. A larger DOF is more preferable.

The "proximity (proximity effect)" is a parameter which indicates the degree to which a resist pattern size formed with a fixed mask size is affected by the change of a pitch. The smaller the value of proximity effect, the more process margin is improved.

The "LWR" means unevenness of the line width of a line pattern when a resist pattern is formed, and the improvent in the level of LWR becomes more important issue as a pattern miniaturization progresses.

<<Method of Forming Resist Pattern>>

The method of forming a resist pattern of the present invention includes: forming a resist film on a substrate using the positive resist composition of the present invention described above, exposing the resist film, and developing the resist film to form a resist pattern.

The method of forming a resist pattern of the present invention can be performed, for example, in the following manner.

Namely, the positive resist composition described above is first applied to a substrate using a spinner or the like, a prebake (post applied bake (PAB)) is then conducted under temperature conditions of 80 to 150° C. for 40 to 120 seconds, preferably for 60 to 90 seconds, followed by selective exposure of the thus obtained film with a KrF exposure apparatus or the like, by irradiating KrF excimer laser light through a desired mask pattern, and then PEB (post exposure baking) is conducted under temperature conditions of 80 to 150° C. for 40 to 120 seconds, preferably for 60 to 90 seconds. Subsequently, a developing treatment is conducted using an alkali developing solution such as 0.1 to 10% by weight aqueous solution of tetramethylammonium hydroxide (TMAH), and a water rinse treatment is preferably conducted using pure water, and then a drying treatment is performed. Also, according to circumstances, a bake treatment (post bake) may be conducted after the above developing treatment. In this manner, a resist pattern that is faithful to the mask pattern can be obtained.

The substrate is not specifically limited and a conventionally known substrate can be used. For example, substrates for electronic components, and such substrates having prescribed wiring patterns formed thereon can be used. Specific examples thereof include a silicon wafer; a substrate made of a metal such as copper, chromium, iron and aluminum; and a substrate made of glass. As materials for the wiring pattern, for example, copper, aluminum, nickel and gold can be used.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic anti-reflection film (organic BARC) can be used.

There are no particular restrictions on the wavelength used for the exposure, and the exposure can be conducted using radiation such as ArF excimer lasers, KrF excimer lasers, $F_2$ excimer lasers, extreme ultraviolet rays (EUV), vacuum ultraviolet rays (VUV), electron beams (EB), X-rays, and soft X-rays. The positive resist composition is effective for use with KrF excimer lasers, ArF excimer lasers, electron beam (EB), or extreme ultra violet (EUV), and particularly effective for use with KrF excimer lasers.

The exposure of the resist film may be a usual exposure (dry exposure) conducted in air or an inactive gas such as nitrogen gas, or may be an immersion exposure (liquid immersion lithography).

As described above, the immersion exposure is conducted under the condition where the region between a lens and a resist film on a wafer, which has conventionally been filled with air or an inactive gas, is filled with a solvent (immersion solvent) that has a larger refractive index than the refractive index of air.

More specifically, the immersion exposure is performed in the following manner. First, the region between the resist film obtained in the above manner and the lens at the lowermost point of the exposure apparatus is pre-filled with a solvent (immersion solvent) that has a larger refractive index than the refractive index of air, and then, while maintaining such a condition, the exposure (immersion exposure) is conducted through the desired mask pattern.

The immersion solvent is preferably a solvent that has a refractive index larger than the refractive index of air but smaller than the refractive index of the resist film exposed by the immersion exposure. There are no particular restrictions on the refractive index of the immersion solvent, as long as the solvent has a refractive index within the above range.

Examples of the solvent which has a refractive index larger than that of air but smaller than that of a resist film include water, a fluorine-based inactive liquid, a silicon-based solvent, and a hydrocarbon-based solvent.

Specific examples of the fluorine-based inactive liquid include a liquid which has a fluorine-based compound as a main component, such as $C_3HCl_2F_5$, $C_4F_9OCH_3$, $C_4F_9OC_2H_5$, and $C_5H_3F_7$. The fluorine-based inactive liquid preferably has a boiling point within the range of 70 to 180° C., and more preferably 80 to 160° C. If the fluorine-based inactive liquid has a boiling point within the above range, the solvent used for the immersion lithography can be removed by a convenient method after exposure, and consequently it is preferable.

The fluorine-based inactive liquid is particularly preferably a perfluoroalkyl compound in which all hydrogen atoms of the alkyl groups are substituted with fluorine atoms. Examples of the perfluoroalkyl compounds include perfluoroalkylether compounds and perfluoroalkylamine compounds.

Specific examples of the perfluoroalkylether compounds include a perfluoro(2-butyl-tetrahydrofuran) (boiling point: 102° C.), and specific examples of the perfluoroalkylamine compounds include a perfluorotributylamine (boiling point: 174° C.).

EXAMPLES

Next, the present invention will be described in more detail with reference to examples, but the scope of the present invention is not limited to the following examples.

<Synthesis of Acid Generator Component (B)>

In the Examples, acid generators (B)-4 to (B)-7 used as the component (B) were obtained through the following Synthesis Examples.

Synthesis Example 1

Synthesis of Acid Generator (B)-4

343.6 g of a 30% aqueous solution of sodium hydroxide was dropwise added to 150 g of methyl fluorosulfonyl(difluoro)acetate and 375 g of pure water while maintaining the temperature at 10° C. or lower in an ice bath. Then, the resultant was refluxed at 100° C. for 3 hours, followed by cooling and neutralizing with concentrated hydrochloric acid. The resulting solution was dropwise added to 8,888 g of acetone, and the precipitate was collected by filtration and dried, thereby obtaining 184.5 g of the compound (I) shown below in the form of a white solid (purity: 88.9%, yield: 95.5%).

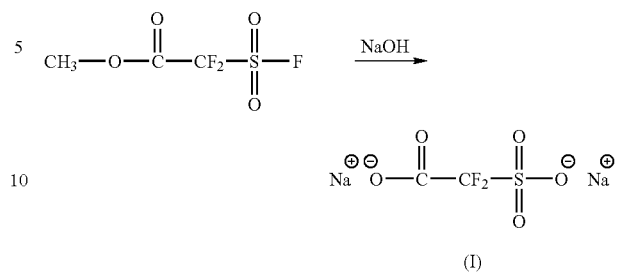

Subsequently, 56.2 g of the compound (I) and 562.2 g of acetonitrile were prepared, and 77.4 g of p-toluenesulfonic acid monohydrate were added thereto. Then, the resultant solution was refluxed for three hours at 110° C. Then, the solution was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of the compound (II) shown below in the form of a white solid (purity: 91.0%, yield: 44.9%).

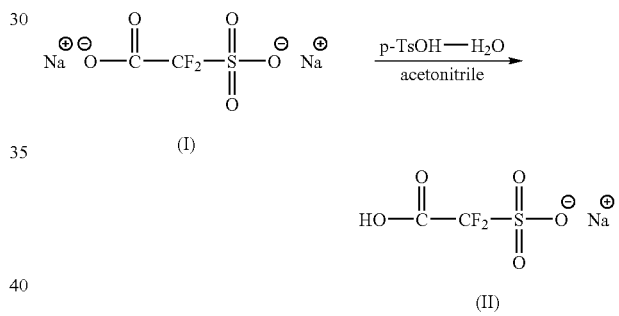

Subsequently, 4.34 g of the compound (II) (purity: 94.1%), 3.14 g of 2-benzyloxyethanol, and 43.4 g of toluene were prepared, and 0.47 g of p-toluenesulfonic acid monohydrate was added thereto. The resultant solution was then refluxed for 20 hours at 105° C. The reaction solution was filtrated, and 20 g of hexane was added to the residue. Then, the resultant was stirred. The resultant was filtrated once more, and the residue was dried, thereby obtaining 1.41 g of the compound (V) shown below (yield: 43.1%).

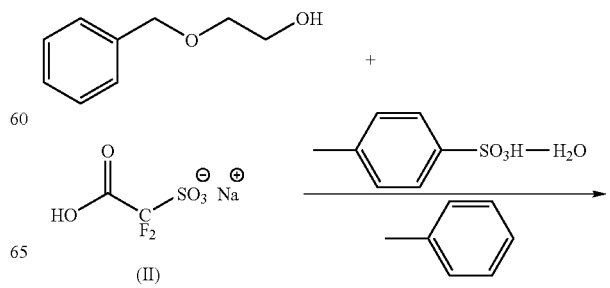

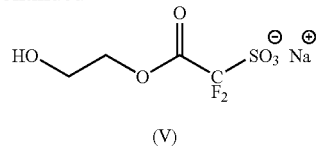

(V)

$^1$H-NMR (DMSO-d6, 400 MHz): δ (ppm)=4.74-4.83 (t, 1H, OH), 4.18-4.22 (t, 2H, H$^a$), 3.59-3.64 (q, 2H, H$^b$).

$^{19}$F-NMR (DMSO-d6, 376 MHz): δ (ppm)=−106.6.

From the results described above, it could be confirmed that the compound (V) had the structure shown below.

[Chemical Formula 46]

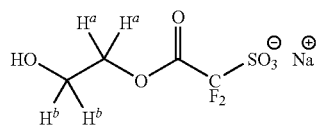

Subsequently, 0.82 g of 1-adamantanecarbonyl chloride and 0.397 g of triethylamine were dropwide added to 1.00 g of the compound (V) and 3.00 g of acetonitrile in an ice bath. After the dropwise addition, the solution was stirred for 20 hours at room temperature, and then filtrated. The filtrate was concentrated and dried, then dissolved in 30 g of dichloromethane, and washed with water three times. The organic layer was concentrated and dried, thereby obtaining 0.82 g of the compound (VI) shown below (yield: 41%).

[Chemical Formula 47]

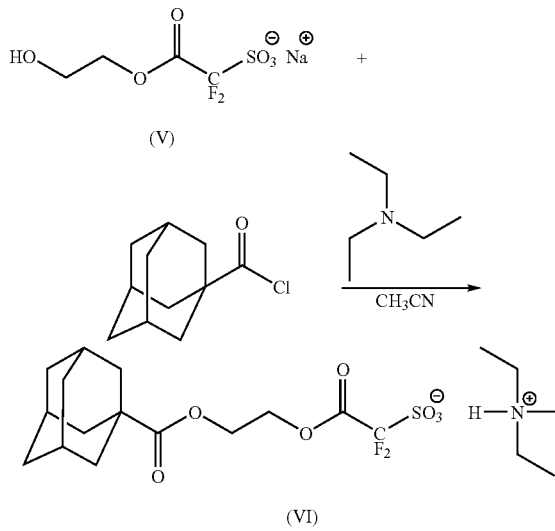

The compound (VI) thus obtained was analyzed using NMR.

$^1$H-NMR (DMSO-d6, 400 MHz): δ (ppm)=8.81 (s, 1H, H$^c$), 4.37-4.44 (t, 2H, H$^d$), 4.17-4.26 (t, 2H, H$^e$), 3.03-3.15 (q, 6H, H$^b$), 1.61-1.98 (m, 15H, Adamantane), 1.10-1.24 (t, 9H, H$^a$).

$^{19}$F-NMR (DMSO-d6, 376 MHz): δ (ppm)=−106.61.

From the results described above, it could be confirmed that the compound (VI) had the structure shown below.

[Chemical Formula 48]

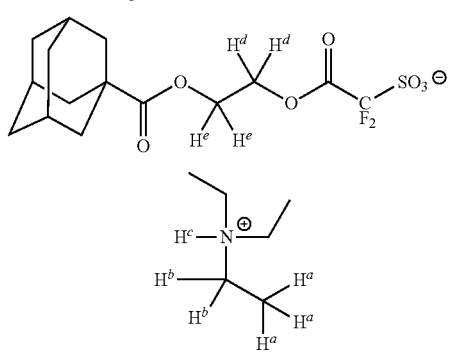

Subsequently, 0.384 g of the compound (VII) shown below was dissolved in 3.84 g of dichloromethane and 3.84 g of water, and then 0.40 g of the compound (VI) was added thereto. After the resultant solution was stirred for 1 hour, the organic layer was collected by fractionation, and then washed with 3.84 g of water three times. The organic layer thus obtained was concentrated and dried, thereby obtaining 0.44 g of the compound (VIII) shown below (yield: 81.5%).

[Chemical Formula 49]

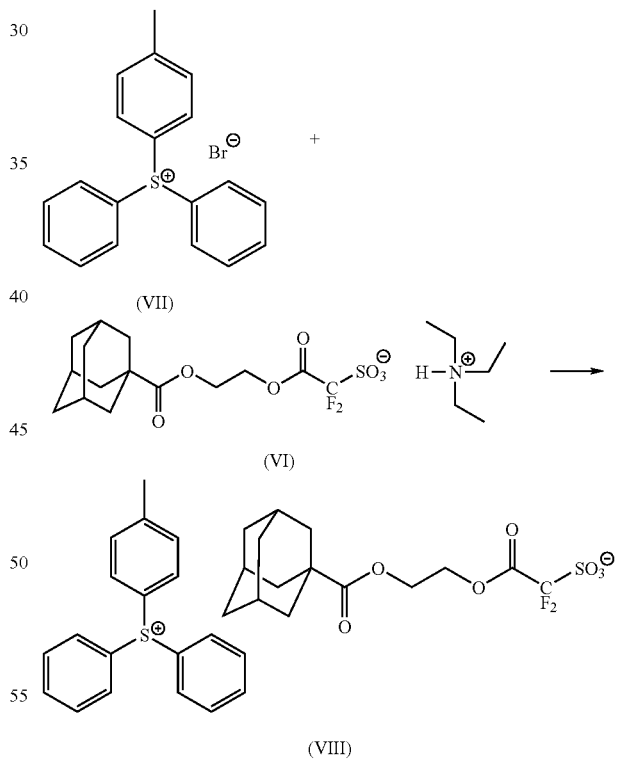

The compound (VIII) thus obtained was analyzed using NMR.

$^1$H-NMR (DMSO-d6, 400 MHz): δ (ppm)=7.57-7.87 (m, 14H, Phenyl), 4.40-4.42 (t, 2H, H$^b$), 4.15-4.22 (t, 2H, H$^a$), 2.43 (s, 3H, H$^c$), 1.60-1.93 (m, 15H, Adamantane).

$^{19}$F-NMR (DMSO-d6, 376 MHz): δ (ppm)=−106.7.

From the results described above, it could be confirmed that the compound (VIII) had the structure shown below.

[Chemical Formula 50]

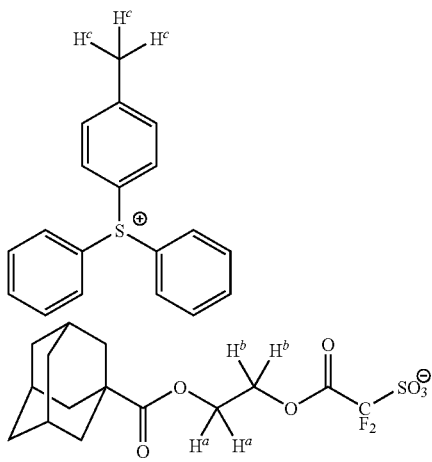

Synthesis Example 2

Synthesis of Acid Generator (B)-5

8.53 g of phosphorus oxide, 8.81 g of 2,5-dimethylphenol, and 12.2 g of diphenylsulfoxide were gradually added to 60.75 g of methanesulfonic acid which is controlled at 20° C. or lower. While the temperature was controlled at 15° C. to 20° C., the solution obtained above was matured for 30 minutes. Then, the temperature was raised up to 40° C., and the solution was matured for 2 hours. Thereafter, the reaction solution was dropwise added to 109.35 g of pure water cooled at 15° C. or lower. After the dropwise addition, 54.68 g of dichloromethane was added to the solution. The solution obtained was stirred, and then the dichloromethane layer was collected.

386.86 g of hexane at 20° C. to 25° C. was prepared in another container, and the dichloromethane layer collected above was dropwise added thereto. After the dropwise addition, the solution was matured for 30 minutes at 20 to 25° C., and then filtration was conducted, thereby obtaining 17.14 g of the intended compound (i) (yield: 70.9%).

The compound (i) thus obtained was analyzed using NMR.
$^1$H-NMR (DMSO-d6, 600 MHz): δ (ppm)=7.61-7.72 (m, 10H, Phenyl), 7.14 (s, 2H, H$^c$), 3.12 (s, 3H, H$^b$), 2.22 (s, 6H, H$^a$).

From the results described above, it could be confirmed that the compound (i) had the structure shown below.

[Chemical Formula 51]

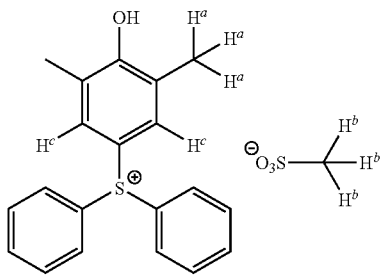

4 g of the compound (i) shown above was dissolved in 79.8 g of dichloromethane. After the compound (i) was dissolved, 6.87 g of potassium carbonate was added thereto, and then 3.42 g of 2-methyl-2-adamantyl bromoacetate was added thereto. The resultant was reacted for 24 hours while refluxing. Subsequently, the resultant was filtrated and washed with water, and then crystallized with hexane. The powder thus obtained was dried under diminished pressure, thereby obtaining 3.98 g of the intended compound (ii) (yield: 66%).

The compound (ii) thus obtained was analyzed using NMR.

$^1$H-NMR (CDCl$_3$, 400 MHz): δ (ppm)=7.83-7.86 (m, 4H, Phenyl), 7.69-7.78 (m, 6H, Phenyl), 7.51 (s, 2H, H$^d$), 4.46 (s, 2H, H$^c$), 2.39 (s, 6H, H$^a$), 2.33 (s, 2H, Adamantane), 2.17 (s, 2H, Adamantane), 1.71-1.98 (m, 1H, Adamantane), 1.68 (s, 3H, H$^b$), 1.57-1.61 (m, 2H, Adamantane).

From the results described above, it could be confirmed that the compound (ii) had the structure shown below.

[Chemical Formula 52]

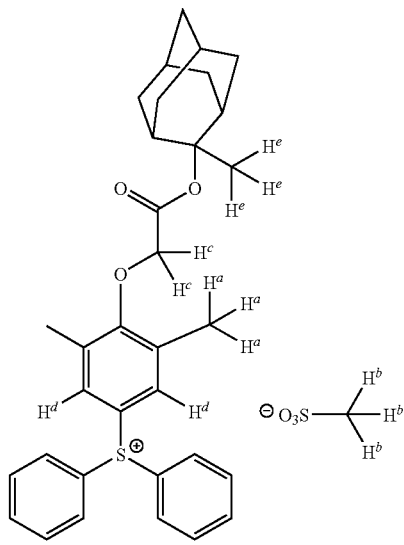

4.77 g of the compound (ii) was dissolved in 23.83 g of dichloromethane and 23.83 g of water, and then 3.22 g of the compound (VI) was added thereto. After the resultant solution was stirred for 1 hour, the organic layer was collected by fractionation, and then washed with 3.84 g of water three times. The organic layer thus obtained was concentrated and dried, thereby obtaining 4.98 g of the compound (iii) shown below (yield: 87%).

[Chemical Formula 53]

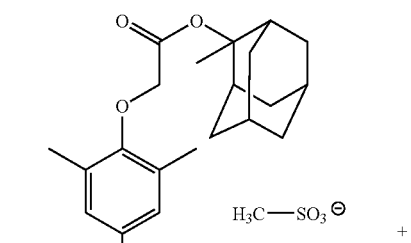

(ii)

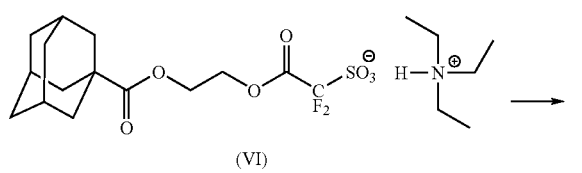

(VI)

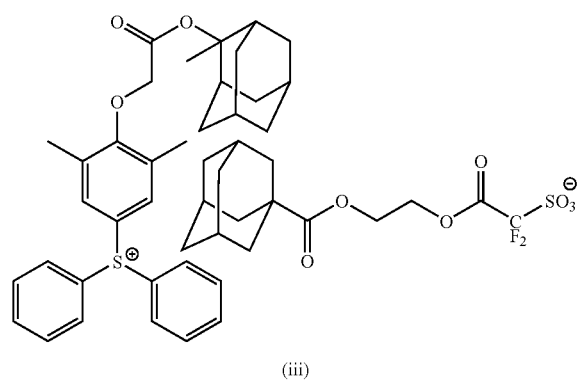

(iii)

The compound (iii) thus obtained was analyzed using NMR.

$^1$H-NMR (DMSO-d6, 400 MHz): δ (ppm)=7.76-7.88 (m, 10H, Phenyl), 7.62 (s, 2H, Phenyl), 4.64 (s, 2H, H$^b$), 4.43-4.44 (t, 2H, H$^e$), 4.22-4.23 (t, 2H, H$^d$), 1.51-2.36 (m, 38H, Adamantane+H$^a$+H$^c$).

$^{19}$F-NMR (DMSO-d6, 376 MHz): δ (ppm)=−106.7.

From the results described above, it could be confirmed that the compound (iii) had the structure shown below.

[Chemical Formula 54]

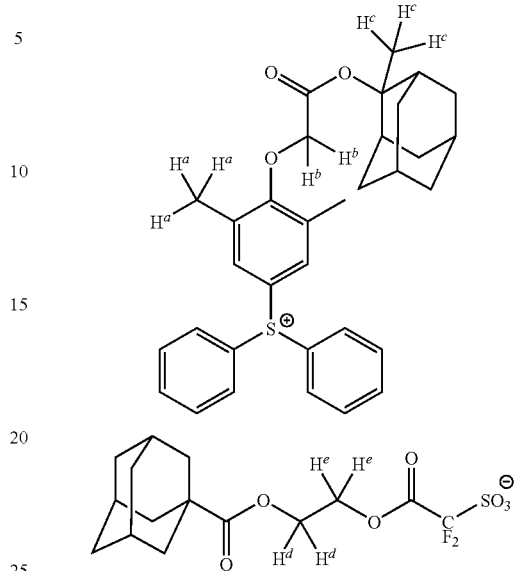

Synthesis Example 3

Synthesis of Acid Generator (B)-6

16.7 ml of tetrahydrofran was added to 5.0 g of 2-naphthylmethyloxytetrafluoroethanesulfonyl fluoride, and then an aqueous solution of lithium hydroxide (0.98 g) dissolved in 13.6 ml of pure water was dropwise added thereto in an ice bath. Then, the solution was stirred in an ice bath.

As no absorption of $^{19}$F-NMR at −217.6 ppm by —SO$_2$F was observed, it was confirmed that all fluorinated sulfonyl groups were changed to lithium sulfonate. Subsequently, the reaction solution was concentrated and dried, thereby obtaining a white viscous solid. The crude product thus obtained was dissolved in 14.2 ml of acetone, and filtered in order to remove LiF obtained as a by-product. Subsequently, the filtrate was concentrated, thereby obtaining 5.50 g of the precursor compound (X).

Subsequently, 6.99 g of triphenylsulfonium bromide was dissolved in 125 ml of pure water, and 5.50 g of the precursor compound (X) was added to the resultant solution. After the solution was stirred for 19 hours at room temperature, 125 g of dichloromethane was added thereto, and the resultant solution was stirred. The organic layer was collected by fractionation. Furthermore, the organic layer was washed using 40.0 ml of pure water, and then the organic layer was collected by fractionation. The organic layer thus obtained was concentrated and dried, thereby obtaining 7.09 g of the intended compound (XI) (yield: 75.2%).

[Chemical Formula 55]

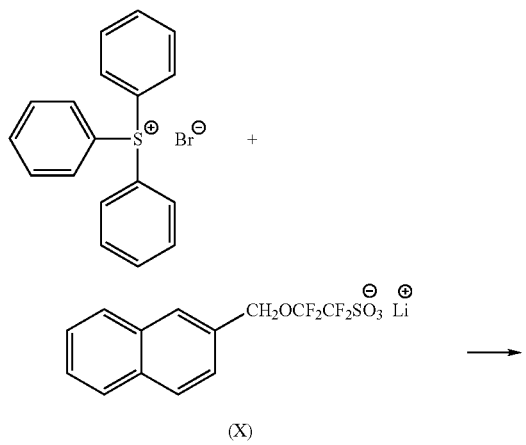

The compound (XI) was analyzed using NMR.

$^1$H-NMR (acetone-d6, 400 MHz): δ (ppm)=8.01-7.47 (m, 22H, H$^a$), 5.23 (s, 2H, H$^b$).

$^{19}$F-NMR (acetone-d6, 376 MHz): δ (ppm)=79.2, 111.8.

From the results described above, it could be confirmed that the compound (XI) had the structure shown below.

[Chemical Formula 56]

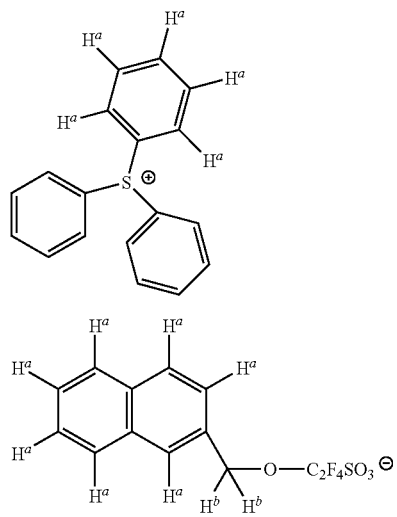

Synthesis Example 4

Synthesis of Acid Generator (B)-7

17.7 g of the compound (II) (purity: 91.0%) obtained by the above Synthesis Example 1, 13 g of the compound (II') represented by the formula (II') shown below, and 88.3 g of toluene were prepared, and 5.85 g of p-toluenesulfonic acid monohydrate was added thereto. Then, the resultant solution was refluxed for 26 hours at 130° C. Thereafter, the resultant was filtered, and then 279.9 g of methyl ethyl ketone was added to the residue and stirred. Subsequently, the resultant was filtered, and then 84.0 g of methanol was added to the residue and stirred. The resultant was filtered once more, and the residue was dried, thereby obtaining 20.2 g of the compound (III) shown below in the form of a white solid (purity: 99.9%, yield: 72.1%).

[Chemical Formula 57]

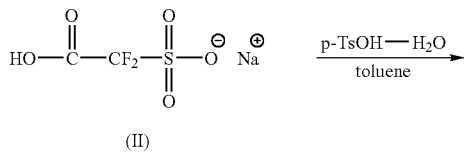

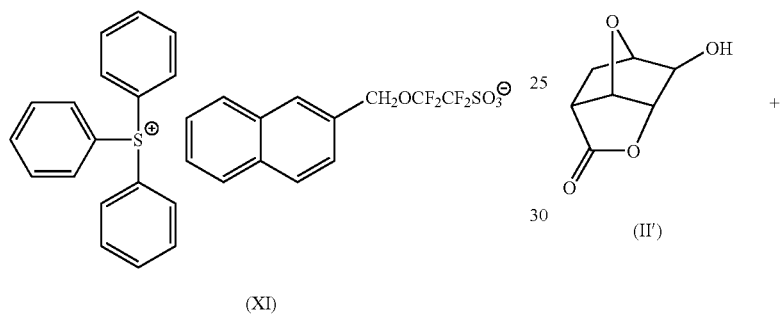

Subsequently, 15.0 g of the compound (III) (purity: 99.9%) was dissolved in 66.4 g of pure water. 13.3 g of 4-methyltriphenylsulfonium bromide dissolved in 132.8 g of dichloromethane was added to the above solution, and stirred for 3 hours at room temperature. The organic layer was then collected by fractionation. The organic layer was further washed with 66.4 g of pure water, and then concentrated and dried, thereby obtaining 20.2 g of the intended compound (IV) in the form of a colorless viscous liquid (yield: 88.1%).

[Chemical Formula 58]

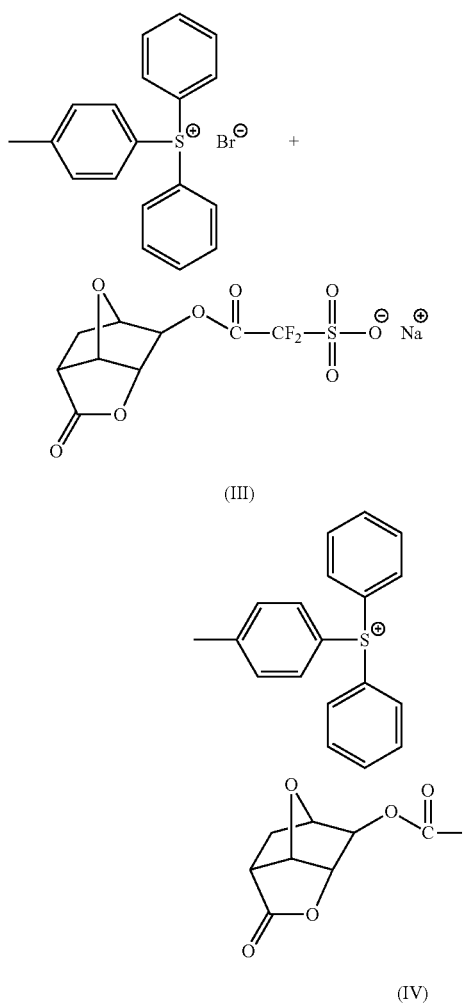

(III)

(IV)

The compound (IV) was analyzed using NMR. The results are shown below.

$^1$H-NMR (DMSO, 400 MHz): δ (ppm)=7.86-7.58 (m, 14H, Ha+Hb), 5.48 (m, 1H, Hd), 4.98 (s, 1H, He), 4.73-4.58 (d, 2H, Hf), 2.71 (m, 1H, Hg), 2.43 (m, 3 H, Hc), 2.12 (m, 2H, Hh).

$^{19}$F-NMR (DMSO, 376 MHz): δ (ppm)=−106.9.

From the results described above, it could be confirmed that the compound (IV) had the structure shown below.

[Chemical Formula 59]

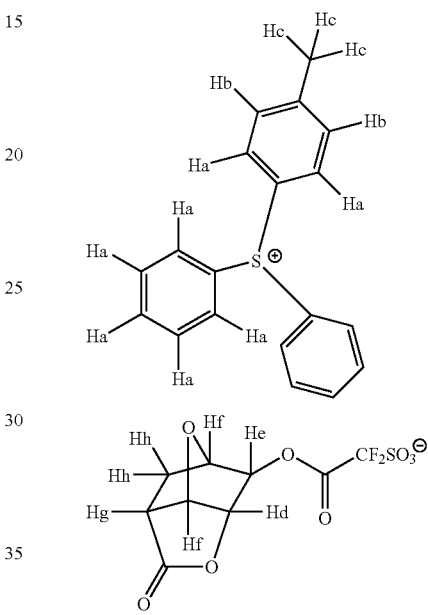

<Preparation of Positive Resist Composition-1>

Each of the components shown in Table 1 is mixed and dissolved, thereby providing a positive resist composition.

TABLE 1

|  | Component (A) |  | Component (B) |  |  | Component (D) |  |  | Add | Component (S) |
|---|---|---|---|---|---|---|---|---|---|---|
| Comparative Example 1 | (A)-1 [70] | (A)-2 [30] | (B)-1 [5] | (B)-2 [1.5] | (B)-3 [1] | (D)-1 [0.07] | (D)-2 [0.18] | (D)-3 [0.04] | — | (S)-1 [1075] |
| Comparative Example 2 | (A)-1 [70] | (A)-2 [30] | (B)-3 [5] | — | — | (D)-1 [0.07] | (D)-2 [0.18] | (D)-3 [0.04] | — | (S)-1 [1075] |
| Example 1 | (A)-1 [70] | (A)-2 [30] | (B)-4 [5] | — | — | (D)-1 [0.07] | (D)-2 [0.18] | (D)-3 [0.04] | — | (S)-1 [1075] |
| Example 2 | (A)-1 [70] | (A)-2 [30] | (B)-4 [4.5] | — | — | (D)-1 [0.07] | (D)-4 [0.35] | (D)-3 [0.04] | Add-1 [3] | (S)-1 [1075] |
| Example 3 | (A)-1 [70] | (A)-2 [30] | (B)-4 [4.5] | — | — | — | (D)-4 [0.24] | (D)-3 [0.04] | — | (S)-2 [1075] |
| Example 4 | (A)-1 [70] | (A)-2 [30] | (B)-5 [9.2] | — | — | — | (D)-4 [0.24] | (D)-3 [0.04] | — | (S)-2 [1075] |
| Comparative Example 3 | (A)-1 [100] | — | (B)-3 [3.6] | — | — | — | (D)-2 [0.2] | — | — | (S)-1 [1075] |
| Example 5 | (A)-1 [100] | — | (B)-4 [4.5] | — | — | — | (D)-2 [0.2] | — | — | (S)-1 [1075] |
| Example 6 | (A)-1 [100] | — | (B)-6 [4.1] | — | — | — | (D)-2 [0.2] | — | — | (S)-1 [1075] |
| Example 7 | (A)-1 [100] | — | (B)-7 [4.0] | — | — | — | (D)-2 [0.2] | — | — | (S)-1 [1075] |

In Table 1, the abbreviations represent the following meanings. Also, the values within the brackets [ ] represent the blending amount (parts by weight). Here, the term "-" in Table 1 means that nothing is blended.

(A)-1: a copolymer represented by the formula (A1-11) shown below (a1/a2=61/39 (molar ratio); Mw=8,000, Mw/Mn=1.7).

Here, Mw and Mw/Mn were determined using the polystyrene equivalent value determined by gel permeation chromatography (GPC). Also, in the formula (A1-11) shown below, the symbols a1 and a2 attached at the bottom right of the brackets ( ) within each of the structural units represents the proportion (mol %) of each of the structural units in the copolymer. The proportion (formulation ratio: mol %) of each of the structural units in the copolymer was determined by using carbon NMR.

[Chemical Formula 60]

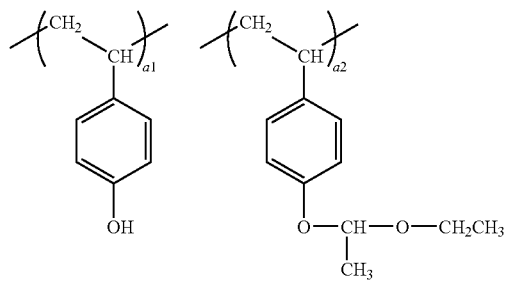

(A1-11)

(A)-2: a copolymer represented by the formula (A1-21) shown below (a1/a2=61/39 (molar ratio); Mw=8,000, Mw/Mn=1.7).

[Chemical Formula 61]

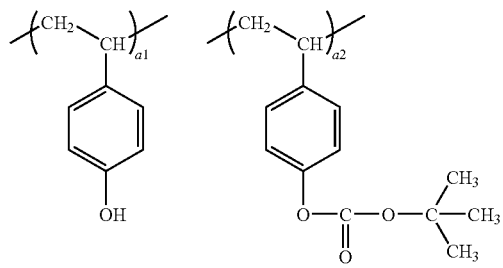

(A1-21)

(B)-1: bis(2,4-dimethylphenylsulfonyl)diazomethane.

(B)-2: bis(cyclohexylsulfonyl)diazomethane.

(B)-3: triphenylsulfonium nonafluoro-n-butanesulfonate.

(B)-4: the compound represented by the formula (B1-1) shown below.

(B)-5: the compound represented by the formula (B1-2) shown below.

(B)-6: the compound represented by the formula (B1-3) shown below.

(B)-7: the compound represented by the formula (B1-4) shown below.

[Chemical Formula 62]

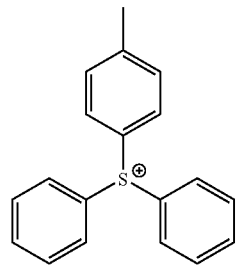

(B1-1)

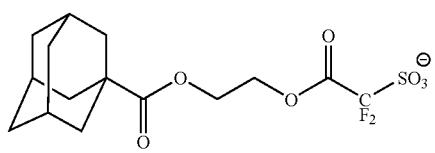

(B1-2)

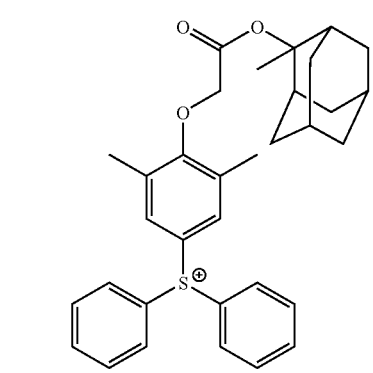

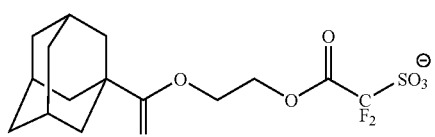

[Chemical Formula 63]

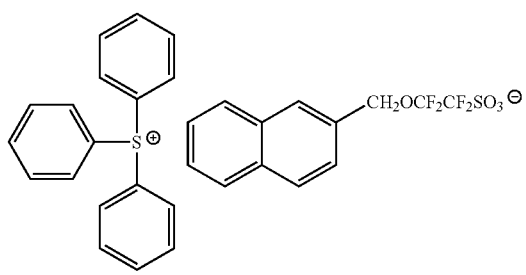

(B1-3)

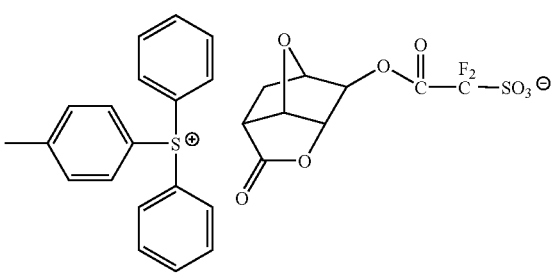

(B1-4)

(D)-1: triisopropanolamine.

(D)-2: triethanolamine.

(D)-3: triethylamine.
(D)-4: tri-n-butylamine.
Add-1: cyclohexanedimethanol monovinyl ether.
(S)-1: PGMEA.
(S)-2: a mixture solvent of PGMEA/PGME=6/4 (mass ratio).

<Evaluation of Lithography Properties-1>

Using each of the positive resist compositions, a resist pattern was formed in the following manner. Then, with respect to each of the positive resist compositions, lithography properties were evaluated.

Resist Pattern Formation (1)

Example 1 and Comparative Examples 1 and 2

An organic anti-reflection film composition (product name: DUV-42P, manufactured by Brewer Science Ltd.) was applied onto an 8-inch silicon wafer using a spinner, and the composition was then baked at 180° C. for 60 seconds and dried, thereby forming an organic anti-reflection film having a film thickness of 65 nm. Then, each of the positive resist compositions of Example 1 and Comparative Examples 1 and 2 obtained above was applied onto the organic anti-reflection film using a spinner, and was then prebaked (PAB) on a hotplate at 100° C. for 90 seconds and dried, thereby forming a resist film having a film thickness of 300 nm.

Subsequently, the resist film was selectively irradiated with a KrF excimer laser (248 nm) through a mask pattern (6% half tone), using a KrF exposure apparatus NSR-S205C (manufactured by Nikon Corporation, NA (numerical aperture)= 0.68, σ=0.60).

Thereafter, a post exposure baking (PEB) treatment was conducted at 110° C. for 90 seconds, followed by a developing treatment for 60 seconds at 23° C. in a 2.38 weight % aqueous solution of tetramethylammonium hydroxide (TMAH) (product name: "NMD-3", manufactured by Tokyo Ohka Kogyo Co., Ltd.). Then, the resist film was rinsed with pure water for 30 seconds, and dried by shaking. Thereafter, the resist film was heated at 100° C. for 60 seconds to be dried.

As a result, in any of the examples, a resist pattern of a contact hole pattern (hereinafter, referred to as "Iso C/H pattern (1)") where holes with a diameter of 150 nm were allocated at regular intervals (pitch: 640 nm) was formed on the resist film.

Here, an optimum exposure "Eop" (mJ/cm$^2$; sensitivity) for forming a contact pattern with a diameter of 150 nm and a pitch of 640 nm was determined. The results are shown in Table 2.

Subsequently, a contact hole pattern (hereinafter, referred to as "Dense C/H pattern (1)") where holes with a hole diameter of 150 nm were allocated at regular intervals (pitch: 320 nm) was formed using the optimum exposure Eop (mJ/cm$^2$) for forming the above Iso C/H pattern (1).

[Evaluation of EL Margin]

The exposure dose used when the above Iso C/H pattern (1) was formed within the range of ±10% (that is, 135 to 165 nm) of the target size (hole diameter: 150 nm) was determined, and then EL margin (unit: %) was determined using the following formula. The results are shown in Table 2.

$$EL\ margin(\%)=(|E1-E2|/Eop)\times 100$$

(In the formula, E1 represents an exposure dose (mJ/cm$^2$) when a C/H pattern with a hole diameter of 135 nm was formed, and E2 represents an exposure dose (mJ/cm$^2$) when a C/H pattern with a hole diameter of 165 nm was formed.

[Evaluation of Resist Pattern Shape]

The Dense C/H patterns (1) and Iso C/H patterns (1) formed using the above Eop were observed using a scanning electron microscope (SEM), and cross-sectional shapes thereof were evaluated against the following criteria. The results are shown in Table 2. In Table 2, A represents high rectangularity, and B represents low rectangularity.

TABLE 2

| | PAB (° C.) | PEB (° C.) | Eop (mJ/cm$^2$) | EL margin (%) | Resist pattern shape |
|---|---|---|---|---|---|
| Comparative Example 1 | 100 | 110 | 35 | 20.0 | B |
| Comparative Example 2 | 100 | 110 | 41 | 17.0 | B |
| Example 1 | 100 | 110 | 52 | 23.1 | A |

As is clear from the results shown in Table 2, the positive resist composition of Example 1 of the present invention exhibits an EL margin value larger than the positive resist composition of Comparative Examples 1 and 2. Accordingly, it could be confirmed that the variation in the pattern size accompanied by the variation in the exposure dose was small (that is, EL margin was large).

Also, it could be confirmed that the positive resist composition of Example 1 of the present invention had an excellent resist pattern shape, when compared with the positive resist compositions of Comparative Examples 1 and 2.

Resist Pattern Formation (2)

Examples 2 to 4

An organic anti-reflection film composition (product name: DUV-42P, manufactured by Brewer Science Ltd.) was applied onto an 8-inch silicon wafer using a spinner, and the composition was then baked at 180° C. for 60 seconds and dried, thereby forming an organic anti-reflection film having a film thickness of 65 nm. Then, each of the positive resist compositions of Examples 2 to 4 obtained above was applied onto the organic anti-reflection film using a spinner, and was then prebaked (PAB) on a hotplate at 100° C. for 60 seconds and dried, thereby forming a resist film having a film thickness of 300 nm.

Subsequently, the resist film was selectively irradiated with a KrF excimer laser (248 nm) through a mask pattern (6% half tone), using a KrF exposure apparatus NSR-S205C (manufactured by Nikon Corporation, NA (numerical aperture)= 0.75, σ=0.70).

Thereafter, a post exposure baking (PEB) treatment was conducted at 110° C. for 60 seconds, followed by a developing treatment for 60 seconds at 23° C. in a 2.38 weight % aqueous solution of tetramethylammonium hydroxide (TMAH) (product name: "NMD-3", manufactured by Tokyo Ohka Kogyo Co., Ltd.). Then, the resist film was rinsed with pure water for 30 seconds, and dried by shaking. Thereafter, the resist film was heated at 100° C. for 60 seconds to be dried.

As a result, in any of the examples, a resist pattern of a contact hole pattern (hereinafter, referred to as "Iso C/H pattern (2)") where holes with a diameter of 150 nm were allocated at regular intervals (pitch: 640 nm) were formed on the resist film.

Here, an optimum exposure "Eop" (mJ/cm$^2$; sensitivity) for forming a contact pattern with a diameter of 150 nm and a pitch of 640 nm was determined. The results are shown in Table 3.

Subsequently, a contact hole pattern (hereinafter, referred to as "Dense C/H pattern (2)") where holes with a hole diameter of 150 nm were allocated at regular intervals (pitch: 320 nm) was formed using the optimum exposure Eop (mJ/cm$^2$) for forming the above Iso C/H pattern (2).

[Evaluation of EL Margin]

The exposure dose used when the above Iso C/H pattern (2) was formed within the range of ±10% (that is, 135 to 165 nm) of the target size (hole diameter: 150 nm) was determined, and then EL margin (unit: %) was determined using the following formula. The results are shown in Table 3.

EL margin(%)=(|E3−E4|/Eop)×100

(In the formula, E3 represents an exposure dose (mJ/cm$^2$) when a C/H pattern with a hole diameter of 135 nm was formed, and E4 represents an exposure dose (mJ/cm$^2$) when a C/H pattern with a hole diameter of 165 nm was formed.)

[Evaluation of Depth of Focus (DOF)-1]

Depth of focus (DOF) of the Iso C/H pattern (2) with a hole diameter of 150 nm described above was evaluated.

Using the above Eop, the focus was appropriately shifted up and down and resist patterns were formed in the same manner as in the above [Resist Pattern Formation (2)] in Examples 2 to 4. Then, the depth of focus (DOF) (unit: μm) with which an Iso C/H pattern was formed within the range where the variation in the target size of the Iso CH pattern was ±10% (i.e., 135 to 165 nm) was determined as "∓10% CD". The results are shown in Table 3.

The "DOF" is the range of depth of focus in which a resist pattern can be formed with a size where deviations relative to the target size are kept within the prescribed range when exposure is conducted moving the exposure focus upwardly or downwardly with the same exposure dose, i.e., the range in which a resist pattern faithful to the mask pattern can be obtained. A larger DOF is more preferable.

[Evaluation of Depth of Focus (DOF)-2]

Depth of focus (DOF) of the Dense C/H pattern (2) with a hole diameter of 150 nm described above was evaluated.

Using the above Eop, the focus was appropriately shifted up and down and resist patterns were formed in the same manner as in the above [Resist Pattern Formation (2)] in Examples 2 to 4. Then, the depth of focus (DOF) (unit: μm) with which a hole pattern shape could be obtained was determined as "Open". The results are shown in Table 3.

[Evaluation of Mask Error Factor (MEF)-1]

Mask error factor (MEF) of the Iso C/H pattern (2) with a hole diameter of 150 nm (pitch: 640 nm) described above was evaluated.

Using the above Eop, an Iso C/H pattern with a pitch of 640 nm was formed by using a mask pattern where the target mask size was a diameter of 170, 180, 190, or 200 nm (10 nm apart; four points).

Here, a plurality of points was plotted on a graph, based on the target mask size (nm) as the abscissa axis and a diameter (nm) of the hole pattern formed on the resist film by using each mask pattern as the longitudinal axis. Then, a slope of a straight line which connects the plotted points was computed as the MEF. The results are shown in Table 3.

[Evaluation of Mask Error Factor (MEF)-2]

Mask error factor (MEF) of the Dense C/H pattern (2) with a hole diameter of 150 nm (pitch: 320 nm) described above was evaluated.

Using the above Eop, a Dense C/H pattern with a pitch of 320 nm was formed by using a mask pattern where the target mask size was a diameter of 170, 180, 190, or 200 nm (10 nm apart; four points).

Here, a plurality of points was plotted on a graph, based on the target mask size (nm) as the abscissa axis and a diameter (nm) of the hole pattern formed on the resist film by using each mask pattern as the longitudinal axis. Then, a slope of a straight line which connects the plotted points was computed as the MEF. The results are shown in Table 3.

TABLE 3

|  | Eop (mJ/cm$^2$) | EL margin (%) | DOF (μm) ±10% CD | DOF (μm) Open | MEF 640 nm Pitch | MEF 320 nm Pitch |
| --- | --- | --- | --- | --- | --- | --- |
| Example 2 | 57 | 21.2 | 0.2 | 0.4 | 3.26 | 3.35 |
| Example 3 | 53 | 23.6 | 0.2 | 0.5 | 3.11 | 3.30 |
| Example 4 | 62 | 22.6 | 0.3 | 0.4 | 3.03 | 2.95 |

As is clear from the results shown in Table 3, each of the positive resist compositions of Examples 2 to 4 of the present invention exhibits a large EL margin value, and thus it could be confirmed that the variation in the pattern size accompanied by the variation in the exposure dose is small (that is, EL margin is large).

Also, it could be confirmed that the positive resist compositions of Examples 2 to 4 had excellent DOF properties and excellent mask reproducibility.

Resist Pattern Formation (3)

Examples 5 to 7 and Comparative Example 3

An organic anti-reflection film composition (product name: DUV-42P, manufactured by Brewer Science Ltd.) was applied onto an 8-inch silicon wafer using a spinner, and the composition was then baked at 180° C. for 60 seconds and dried, thereby forming an organic anti-reflection film having a film thickness of 65 nm. Then, each of the positive resist compositions of Examples 5 to 7 and Comparative Example 3 obtained above was applied onto the organic anti-reflection film using a spinner, and was then prebaked (PAB) on a hotplate at 100° C. for 60 seconds and dried, thereby forming a resist film having a film thickness of 300 nm.

Subsequently, the resist film was selectively irradiated with a KrF excimer laser (248 nm) through a mask pattern (6% half tone), using a KrF exposure apparatus NSR-S203B (manufactured by Nikon Corporation, NA (numerical aperture) =0.68, σ=0.60).

Thereafter, a post exposure baking (PEB) treatment was conducted at 110° C. for 60 seconds, followed by a developing treatment for 30 seconds at 23° C. in a 2.38 weight % aqueous solution of tetramethylammonium hydroxide (TMAH) (product name: "NMD-3", manufactured by Tokyo Ohka Kogyo Co., Ltd.). Then, the resist film was rinsed with pure water for 30 seconds, and dried by shaking. Thereafter, the resist film was heated at 100° C. for 60 seconds to be dried.

As a result, in any of the examples, a resist pattern of a contact hole pattern (hereinafter, referred to as "Iso C/H pattern (3)") where holes with a diameter of 150 nm were allocated at regular intervals (pitch: 640 nm) was formed on the resist film.

Here, an optimum exposure "Eop" (mJ/cm$^2$; sensitivity) for forming a contact pattern with a diameter of 150 nm and a pitch of 640 nm was determined. The results are shown in Table 4.

Subsequently, a contact hole pattern (hereinafter, referred to as "Dense C/H pattern (3)") where holes with a hole diameter of 150 nm were allocated at regular intervals (pitch: 320 nm) was formed using the optimum exposure Eop (mJ/cm$^2$) for forming the above Iso C/H pattern (2).

[Evaluation of EL Margin]

The exposure dose used when the above Iso C/H pattern (3) was formed within the range of ±10% (that is, 135 to 165 nm) of the target size (hole diameter: 150 nm) was determined, and then EL margin (unit: %) was determined using the following formula. The results are shown in Table 4.

EL margin(%)=(|E5−E6|/Eop)×100

(In the formula, E5 represents an exposure dose (mJ/cm$^2$) when a C/H pattern with a hole diameter of 135 nm was formed, and E6 represents an exposure dose (mJ/cm$^2$) when a C/H pattern with a hole diameter of 165 nm was formed.)

[Evaluation of Proximity Effect]

In the same manner as in the above [Resist Pattern Formation (3)], a C/H pattern (Iso C/H pattern) with a hole diameter of 150 nm and a pitch of 640 nm and a C/H pattern (Dense C/H pattern) with a hole diameter of 150 nm and a pitch of 320 nm were formed.

Here, while exposure dose was fixed to the optimum exposure (Eop) used when the Dense C/H pattern was formed, an Iso C/H pattern and a Dense pattern were formed, and then difference in size (dimension) (hereinafter, sometimes referred to as "(I–D) difference in size", unit: nm) between the hole diameter of the Iso C/H pattern and the hole diameter of the Dense pattern was determined. The results are shown in Table 4.

The smaller the (I–D) difference in size, the less the proximity effect (the effect on pattern size caused by change in pitch), and consequently, it is preferable.

[Evaluation of Mask Error Factor (MEF)]

Mask error factor (MEF) of the Iso C/H pattern (3) with a hole diameter of 150 nm (pitch: 640 nm) described above was evaluated.

Using the above Eop, an Iso C/H pattern with a pitch of 640 nm was formed by using a mask pattern where the target mask size was a diameter of 170, 180, 190, 200, or 210 nm (10 nm apart; five points).

Here, a plurality of points was plotted on a graph, based on the target mask size (nm) as the abscissa axis and a diameter (nm) of the hole pattern formed on the resist film by using each mask pattern as the longitudinal axis. Then, a slope of a straight line which connects the plotted points was computed as the MEF. The results are shown in Table 4.

TABLE 4

| | Eop (mJ/cm$^2$) | EL margin (%) | Proximity (nm) | MEF |
|---|---|---|---|---|
| Comparative Example 3 | 35 | 11.4 | 10.6 | 3.58 |
| Example 5 | 36 | 19.4 | 7.7 | 2.97 |
| Example 6 | 37 | 18.9 | 8.9 | 3.24 |
| Example 7 | 42 | 19.1 | 3.1 | 3.31 |

As is clear from the results shown in Table 4, each of the positive resist compositions of Examples 5 to 7 of the present invention exhibits an EL margin value larger than the positive resist composition of Comparative Example 3. Accordingly, it could be confirmed that the variation in the pattern size accompanied by the variation in the exposure dose was small (that is, EL margin was large).

Also, it could be confirmed that the positive resist compositions of Examples 5 to 7 exhibited more excellent proximity effect, when compared with the positive resist composition of Comparative Example 3.

Furthermore, it could be confirmed that the positive resist compositions of Examples 5 to 7 had more excellent mask reproducibility, when compared with the positive resist composition of Comparative Example 3.

<Preparation of Positive Resist Composition-2>

Each of the components shown in Table 5 is mixed and dissolved, thereby providing a positive resist composition.

TABLE 5

| | Component (A) | Component (B) | Component (D) | Component (S) |
|---|---|---|---|---|
| Comparative Example 4 | (A)-3 [100] | (B)-3 [21.5] | (D)-5 [1.50] | (S)-2 [3900] |
| Comparative Example 5 | (A)-4 [100] | (B)-3 [21.5] | (D)-5 [1.50] | (S)-2 [3900] |
| Example 8 | (A)-3 [100] | (B)-5 [34.2] | (D)-5 [1.50] | (S)-2 [3900] |
| Example 9 | (A)-4 [100] | (B)-5 [34.2] | (D)-5 [1.50] | (S)-2 [3900] |

In Table 5, the abbreviations mean the following. Also, the values within the brackets [ ] represent the blending amount (parts by weight).

(A)-3: the copolymer represented by the formula (A1-31) shown below (a1/a2=69/31 (molar ratio); Mw=7,200, Mw/Mn=1.39).

Here, Mw and Mw/Mn were determined using the polystyrene equivalent value determined by gel permeation chromatography (GPC). Also, in the formula (A1-31) shown below, the symbols a1 and a2 attached at the bottom right of the brackets ( ) within each of the structural units represents the proportion (mol %) of each of the structural units in the copolymer. The proportion (formulation ratio: mol %) of each of the structural units in the copolymer was determined by using carbon NMR.

[Chemical Formula 64]

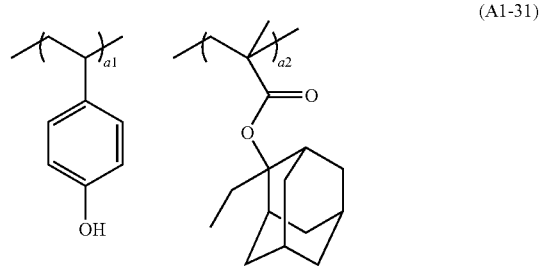

(A1-31)

(A)-4: the copolymer represented by the formula (A1-32) shown below (a1/a2=75/25 (molar ratio); Mw=7,400, Mw/Mn=1.41).

[Chemical Formula 65]

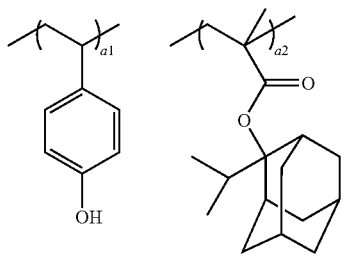

(A1-32)

(B)-3: triphenylsulfonium nonafluoro-n-butanesulfonate.
(B)-5: the compound represented by the above formula (B1-2).
(D)-5: trioctylamine.
(S)-2: a mixture solvent of PGMEA/PGME=6/4 (mass ratio).

<Evaluation of Lithography Properties-2>

Using each of the positive resist compositions, a resist pattern was formed in the following manner. Then, with respect to each of the positive resist compositions, lithography properties were evaluated.

Resist Pattern Formation (4)

Examples 8 and 9 and Comparative Examples 4 and 5

Each of the positive resist compositions obtained through above "Preparation of Positive Resist Composition-2" was applied uniformly using a coater (product name "CLEAN TRACK ACT-8", manufactured by Tokyo Electron Ltd.) onto an 8-inch silicon substrate that had been treated with hexamethyldisilazane (HMDS) for 30 seconds at 90° C. Then, the composition was prebaked (PAB) for 60 seconds at a temperature shown in Table 6 and dried, thereby forming a resist film with a film thickness of 60 nm.

Subsequently, the resist film was then subjected to direct patterning (exposure) with an electron beam lithography apparatus HL-800D (VSB) (manufactured by Hitachi Ltd.) at an accelerating voltage of 70 keV.

Thereafter, a bake (PEB) treatment was conducted for 60 seconds at a temperature shown in Table 6, the resist film was subjected to alkali developing for 30 seconds in a 2.38% by weight aqueous solution of tetramethylammonium hydroxide (TMAH) (product name: NMD-3, manufactured by Tokyo Ohka Kogyo Co., Ltd.), and was then washed for 15 seconds with pure water.

As a result, in any of the examples, a line and space pattern (L/S pattern) with a line width of 100 nm and a pitch of 200 nm was formed.

Here, an optimum exposure "Eop" (mJ/cm$^2$; sensitivity) for forming a line and space pattern with a line width of 100 nm and a pitch of 200 nm was determined The results are shown in Table 6.

[Evaluation of EL Margin]

The exposure dose used when a L/S pattern was formed with a line width within the range of ±10% (that is, 90 to 110 nm) of the target size (line width: 100 nm) was determined, and then EL margin (unit: %) was determined using the following formula. The results are shown in Table 6.

EL margin(%)=(|E1−E2|/Eop)×100

E1 represents an exposure dose (mJ/cm$^2$) when a L/S pattern with a line width of 90 nm was formed, and E2 represents an exposure dose (mJ/cm$^2$) when a L/S pattern with a line width of 110 nm was formed.

The larger the value of the EL margin (%), the smaller the variation in the pattern size accompanied by the variation in the exposure dose, and the larger the process margin.

[Evaluation of LWR (line width roughness)]

In a L/S pattern with a line width of 100 nm and a pitch of 200 nm formed by using the above Eop, the line width was measured at 5 locations along the line direction using a measuring SEM (scanning electron microscope, accelerating voltage 800V, product name: S-9220, manufactured by Hitachi, Ltd.), and the results of these measurements were used to calculate a value (namely, 3 s) of 3 times the standard deviation (s), which was used as an indicator of the LWR. The results are shown in Table 6. The smaller this 3 s value becomes, the lower the level of roughness in the line width, indicating a L/S pattern with a more uniform width.

TABLE 6

| | PAB/PEB (° C.) | Eop (mJ/cm$^2$) | LWR (nm) | EL margin (%) |
|---|---|---|---|---|
| Comparative Example 4 | 90/90 | 25.7 | 18.0 | 9.3 |
| Comparative Example 5 | 80/80 | 27.1 | 12.9 | 13.7 |
| Example 8 | 90/90 | 35.3 | 13.2 | 14.7 |
| Example 9 | 80/80 | 37.3 | 11.8 | 16.9 |

As is clear from the results shown in Table 6, each of the positive resist compositions of Examples 8 and 9 of the present invention exhibits an EL margin value larger than the positive resist compositions of Comparative Examples 4 and 5. Accordingly, it could be confirmed that the variation in the pattern size accompanied by the variation in the exposure dose was small (that is, EL margin was large).

Also, it could be confirmed that the positive resist compositions of Examples 8 and 9 had smaller LWR values when compared with Comparative Examples 4 and 5 respectively, therefore the level of roughness in the line width was small, and a L/S pattern with a more uniform width was obtained.

INDUSTRIAL APPLICABILITY

According to the present invention, there are provided a positive resist composition with small variation in the resist pattern size (large EL margin) accompanied by the variation in exposure dose, and a method of forming a resist pattern using the positive resist composition.

The invention claimed is:

1. A positive resist composition, comprising a resin component (A) which exhibits increased solubility in an alkali developing solution under action of an acid, and an acid generator component (B) which generates an acid upon exposure, wherein
the resin component (A) comprises a structural unit (a1) derived from a hydroxystyrene and a structural unit (a2) containing an acid dissociable, dissolution inhibiting group, and
the acid generator component (B) comprises an acid generator (B1) comprising a compound represented by the general formula (b1) shown below:

X-Q$^1$-Y$^1$—SO$_3^-$A$^+$    (b1)

wherein Q$^1$ represents an amide linkage (—C(=O)—NH—), a carbonyl group (—C(=O)—), a carbonate linkage (—O—C(=O)—O—), a combination of any of the aforementioned non-hydrocarbon-based, oxygen atom-containing linking groups with an alkylene group, a group of —$R^{91}$—O— or a group of —C(=O)—O—$R^{93}$—O—C(=O)— (wherein, $R^{91}$ and $R^{93}$ each independently represents an alkylene group); $Y^1$ represents an alkylene group of 1 to 4 carbon atoms which may contain a substituent or a fluorinated alkylene group of 1 to 4 carbon atoms which may contain a substituent; X represents a cyclic hydrocarbon group of 3 to 30 carbon atoms which may contain a substituent; and $A^+$ represents an organic cation).

2. The positive resist composition according to claim 1, wherein the structural unit (a2) comprises a structural unit (a22) in which a hydrogen atom of a hydroxyl group within the structural unit (a1) is substituted with an acid dissociable, dissolution inhibiting group or an acid dissociable, dissolution inhibiting group-containing organic group.

3. The positive resist composition according to claim 2, wherein the structural unit (a22) is a structural unit represented by the general formula (a2-2) shown below:

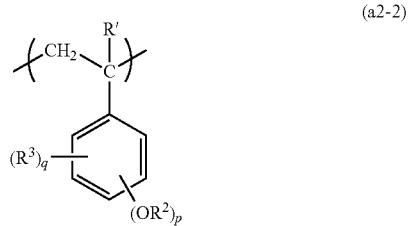

(a2-2)

wherein R' represents a hydrogen atom or a lower alkyl group of 1 to 5 carbon atoms; $R^3$ represents a lower alkyl group of 1 to 5 carbon atoms; p represents an integer of 1 to 3; q represents an integer of 0 to 2; and $R^2$ represents an acid dissociable, dissolution inhibiting group, or an acid dissociable, dissolution inhibiting group-containing organic group).

4. The positive resist composition according to claim 1, wherein the structural unit (a2) is a structural unit containing an acid dissociable, dissolution inhibiting group represented by the general formula (I-b) shown below:

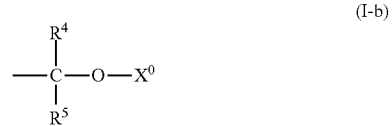

(I-b)

wherein $X^0$ is an aliphatic cyclic group, an aromatic cyclic hydrocarbon group, or a lower alkyl group of 1 to 5 carbon atoms; $R^4$ represents a hydrogen atom or a lower alkyl group of 1 to 5 carbon atoms, or $X^0$ and $R^4$ each may independently represent an alkylene group of 1 to 5 carbon atoms, wherein the terminal of $X^0$ is bonded to the terminal of $R^4$; and $R^5$ represents a hydrogen atom or a lower alkyl group of 1 to 5 carbon atoms).

5. The positive resist composition according to claim 1, further comprising a nitrogen-containing organic compound component (D).

6. A method of forming a resist pattern, comprising: forming a resist film on a substrate using a positive resist composition of any one of claims 1 to 5; exposing the resist film; and developing the resist film to form a resist pattern.

7. The positive resist composition according to claim 1, wherein the acid generator (B1) comprises a compound represented by the general formula (b1') shown below:

X-$Q^1$-$Y^1$—$SO_3^-A^+$ (b1)

(wherein $Q^1$ represents —$R^{91}$—O— or —C(=O)—O—$R^{93}$—O—C(=O)—, wherein, $R^{91}$ and $R^{93}$ each independently represents an alkylene group; $Y^1$ represents an alkylene group of 1 to 4 carbon atoms which may contain a substituent or a fluorinated alkylene group of 1 to 4 carbon atoms which may contain a substituent; X represents a cyclic hydrocarbon group of 3 to 30 carbon atoms which may contain a substituent; and $A^+$ represents an organic cation).

* * * * *

UNITED STATES PATENT AND TRADEMARK OFFICE
CERTIFICATE OF CORRECTION

PATENT NO. : 8,187,789 B2
APPLICATION NO. : 12/428133
DATED : May 29, 2012
INVENTOR(S) : Koji Yonemura, Makiko Irie and Hideo Hada It is certified that error appears in the above-identified patent and that said Letters Patent is hereby corrected as shown below:

In Column 4, Line 28, Change "thereof" to --thereof.--.

In Column 5, Line 19, Change "opposition," to --o-position,--.

In Column 5, Line 38, Change "restricuted" to --restricted--.

In Column 5, Lines 58-66, Change " " to -- --. 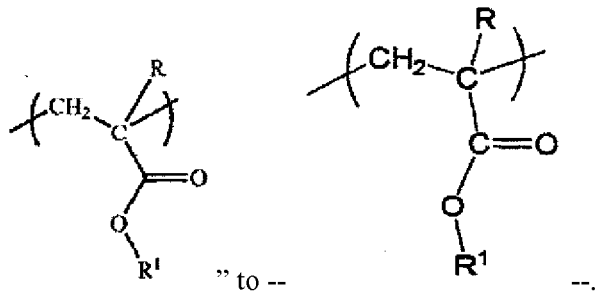

In Column 14, Line 31, Change "—C(CH$_2$CH$_3$)$_2$ —);" to -- —C(CH$_2$CH$_3$)$_2$—);--.

In Column 19, Line 61, Change "R$^b$" to --R$^c$--.

In Column 19, Line 63, Change "R$^b$" to --R$^c$--.

In Column 23, Line 5, Change "flurorinated" to --fluorinated--.

In Column 23, Line 49, Change "2-naththylethyl" to --2-naphthylethyl--.

In Column 24, Line 48, Change "substitutent" to --substituent--.

In Column 27, Line 7, Change "substitutents." to --substituents.--.

Signed and Sealed this
Twenty-seventh Day of November, 2012

David J. Kappos
*Director of the United States Patent and Trademark Office*

CERTIFICATE OF CORRECTION (continued)

In Column 27, Line 17 (Approx.), Change "substitutents" to --substituents--.

In Column 27, Line 20, Change "substitutent." to --substituent.--.

In Column 28, Line 23, Change "$R^3$|" to --$R^{3''}$--.

In Column 29, Line 50, Change "$R^{1'}$" to --$R^{1''}$--.

In Column 31, Line 16, Change "$n_0$" to --$n_1$--.

In Column 35, Line 22 (Approx.), Change "(b-1)" to --(b1-l)--.

In Column 37, Line 25-27 (Approx.), Change " $X-Q^2-O-[\overset{O}{\underset{\|}{C}}]_{m0}-Y^1-SO_3\ M^+$ " to -- $X-Q^2-O-[\overset{O}{\underset{\|}{C}}]_{m0}-Y^1-SO_3^-\ M^+$ --.

In Column 37, Lines 30-33 (Approx.), Change " $X-Q^2-O-[\overset{O}{\underset{\|}{C}}]_{m0}-Y^1-SO_3\ A^+$ " to -- $X-Q^2-O-[\overset{O}{\underset{\|}{C}}]_{m0}-Y^1-SO_3^-\ A^+$ --.

In Column 39, Line 46, Change "$Y^1$" to --$Y^1$,--.

In Column 40, Line 44, Change "substitutent" to --substituent--.

In Column 42, Line 6, Change "nathphyl" to --naphthyl--.

In Column 43, Line 4, Change "restricuted" to --restricted--.

In Column 43, Line 51, Change "acids." to --acids--.

In Column 43, Line 67, Change "etheyl" to --ethyl--.

In Column 44, Line 28 (Approx.), Change "dimethylacetoamide," to --dimethylacetamide,--.

In Column 44, Line 56, Change "(b-1)" to --(b1-1)--.

In Column 55, Line 65, Change "improvent" to --improvement--.

CERTIFICATE OF CORRECTION (continued)
U.S. Pat. No. 8,187,789 B2

In Column 59, Line 25 (Approx.), Change "dropwide" to --dropwise--.

In Column 62, Line 18, Change "1H," to --11H,--.

In Column 64, Line 36 (Approx.), Change "tetrahydrofran" to --tetrahydrofuran--.

In Column 68, Line 5 (Approx.), Change "3 H," to --3H,--.

In Column 77, Line 58, Change "determined" to --determined.--.

In Column 78, Line 65, In Claim 1, change "wherein" to --(wherein--.

In Column 79, Line 3, In Claim 1, change "(wherein," to --wherein,--.

In Column 79, Line 33, In Claim 3, change "wherein" to --(wherein--.

In Column 80, Line 11 (Approx.), In Claim 4, change "wherein" to --(wherein--.